United States Patent
Yang et al.

(10) Patent No.: US 12,185,612 B2
(45) Date of Patent: *Dec. 31, 2024

(54) FLEXIBLE DISPLAY DEVICE

(71) Applicant: Samsung Display Co., Ltd., Yongin-si (KR)

(72) Inventors: Taehoon Yang, Yongin-si (KR); Yongsu Lee, Seoul (KR); Sungchul Kim, Seongnam-si (KR); Sunghoon Kim, Seoul (KR); Sungsik Yun, Suwon-si (KR); Kyoungah Lee, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/219,048

(22) Filed: Jul. 6, 2023

(65) Prior Publication Data
US 2023/0363235 A1 Nov. 9, 2023

Related U.S. Application Data

(63) Continuation of application No. 17/443,451, filed on Jul. 26, 2021, now Pat. No. 11,744,132, which is a
(Continued)

(30) Foreign Application Priority Data
Mar. 25, 2016 (KR) .................. 10-2016-0036371

(51) Int. Cl.
H10K 59/40 (2023.01)
G06F 3/041 (2006.01)
(Continued)

(52) U.S. Cl.
CPC .......... *H10K 59/40* (2023.02); *G06F 3/0412* (2013.01); *H10K 71/00* (2023.02); *H10K 77/111* (2023.02);
(Continued)

(58) Field of Classification Search
CPC ............................................. H01L 2251/5338
See application file for complete search history.

(56) References Cited

U.S. PATENT DOCUMENTS 7,936,121 B2   5/2011   Kim
8,237,165 B2   8/2012   Kim et al.
(Continued)

FOREIGN PATENT DOCUMENTS

CN   101908555   12/2010
CN   104347670   2/2015
(Continued)

OTHER PUBLICATIONS

Extended European Search Report dated Sep. 13, 2017, in European Patent Application No. 17161262.5.
(Continued)

*Primary Examiner* — Jarrett J Stark
(74) *Attorney, Agent, or Firm* — CANTOR COLBURN LLP

(57) ABSTRACT

A flexible display device includes a protection member, a first adhesion member, a display member, a second adhesion member, and a window member. A thickness of the display member is less than a sum of thicknesses of the protection member and the window member. The display member includes a display panel layer, a touch sensing layer, and a reflection prevention layer integrated with each other to reduce a thickness of the flexible display device. The reduction in thickness enables the flexible display device to be bent with a relatively small radius of curvature, as well as to be repeatedly bent (or otherwise flexed) with reduced potential for delamination of the first and second adhesion members.

18 Claims, 53 Drawing Sheets

Related U.S. Application Data continuation of application No. 16/299,593, filed on Mar. 12, 2019, now Pat. No. 11,075,251, which is a continuation of application No. 15/285,219, filed on Oct. 4, 2016, now Pat. No. 10,347,700.

(51) Int. Cl.

| | | |
|---|---|---|
| *H10K 71/00* | (2023.01) | |
| *H10K 77/10* | (2023.01) | |
| *G06F 3/044* | (2006.01) | |
| *H10K 50/84* | (2023.01) | |
| *H10K 50/844* | (2023.01) | |
| *H10K 50/86* | (2023.01) | |
| *H10K 59/38* | (2023.01) | |
| *H10K 102/00* | (2023.01) | |

(52) U.S. Cl.
CPC .. *G06F 3/0446* (2019.05); *G06F 2203/04102* (2013.01); *G06F 2203/04103* (2013.01); *G06F 2203/04112* (2013.01); *H10K 50/841* (2023.02); *H10K 50/844* (2023.02); *H10K 50/865* (2023.02); *H10K 59/38* (2023.02); *H10K 2102/311* (2023.02); *Y02E 10/549* (2013.01)

(56) References Cited

U.S. PATENT DOCUMENTS

| | | | |
|---|---|---|---|
| 9,029,846 | B2 | 5/2015 | Song et al. |
| 9,082,668 | B2 | 7/2015 | Kim et al. |
| 9,189,027 | B2 | 11/2015 | Lee et al. |
| 10,541,279 | B2 | 1/2020 | An et al. |
| 2005/0093437 | A1 | 5/2005 | Ouyang |
| 2010/0293782 | A1 | 11/2010 | Yamazaki et al. |
| 2010/0308335 | A1 | 12/2010 | Kim et al. |
| 2014/0139481 | A1 | 5/2014 | Han et al. |
| 2014/0198267 | A1 | 7/2014 | Jeong et al. |
| 2014/0254111 | A1 | 9/2014 | Yamazaki et al. |
| 2014/0367644 | A1 | 12/2014 | Song et al. |
| 2014/0374704 | A1 | 12/2014 | Jang et al. |
| 2015/0041813 | A1 | 2/2015 | Kim et al. |
| 2015/0049281 | A1 | 2/2015 | Lee et al. |
| 2015/0179722 | A1 | 6/2015 | Koo et al. |
| 2015/0200375 | A1 | 7/2015 | Kim et al. |
| 2015/0201487 | A1 | 7/2015 | Kee et al. |
| 2015/0286253 | A1 | 10/2015 | Jung |
| 2015/0380673 | A1 | 12/2015 | Ito et al. |
| 2016/0048252 | A1 | 2/2016 | Oh |
| 2016/0079567 | A1 | 3/2016 | Cho et al. |
| 2016/0118616 | A1 | 4/2016 | Hiroki et al. |
| 2016/0188098 | A1 | 6/2016 | Her et al. |
| 2016/0306460 | A1 | 10/2016 | Lee et al. |
| 2016/0343992 | A1 | 11/2016 | Kim et al. |
| 2016/0378224 | A1 | 12/2016 | Kwon et al. |
| 2017/0148859 | A1 | 5/2017 | Nishinohara |
| 2017/0194599 | A1 | 7/2017 | Furuie |
| 2017/0196101 | A1 | 7/2017 | Ki et al. |
| 2017/0229666 | A1 | 8/2017 | Tsuruoka et al. |
| 2017/0278900 | A1 | 9/2017 | Yang et al. |
| 2017/0338286 | A1 | 11/2017 | Oh et al. |
| 2019/0064960 | A1 | 2/2019 | Na et al. |
| 2019/0121475 | A1 | 4/2019 | Park et al. |

FOREIGN PATENT DOCUMENTS

| | | |
|---|---|---|
| CN | 104779266 | 7/2015 |
| EP | 2259321 | 12/2010 |
| EP | 2833426 | 2/2015 |
| EP | 2894672 | 7/2015 |
| KR | 10-2008-0099684 | 11/2008 |
| KR | 10-2010-0112411 | 10/2010 |
| KR | 10-2010-0130898 | 12/2010 |
| KR | 10-2014-0093092 | 7/2014 |
| KR | 10-2014-0145463 | 12/2014 |
| KR | 10-2015-0017540 | 2/2015 |
| KR | 10-2015-0021167 | 3/2015 |
| KR | 10-2015-0072214 | 6/2015 |
| KR | 10-2015-0084257 | 7/2015 |
| TW | 201448314 | 12/2014 |

OTHER PUBLICATIONS

Notice of Allowance dated Nov. 21, 2018, in U.S. Appl. No. 15/285,219.
Ex Parte Quayle Action dated Aug. 8, 2018, in U.S. Appl. No. 15/285,219.
Non-Final Office Action dated Jan. 12, 2018, in U.S. Appl. No. 15/285,219.
Office Action dated Aug. 4, 2020, in Taiwanese Patent Application No. 106108949.
Non-Final Office Action dated Mar. 9, 2020, in U.S. Appl. No. 16/299,593.
Final Office Action dated Jun. 23, 2020, in U.S. Appl. No. 16/299,593.
Non-Final Office Action dated Dec. 11, 2020, in U.S. Appl. No. 16/299,593.
Notice of Allowance dated Mar. 24, 2021, in U.S. Appl. No. 16/299,593.
Office Action dated Jan. 21, 2022, in Korean Patent Application No. 10-2016-0036371.
Non-Final Office Action dated Jan. 12, 2023, in U.S. Appl. No. 17/443,451.
Notice of Allowance dated Apr. 27, 2023, in U.S. Appl. No. 17/443,451.

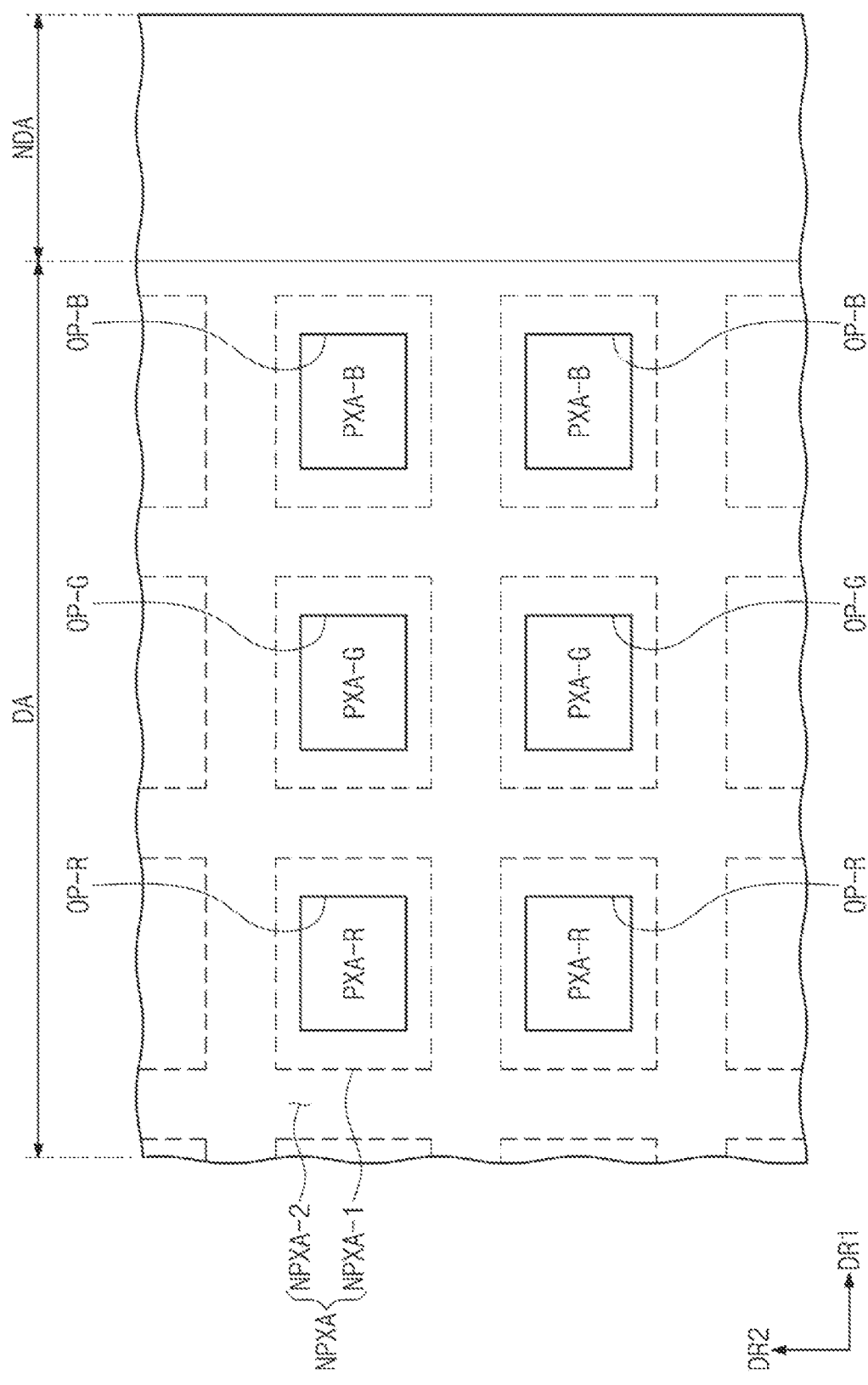

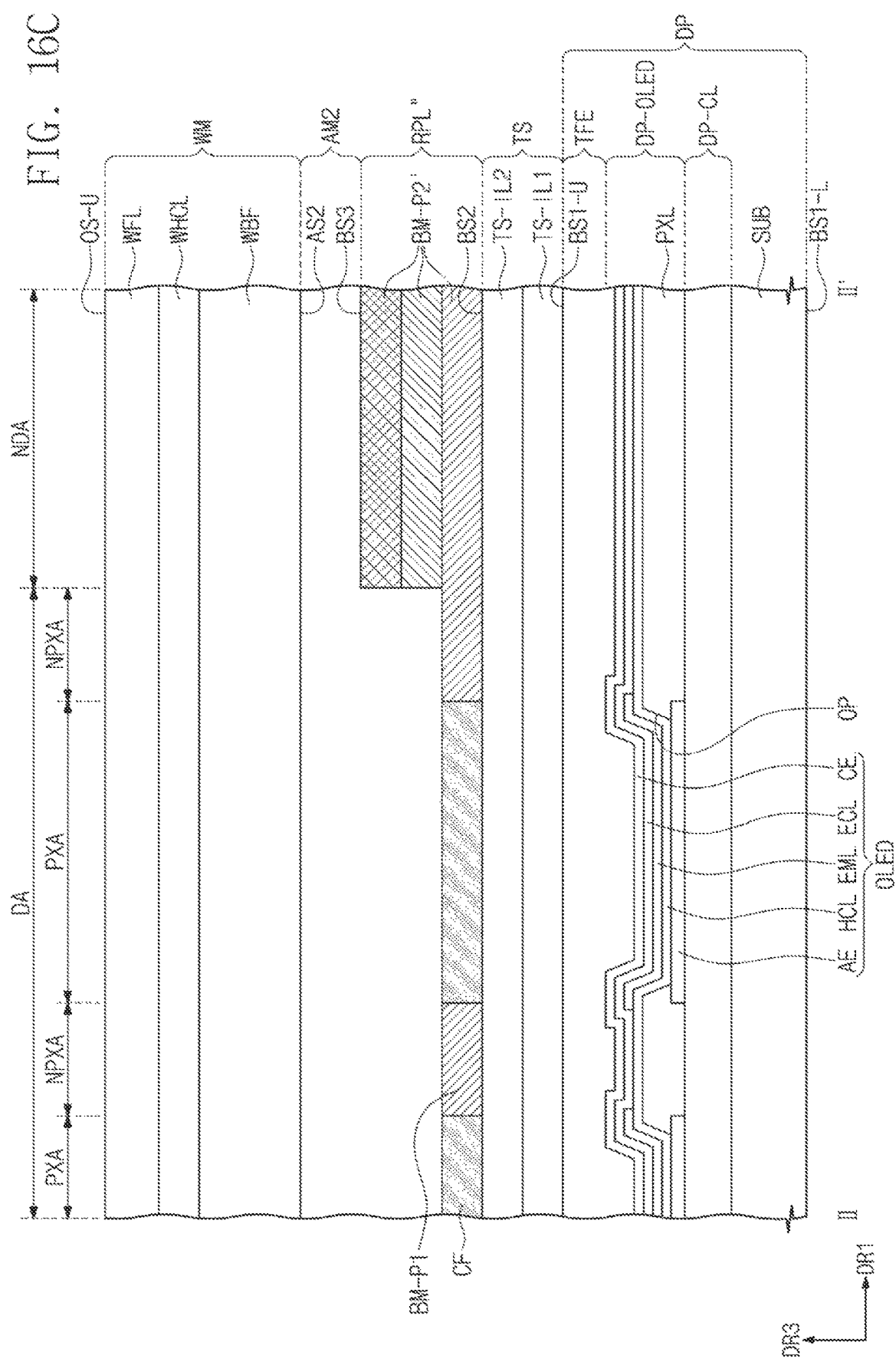

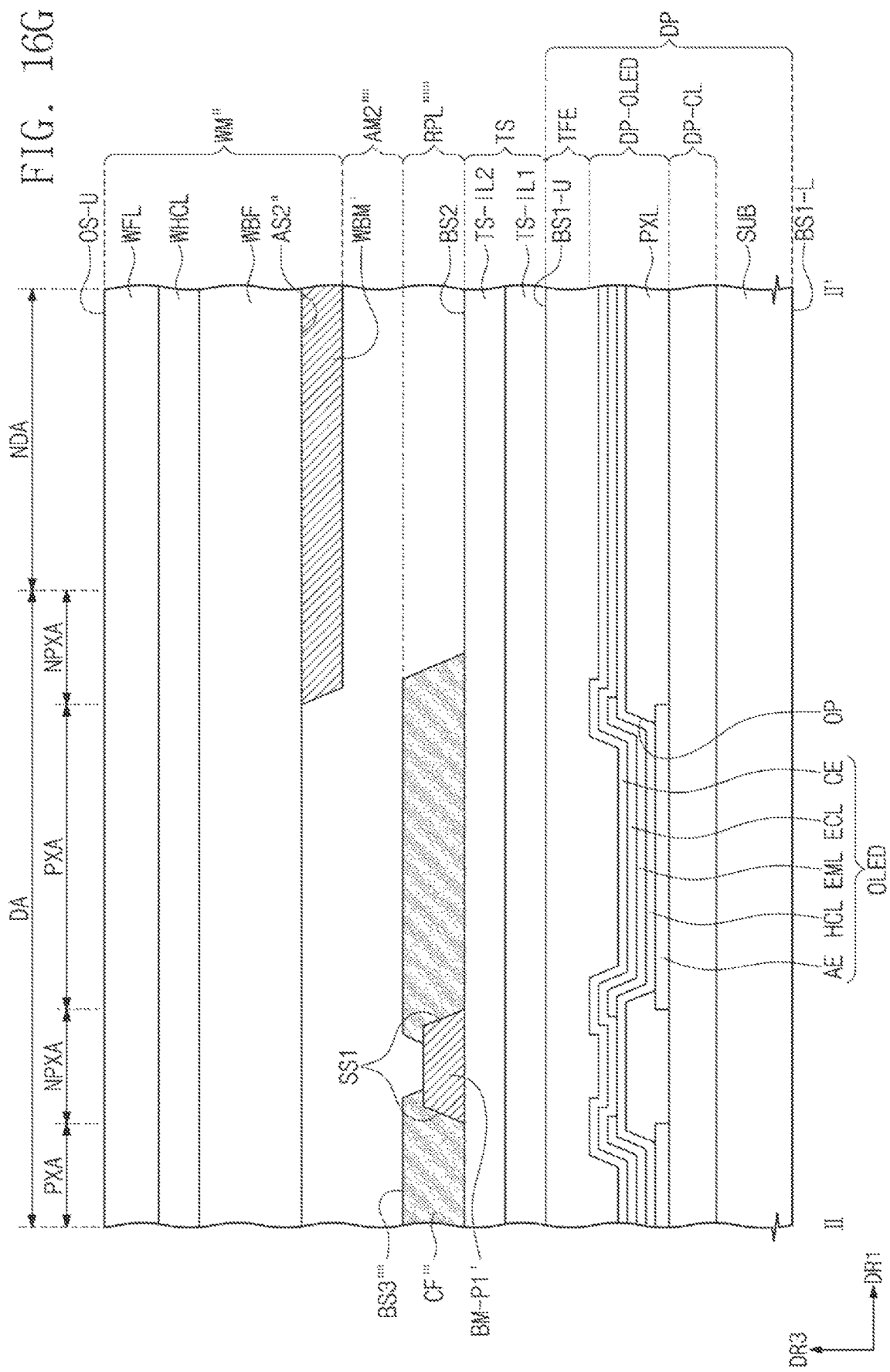

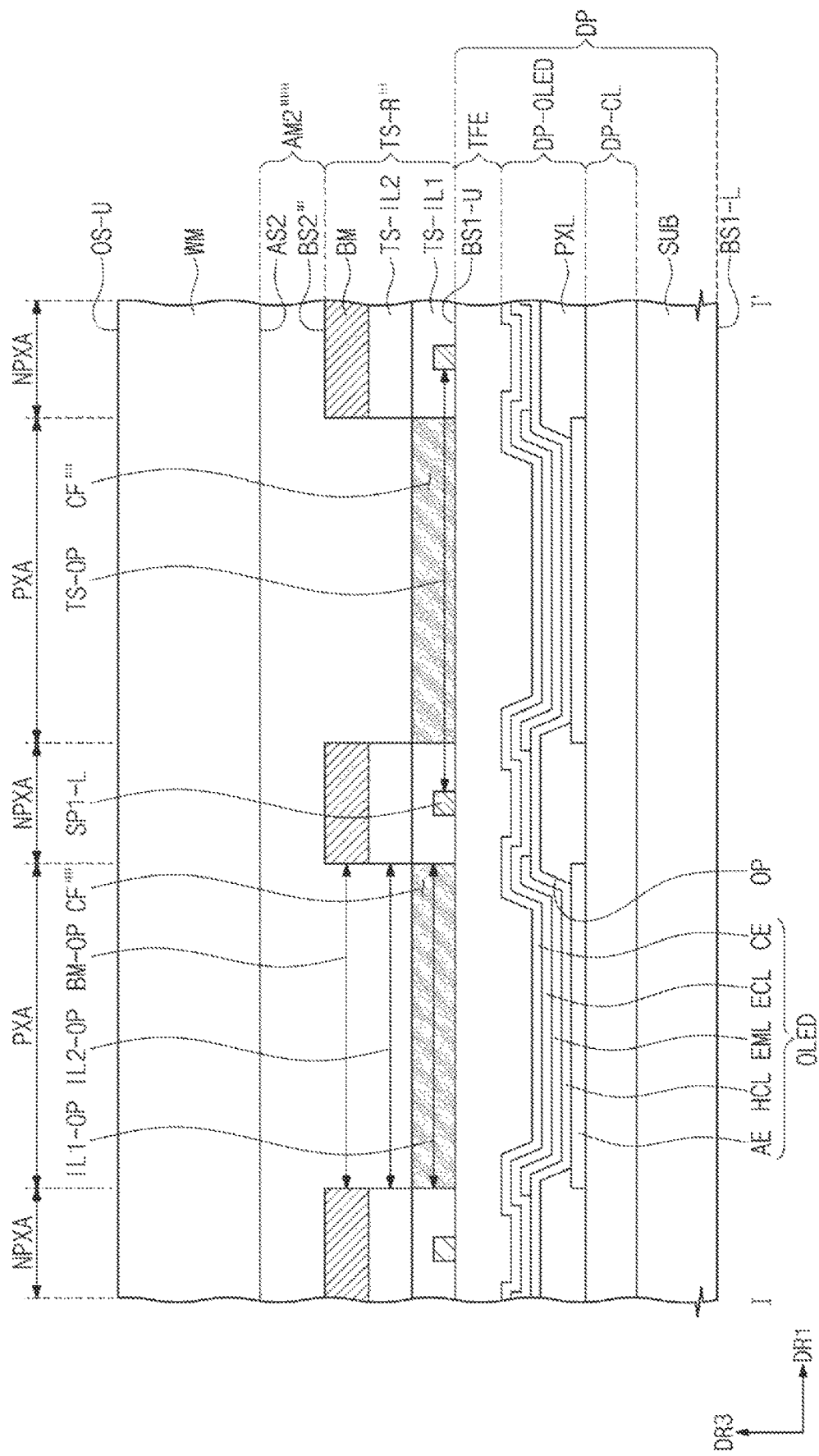

FLEXIBLE DISPLAY DEVICE

CROSS-REFERENCE TO RELATED APPLICATIONS

This application is a Continuation of U.S. patent application Ser. No. 17/443,451, filed on Jul. 26, 2021, which is a Continuation of U.S. patent application Ser. No. 16/299,593, filed Mar. 12, 2019, which issued as U.S. Pat. No. 11,075,251, which is a Continuation of U.S. patent application Ser. No. 15/285,219, filed Oct. 4, 2016, which issued as U.S. Pat. No. 10,347,700, and which claims priority to and the benefit of Korean Patent Application No. 10-2016-0036371, filed Mar. 25, 2016, each of which is hereby incorporated by reference for all purposes as if fully set forth herein.

BACKGROUND

Field

The present disclosure relates to a flexible display device, and, more particularly, to a flexible display device capable of being repeatedly bent or otherwise flexed.

Discussion of the Background

Electronic devices, such as smartphones, digital cameras, laptop computers, tablets, navigational aids, televisions, and the like, may permit users to intentionally deform the device in various manners and shapes. In this manner, a display device (e.g., a flat panel display device) of an electronic device may also be deformed in correspondence with the deformation of the electronic device. As such, flexible display devices, such as curved display devices, bent display devices, rolled display devices, and the like, are of interest.

The above information disclosed in this Background section is only for enhancement of understanding of the background of the inventive concept, and, therefore, it may contain information that does not form the prior art that is already known to a person of ordinary skill in the art.

SUMMARY

One or more exemplary embodiments provide a flexible display device with improved durability.

Additional aspects will be set forth in the detailed description which follows, and, in part, will be apparent from the disclosure, or may be learned by practice of the inventive concept.

According to one or more exemplary embodiments, a flexible display device includes: a protection member forming a first outer surface exposed to an outside of the flexible display device; a window member forming a second outer surface exposed to the outside; a display member disposed between the protection member and the window member; a first adhesion member to couple the display member to the protection member; and a second adhesion member to couple the display member to the window member. The display member includes a display panel layer forming a first display panel surface and a second display panel surface. The display panel layer includes: a display area including a plurality of light emitting areas and a non-light emitting area adjacent to the plurality of the light emitting areas; and a non-display area adjacent to the display area. The display member further includes: a touch sensing layer forming a first base surface; and a reflection prevention layer forming a second base surface. The touch sensing layer is disposed directly on one of the first display panel surface, the second display panel surface, and the second base surface. The reflection prevention layer is disposed directly on the second display panel surface or the first base surface. A thickness of the display member is less than a sum of thicknesses of the protection member and the window member.

According to one or more exemplary embodiments, a flexible display device includes: a protection member forming a first outer surface exposed to an outside of the flexible display device; a window member forming a second outer surface exposed to the outside; a display member disposed between the protection member and the window member; a first adhesion member to couple the display member to the protection member; and a second adhesion member to couple the display member to the window member. The display member includes a display panel layer forming a first display panel surface disposed directly on the first adhesion member and a second display panel surface. The display panel layer includes: a display area including a plurality of light emitting areas and a non-light emitting area adjacent to the plurality of light emitting areas; and a non-display area adjacent to the display area. The display member further includes a touch sensing layer forming: a first base surface disposed directly on the second adhesion member; and a second surface opposing the first base surface, the second surface being disposed directly on the second display panel surface. The touch sensing layer includes: a plurality of first conductive patterns overlapping with the non-light emitting area, the plurality of first conductive patterns being disposed directly on the second display panel surface; a plurality of second conductive patterns overlapping with the non-light emitting area; and a touch insulation layer configured to insulate the first conductive patterns from the second conductive patterns. The touch insulation layer includes: a black matrix overlapping with the non-light emitting area and the non-display area; and a plurality of color filters respectively overlapping with the plurality of light emitting areas. A thickness of the display member is less than a sum of thicknesses of the protection member and the window member.

According to one or more exemplary embodiments, a flexible display device includes: a protection member forming a first outer surface exposed to an outside of the flexible display device; a window member forming a second outer surface exposed to the outside; a display member disposed between the protection member and the window member; a first adhesion member to couple the display member to the protection member; and a second adhesion member to couple the display member to the window member. The display member includes a display panel layer including a first display panel surface disposed directly on the first adhesion member and a second display panel surface. The display panel layer includes: a display area including a plurality of light emitting areas and a non-light emitting area adjacent to the plurality of light emitting areas; and a non-display area adjacent to the display area. The display member further includes a touch sensing layer forming: a first base surface disposed directly on the second adhesion member; and a second surface opposing the first base surface, the second surface being disposed directly on the second display panel surface. The display panel layer includes: a first metal layer overlapping with the display area and the non-display area; a transparent conductive layer disposed directly on the first metal layer; and a second metal layer disposed directly on the transparent conductive layer.

A thickness of the display member is less than a sum of thicknesses of the protection member and the window member.

According to one or more exemplary embodiments, a method of manufacturing a flexible display device includes forming a display member configured to display an image, the display member including: a display panel layer configured to generate the image; a touch sensing layer configured to sense touch interactions associated with the image, the touch sensing layer directly contacting the display panel layer; and a reflection prevention layer configured to reduce external light reflection from the display panel layer, the reflection prevention layer directly contacting the display panel layer or the touch sensing layer. The method further includes: coupling, via a first adhesive member, a protection member to a first side of the display member; and coupling, via a second adhesive member, a window member to a second side of the display member, the second side opposing the first side. A thickness of the display member is less than a sum of thicknesses of the protection member and the window member.

According to one or more exemplary embodiments, a method of manufacturing a flexible display device includes: forming one or more first layers configured to generate an image on a first outermost layer of the one or more first layers; and forming one or more second layers configured to reduce external light reflection off the one or more first layers. The one or more second layers include: a second outermost layer directly contacting the first outermost layer; and a third outermost layer opposing the second outermost layer. The method further includes forming one or more third layers configured to sense touch interactions in association with the image. The one or more third layers includes: a fourth outermost layer directly contacting the third outermost layer; and a fifth outermost layer opposing the fourth outermost layer. The method further includes: coupling, via a first adhesive member, one or more fourth layers to the one or more first layers, the one or more fourth layers being configured to at least protect the one or more first layers; and coupling, via a second adhesive member, one or more fifth layers to the fifth outermost layer, the one or more fifth layers being configured to form a window to the one or more first layers. A thickness of the one or more first layers is less than a sum of thicknesses of the one or more fourth layers and the one or more fifth layers.

According to one or more exemplary embodiments, a method of manufacturing a flexible display device includes forming a display member including a display panel layer configured to generate an image in a display area. The display area includes: a plurality of light emitting areas; and a plurality of non-light emitting areas. The display member further includes a touch sensing layer configured to: sense touch interactions associated with the image; and reduce a reflective index of external light. The method further includes: coupling, via a first adhesive member, a protection member to a first side of the display member; and coupling, via a second adhesive member, a window member to a second side of the display member, the second side opposing the first side. A thickness of the display member is less than a sum of thicknesses of the protection member and the window member. The touch sensing layer includes: a plurality of conductive patterns configured to sense the touch interactions, the plurality of conductive patterns being formed directly on the display panel layer and overlapping with the plurality of non-light emitting areas; a touch insulation layer covering the plurality of first conductive patterns, the touch insulation layer including a plurality of openings overlapping with the plurality of light emitting areas; and a plurality of color filters formed directly on the display panel layer in the plurality of openings, the plurality of color filters being configured to reduce the reflective index of the external light.

According to one or more exemplary embodiments, a flexible display device includes a display panel layer, a touch sensing layer, a window member, and a protection member. The display panel layer includes: an encapsulation layer; a light emitting layer configured to emit light onto a surface of the encapsulation layer; and electrodes configured to drive the light emitting layer. The touch sensing layer is disposed directly on the surface of the encapsulation layer. The window member is coupled, via a first adhesive, directly on a surface of the touch sensing layer; and coupling, via a second adhesive, to a surface of the display panel layer disposed on the surface of the thin film encapsulation layer. A sum of thicknesses of the display panel layer and the touch sensing layer is less than a sum of thicknesses of the protection member and the window member. At least one of the electrodes includes: a first metal layer; a transparent conductive layer disposed directly on the first metal layer; and a second metal layer disposed directly on the transparent conductive layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 7 is a partial plan view of an organic light emitting display panel, according to one or more exemplary embodiments.

FIGS. 16A, 16B, 16C, 16D, 16E, 16F, and 16G are cross-sectional views of display devices, according to one or more exemplary embodiments.

FIGS. 18A, 18B, 18C, 18D, 18E, and 18F are cross-sectional views of display devices, according to one or more exemplary embodiments.

DETAILED DESCRIPTION OF THE ILLUSTRATED EMBODIMENTS

Figure 1A:
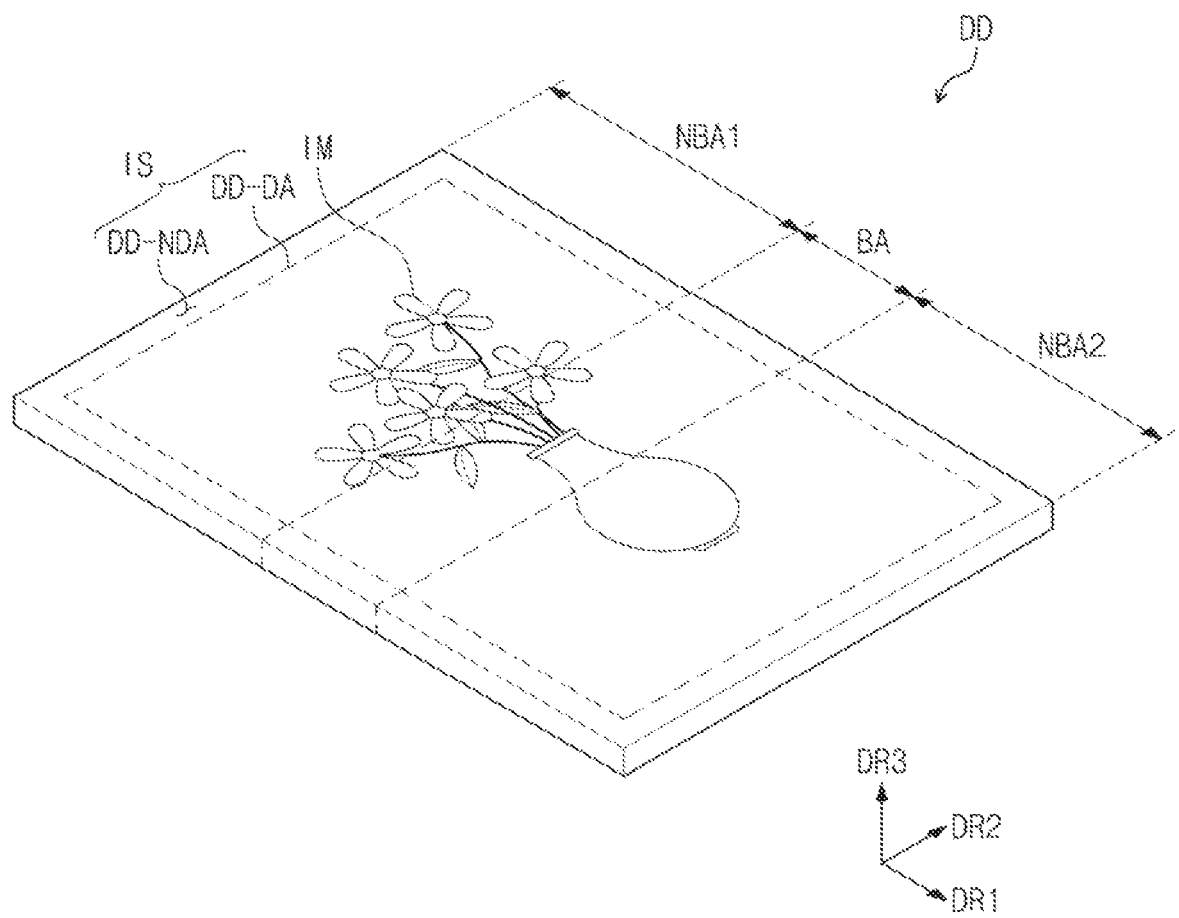
FIG. 1A is a perspective view of illustrating a first operational state of a flexible display device, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1B:
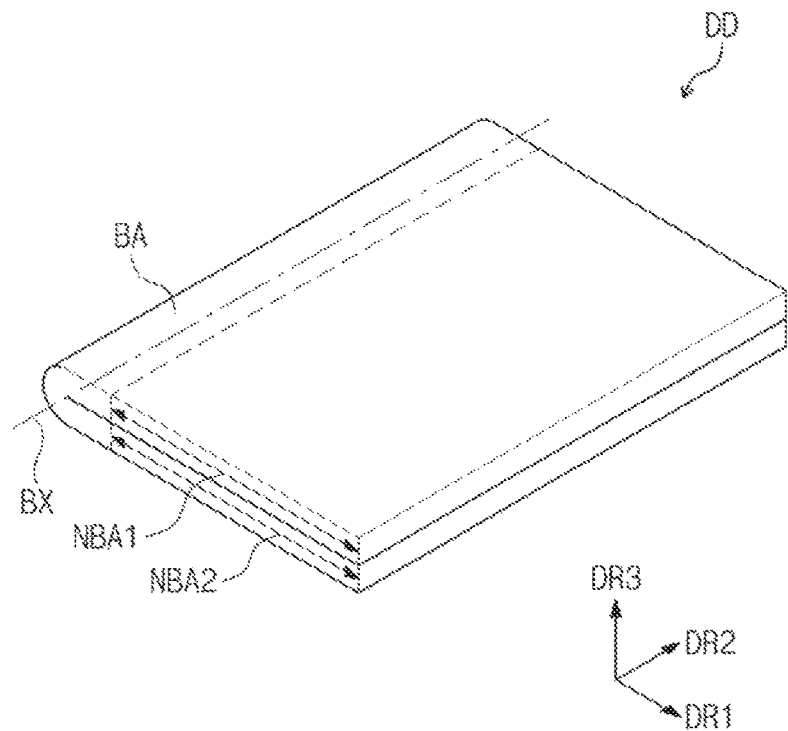
FIG. 1B is a perspective view illustrating a second operational state of the flexible display device of FIG. 1A, according to one or more exemplary embodiments.
Figure 1C:
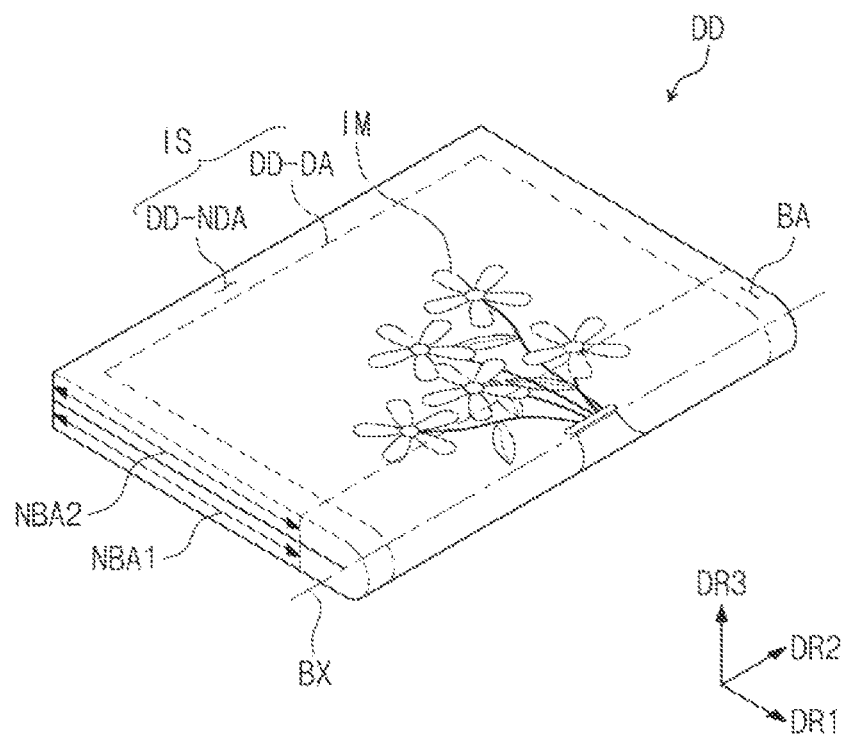
FIG. 1C is a perspective view illustrating a third operational state of the flexible display device of FIG. 1A, according to one or more exemplary embodiments.
Figure 2A:
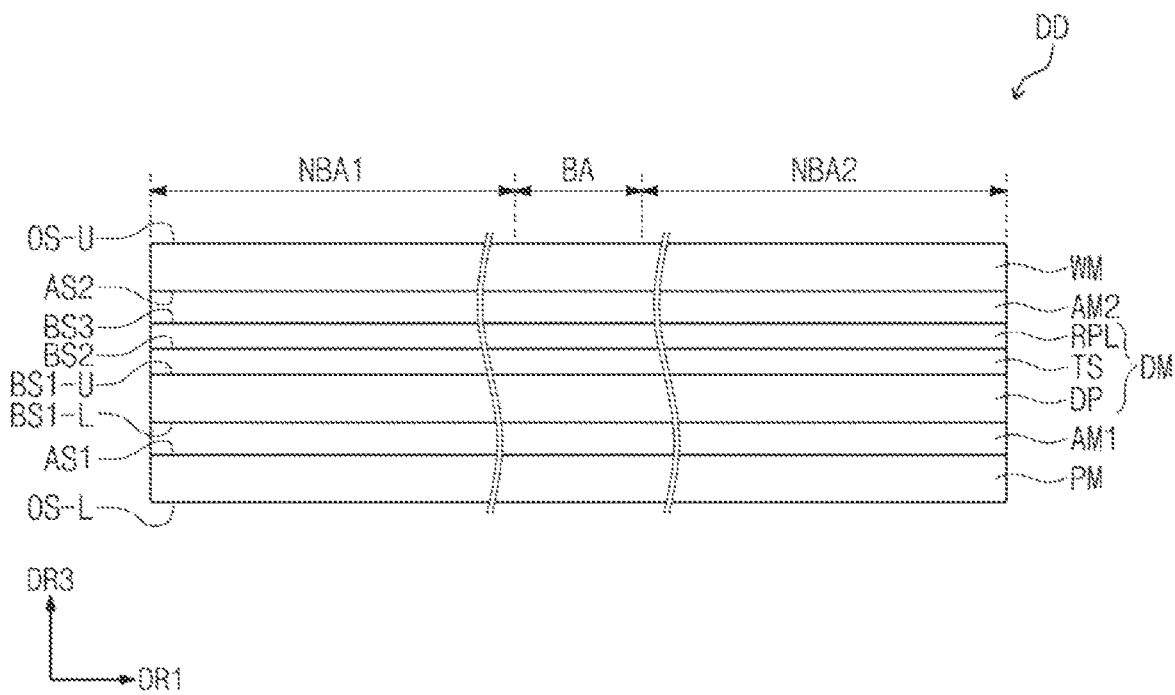
FIG. 2A is a cross-sectional view of the flexible display device of FIG. 1A in the first operational state, according to one or more exemplary embodiments.
Figure 2B:
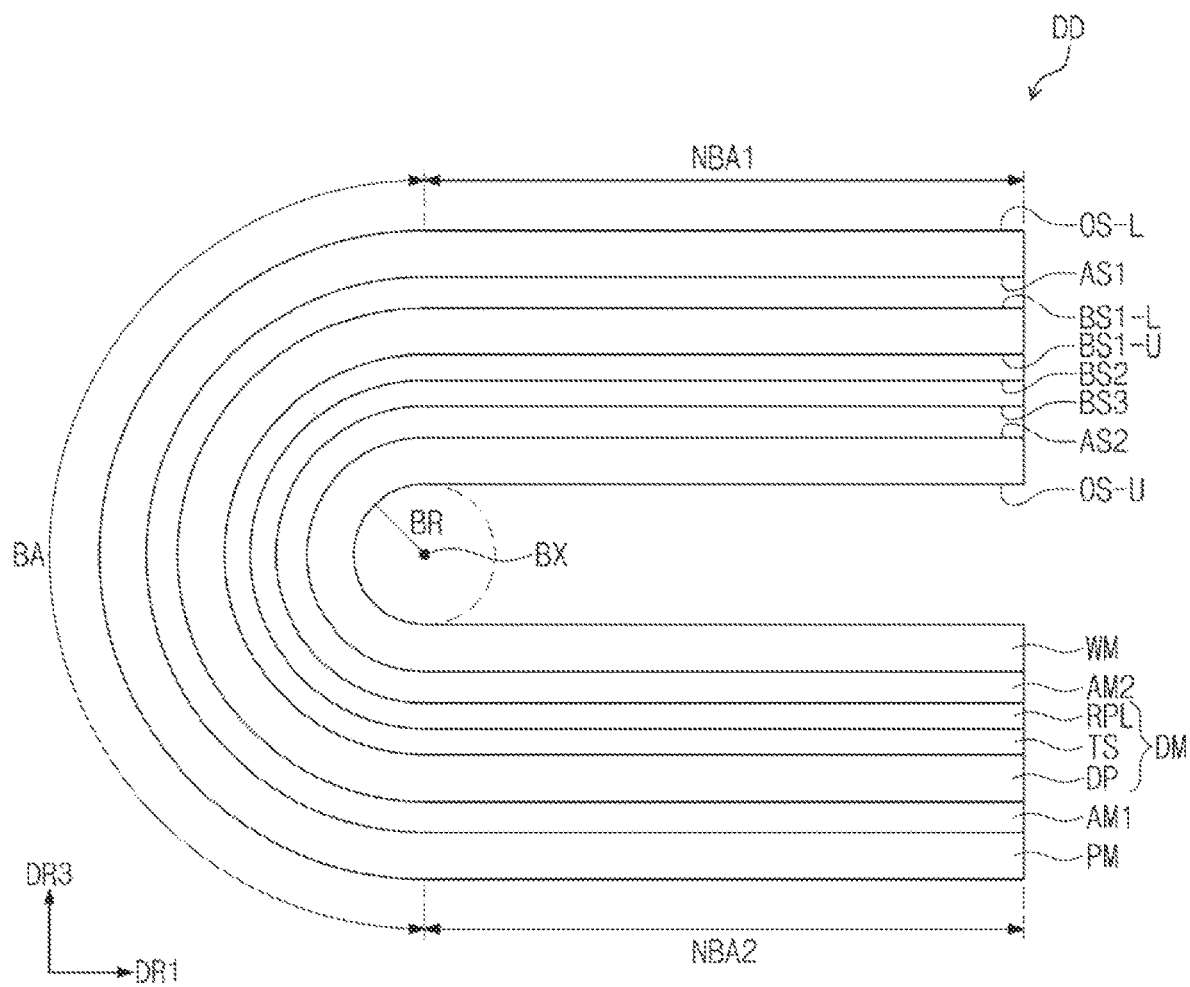
FIG. 2B is a cross-sectional view of the flexible display device of FIG. 1B in the second operational state, according to one or more exemplary embodiments.
Figure 2C:
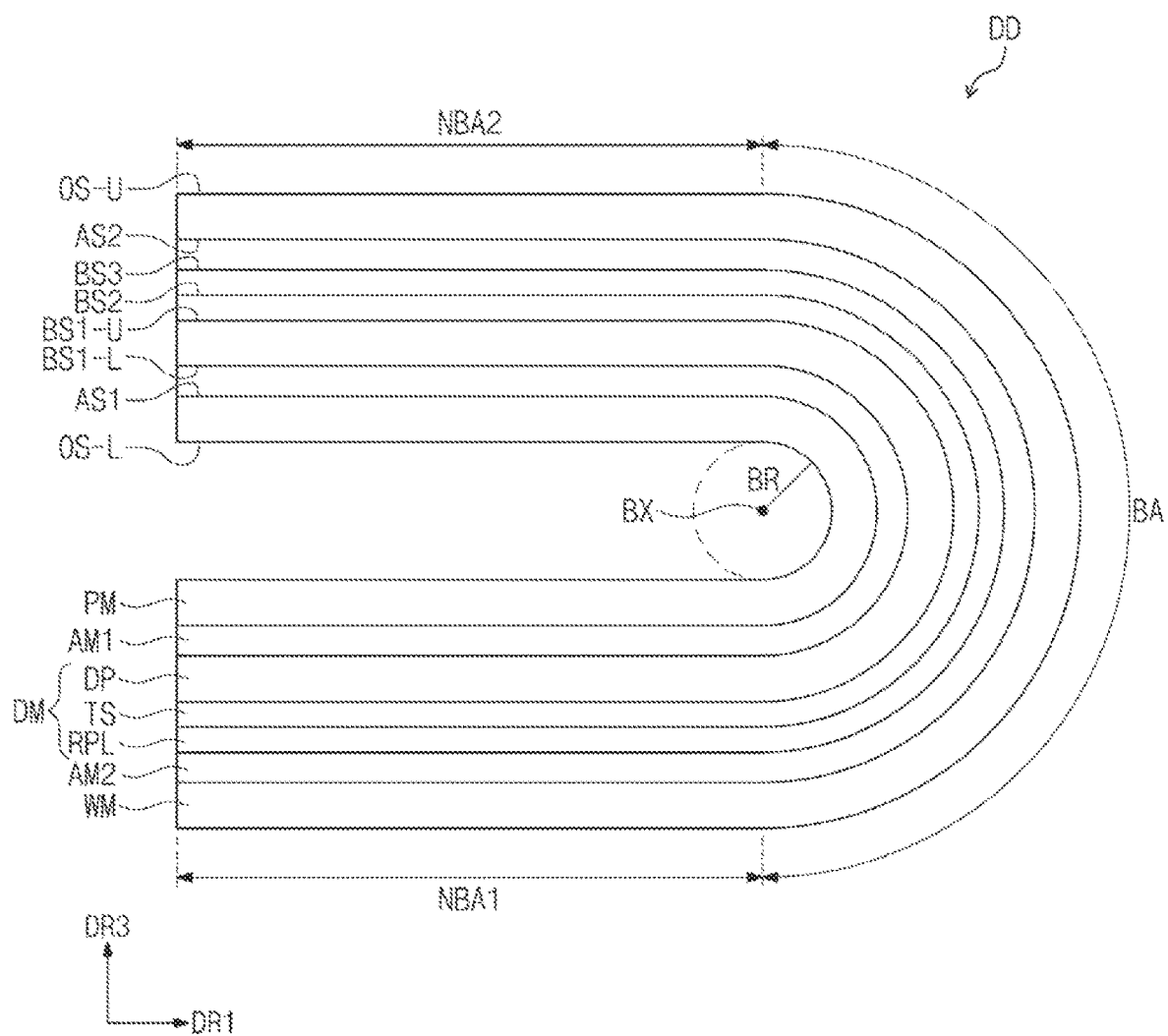
FIG. 2C is a cross-sectional view of the flexible display device of FIG. 1C in the third operational state, according to one or more exemplary embodiments.

FIGS. 1A, 1B, and 1C are perspective views respectively illustrating first, second, and third operational states of a flexible display device DD, according to one or more exemplary embodiments. FIGS. 2A, 2B, and 2C are cross-sectional views respectively illustrating the first, second, and third operational states of the flexible display device DD, according to one or more exemplary embodiments.

A display surface IS on which an image IM is displayed is parallel to a surface defined by a first directional axis DR1 and a second directional axis DR2. A normal direction of the display surface IS, i.e., a thickness direction of the flexible display device DD, is indicated as a third directional axis DR3. A front surface (or a top surface) and a rear surface (or a bottom surface) of each of the members (or components) of the flexible display device DD are distinguished from one another in the third directional axis DR3. Directions indicated in association with the first to third directional axes DR1, DR2, and DR3 are merely relative, and, as such, may be changed to different directions with respect to each other. Hereinafter, the first to third directions may be expressed by the same reference symbols as the directions indicated in association with the first to third directional axis DR1, DR2, and DR3, respectively.

A foldable display device is illustrated as an example of the flexible display device DD of FIGS. 1A to 1C and 2A to 2C. It is contemplated, however, that exemplary embodiments are not limited thereto or thereby. For instance, the flexible display device DD may be provided as a rollable display device that may be wound. It is noted that the flexible display device DD may be used for large-scale electronic apparatuses, such as televisions, monitors, etc., and middle and small-scale electrode apparatuses, such as mobile phones, tablets, notebooks, personal computers, navigation units for vehicles, game consoles, smart watches, etc.

As illustrated in FIG. 1A, the display surface IS of the flexible display device DD may be divided into a plurality of areas. The flexible display device DD may include a display area DD-DA on which the image IM is displayed (or perceived), and a non-display area DD-NDA that is disposed adjacent to (or outside of) the display area DD-DA. The non-display area DD-NDA may be an area on which the image IM is not displayed. A flower vase is illustrated as an example of the image IM in FIG. 1A. For example, the display area DD-DA may have a rectangular shape, and the non-display area DD-NDA may surround the display area DD-DA. It is contemplated, however, that exemplary embodiments are not limited thereto or thereby. For example, the shape of the display area DD-DA and the shape of the non-display area DD-NDA may be relatively designed with respect to each other. To this end, the respective shapes of the display area DD-DA and the non-display area DD-NDA may be the same as one another or different from one another.

As seen in FIGS. 1A to 1C, the flexible display device DD may include a bending area BA that is bendable with respect to a bending axis BX, and first and second non-bending areas NBA1 and NBA2 that are not bendable. As illustrated in FIG. 1B, the flexible display device DD may be bent inward so that the display surface IS of the first non-bending area NDA1 and the display surface IS of the second non-bending area NBA2 face each other. As illustrated in FIG. 1C, the flexible display device DD may be bent outward to expose the display surface IS to the outside.

According to one or more exemplary embodiments, the flexible display device DD may include a plurality of bending areas BA. In addition, the bending areas BA may be defined to correspond to a configuration of the flexible display device DD that is manipulated by a user, e.g., the bending areas may be dynamically configured by the user. For example, the bending area BA may be defined in parallel to the first directional axis DR1 or defined in a diagonal direction, unlike as shown in FIGS. 1B and 1C. In one or more exemplary embodiments, the flexible display device DD may be configured to only repeat the operational modes of FIGS. 1A to 1C.

As illustrated in FIGS. 2A to 2C, the display device DD includes a protection member PM, a window member WM, a display member DM, a first adhesion member AM1, and a second adhesion member AM2. The display member DM is disposed between the protection member PM and the window member WM. The first adhesion member AM1 is coupled to the display member DM and the protection member PM, and the second adhesion member AM2 is coupled to the display member DM and the window member WM.

The protection member PM protects the display member DM. The protection member PM provides a first outer surface OS-L that is exposed to the outside and an adhesion surface AS1 that adheres to the first adhesion member AM1. Hereinafter, the adhesion surface AS1 of the protection member PM may be referred to as a first adhesion surface AS1 so as to be distinguished from an adhesion surface of the other member. The protection member PM prevents external moisture, oxygen, debris, etc., from being permeated into the display member DM and absorbs external impact. The protection member PM may include a plastic film as a base layer.

According to one or more exemplary embodiments, the protection member PM may include a material selected from the group consisting of polyethersulphone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), poly(aryleneether sulfone), and a combination thereof. It is contemplated, however, that a material for forming the protection member PM is not limited to plastic resins. For example, the protection member PM may be formed of an organic/inorganic composite material. The protection member PM may include a porous organic layer and an inorganic material that is filled into pores of the organic layer.

In one or more exemplary embodiments, the protection member PM may further include a functional layer disposed on a plastic film. The functional layer may include a resin layer. The functional layer may be formed by a coating manner.

The window member WM protects the display member DM against external impact and provides an input surface to a user. The window member WM provides a second outer surface OS-U that is exposed to the outside and an adhesion surface AS2 that adheres to the second adhesion member AM2. A display surface IS of FIGS. 1A to 1C may be the second outer surface OS-U. Hereinafter, the adhesion surface AS2 of the window member WM may be referred to as a second adhesion surface AS2 so as to be distinguished from an adhesion surface of the other member. The window member WM will be described later in more detail.

The display member DM includes a display panel layer DP, a touch sensing layer TS, and a reflection prevention layer RPL that are integrated with each other by a continuous process. Although the display member DM of which the constituents are successively stacked from the display panel layer DP to the reflection prevention layer RPL is illustrated as an example, exemplary embodiments are not limited thereto or thereby. According to one or more exemplary embodiments, the stacking order of the functional layers of the display member DM may be changed. Also, a portion of the functional layers may be omitted, or two functional layers may be replaced with one functional layer.

The display panel layer DP generates the image (see reference symbol IM of FIG. 1A) corresponding to input image data. The display panel layer DP provides a first display panel surface BS1-L (or a base bottom surface) and a second display panel surface BS1-U (or a base top surface), which face each other in the thickness direction DR3. The display panel layer DP may be an organic light emitting display panel, an electrophoretic display panel, or an electrowetting display panel. It is contemplated, however, that exemplary embodiments are not limited to a kind (or type) of display panel, and, as such, any suitable display panel may be utilized in association with exemplary embodiments described herein. For descriptive and illustrative convenience, exemplary embodiments will be described in association with an organic light emitting display panel embodiment. The organic light emitting display panel will be described later in more detail.

The touch sensing layer TS acquires coordinate information of an external input, e.g., user input. The touch sensing layer TS may be disposed on (e.g., directly on) the second display panel surface BS1-U. The touch sensing layer TS provides a first base surface BS2 (or a touch base surface). It is contemplated that the touch sensing layer TS may be manufactured together with the display panel layer DP via a continuous process. For illustrative and descriptive convenience, the touch sensing layer TS will be described in association with a capacitive touch detection member embodiment. Exemplary embodiments, however, are not limited thereto or thereby. For example, the touch sensing layer TS may be replaced with another touch sensing layer including two types of touch electrodes, such as an electromagnetic induction touch detection member. A capacitive touch sensing layer will be described later in more detail.

The reflection prevention layer RPL may absorb light incident from the outside or destructively interfere with the light to reduce external light reflectance of the flexible display device DD. In one or more exemplary embodiments, the reflection prevention layer RPL may be replaced with an optical film for preventing external light from being reflected, e.g., a polarizing film and a λ/4 wavelength film. The reflection prevention layer RPL may be disposed on (e.g., directly on) the first base surface BS2. The reflection prevention layer RPL provides a second base surface BS3 (or a reflection prevention base surface). In one or more exemplary embodiments, the reflection prevention layer RPL may be manufactured together with the touch sensing layer TS via a continuous process. The reflection prevention layer RPL will be described later in more detail.

According to one or more exemplary embodiments, the touch sensing layer TS and the reflection prevention layer RPL that are formed by the continuous process, may reduce a thickness of the display device DD. A conventional touch panel and conventional optical film that are separately manufactured, may require a separate adhesion member so as to adhere to a conventional display panel. Also, each of the conventional touch panel and the conventional optical film that are separately manufactured, may have a determined thickness to satisfy self-durability. According to one or more exemplary embodiments, the touch sensing layer TS and the reflection prevention layer RPL are formed by a continuous process, and, as such, may enable the adhesion member to be omitted. In this manner, the touch sensing layer TS and the reflection prevention layer RPL may be disposed directly on the display panel layer DP with a thin thickness on the display panel layer DP.

Each of the first adhesion member AM1 and the second adhesion member AM2 may be an optical clear adhesive film (OCA), an optical clear resin (OCR), or a pressure sensitive adhesive film (PSA). Each of the first adhesion member AM1 and the second adhesion member AM2 may be formed of a photocurable adhesive material or a heat-curable adhesive material. It is contemplated, however, that exemplary embodiments are not limited thereto to thereby.

Although not separately shown, the flexible display device DD may further include a frame structure supporting the functional layers to maintain the operational states illustrated in FIGS. 2A to 2C. The frame structure may include a joint structure or a hinge structure.

As illustrated in FIG. 2B, the flexible display device DD may be bent inward at a determined radius of curvature BR by, for instance, user manipulation. Alternatively, as illustrated in FIG. 2C, the flexible display device DD may be bent outward at a determined radius of curvature BR by, for example, user manipulation. It is also contemplated that the flexible display device DD may be bidirectionally bent according to user manipulation. The bidirectional bending may be repeatedly performed. The radius of curvature BR may be constantly maintained. The first non-bending area NBA1 and the second non-bending area NBA2 may face each other and may be extend parallel to one another. The bending area BA may not be fixed in surface area, but be determined according to the radius of curvature BR. The user may perceive an image from the flexible display device DD in the non-bent state of FIG. 2A.

According to one or more exemplary embodiments, the protection member PM may have a thickness of about 30 μm to about 80 μm. The window member WM may have a thickness of about 20 μm to about 150 μm, e.g., about 25 μm to about 150 μm. The display member DM may have a thickness of about 30 μm to about 50 μm. Each of the first adhesion member AM1 and the second adhesion member AM2 may have a thickness of about 10 μm to about 80 μm.

Although each of the protection member PM, the window member WM, and the display member DM may have a thickness according to one of the above-noted ranges, the display member DM may be set to have a thickness less than the sum of the thicknesses of the protection member PM and the window member WM. The thickness of the display member DM may represent a thickness from the first display panel surface BS1-L to the second display panel surface BS1-U. Since the touch panel and the optical film are integrated with the display panel layer DP, the adhesion members may be omitted, and, as such, the touch sensing layer TS and the reflection prevention layer RPL may decrease in thickness to satisfy the above-described conditions. Since the display member DM decreases in thickness, tension/compression stresses that occur in the display device when bent (or otherwise flexed) may be reduced.

A ratio of the sum of the thicknesses of the protection member PM and the window member WM to the thickness of the display member DM (thickness of the display member DM: the sum of the thicknesses of the protection member PM and the window member WM) may be about 1:1 to about 1:8. In one or more exemplary embodiments, a ratio of the sum of the thicknesses of the protection member PM and the window member WM to the thickness of the display member DM may be about 1:1.2 to about 1:4. For example, when the display member DM has a thickness of about 30 μm to about 50 μm, the sum of the thicknesses of the protection member PM and the window member WM may be about 60 μm to about 120 μm. It is noted that the protection member PM may have a thickness of about 30 μm to about 50 μm, and the window member WM may have a thickness of about 30 μm to about 70 μm.

A ratio between the thicknesses of the protection member PM and the window member WM may be about 4:1 to about 1:5. In one or more exemplary embodiments, a ratio between the thicknesses of the protection member PM and the window member WM may be about 5:3 to about 3:7. As described above, when the protection member PM has a thickness of about 30 μm to about 50 μm, the window member WM may have a thickness of about 30 μm to about 70 μm.

A ratio between the thicknesses of the first and second adhesion members AM1 and AM2 may correspond to that between the thicknesses of the protection member PM and the window member WM. As the thickness increases, stress occurring when the flexible display device DD is bent may increase. When repeatedly bent, each of the protection member PM and the window member WM may be degraded. It is noted, however, that the first and second adhesion members AM1 and AM2 may reduce the stress to prevent the degradation of the protection member PM and the window member WM from occurring. Since a decreasing rate of the stress occurring when the flexible display device DD is bent increases as the adhesion members AM1 and AM2 increase in thickness, the thicknesses of the first and second adhesion members AM1 and AM2 may be set to correspond to those of the protection member PM and the window member WM. That is, an adhesion member adjacent to a member having a large thickness may also have a large thickness.

When a ratio between the thicknesses of the protection member PM and the window member WM is about 1:3, a ratio between the thicknesses of the first and second adhesion member AM1 and AM2 may be about 1:3. When a ratio between the thicknesses of the protection member PM and the window member WM is about 1:1, a ratio between the thicknesses of the first and second adhesion member AM1 and AM2 may be about 1:1. It is contemplated, however, that the ratio between the thicknesses of the first and second adhesion members AM1 and AM2 need not be the same as that between the thicknesses of the protection member PM and the window member WM.

The feature in which "the ratio between the thicknesses of the first and second adhesion members AM1 and AM2 corresponds to that between the thicknesses of the protection member PM and the window member WM" may be defined as a feature in which the ratios have an error ranging from about +30% to about −30%. For example, when a ratio between the thicknesses of the protection member PM and the window member WM is about 1:3, a ratio between the thicknesses of the first and second adhesion members AM1 and AM2 may be about 1:3.9 to about 1:2.1.

As previously mentioned, as the number of adhesion members decrease, the flexible display device DD may decrease in thickness. When the flexible display device DD decreases in thickness, even though the flexible display device DD is repeatedly bent (or otherwise flexed), delamination defects of the adhesion member(s) may be reduced. Also, when the flexible display device DD decreases in thickness, the flexible display device DD may be bent according to a smaller radius of curvature.

Figure 3A:
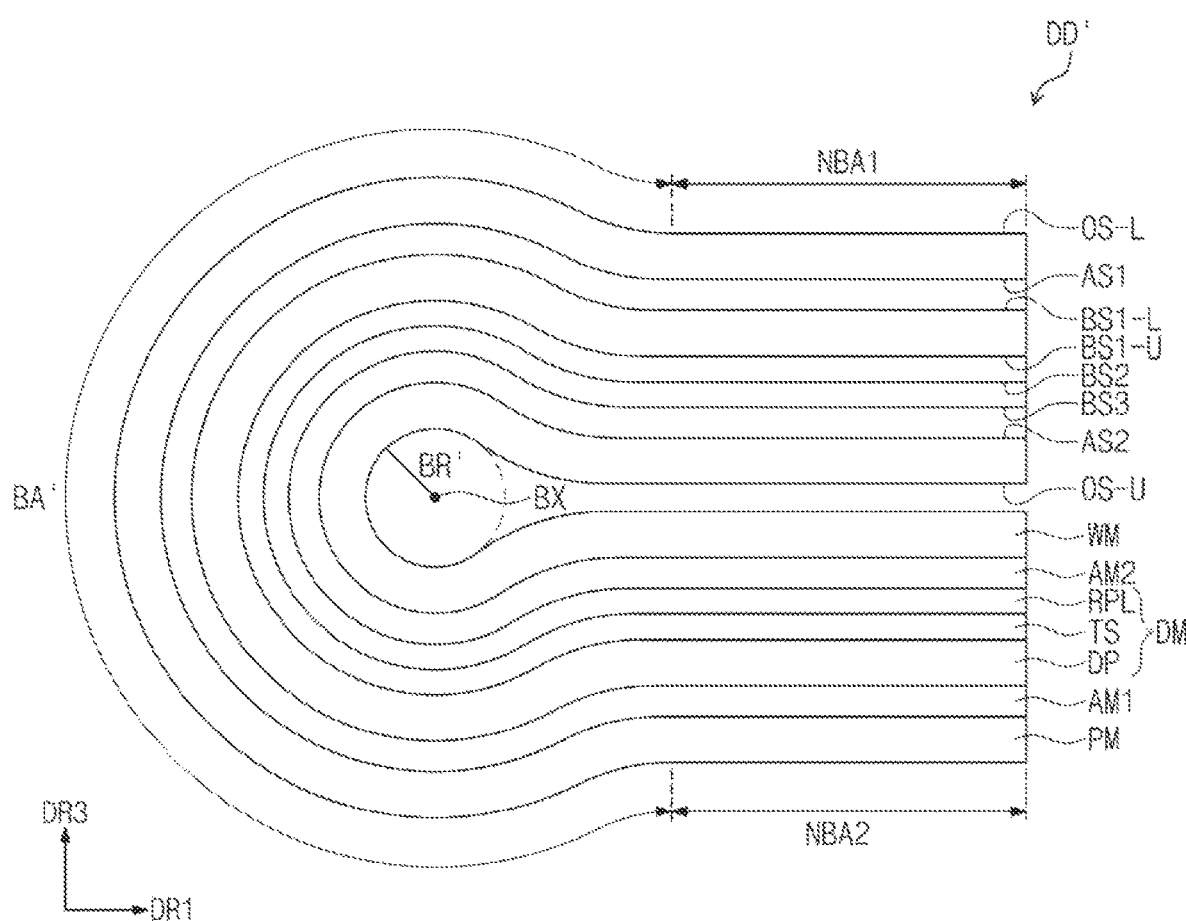
FIG. 3A is a cross-sectional view of a flexible display device in a second operational state, according to one or more exemplary embodiments.
Figure 3B:
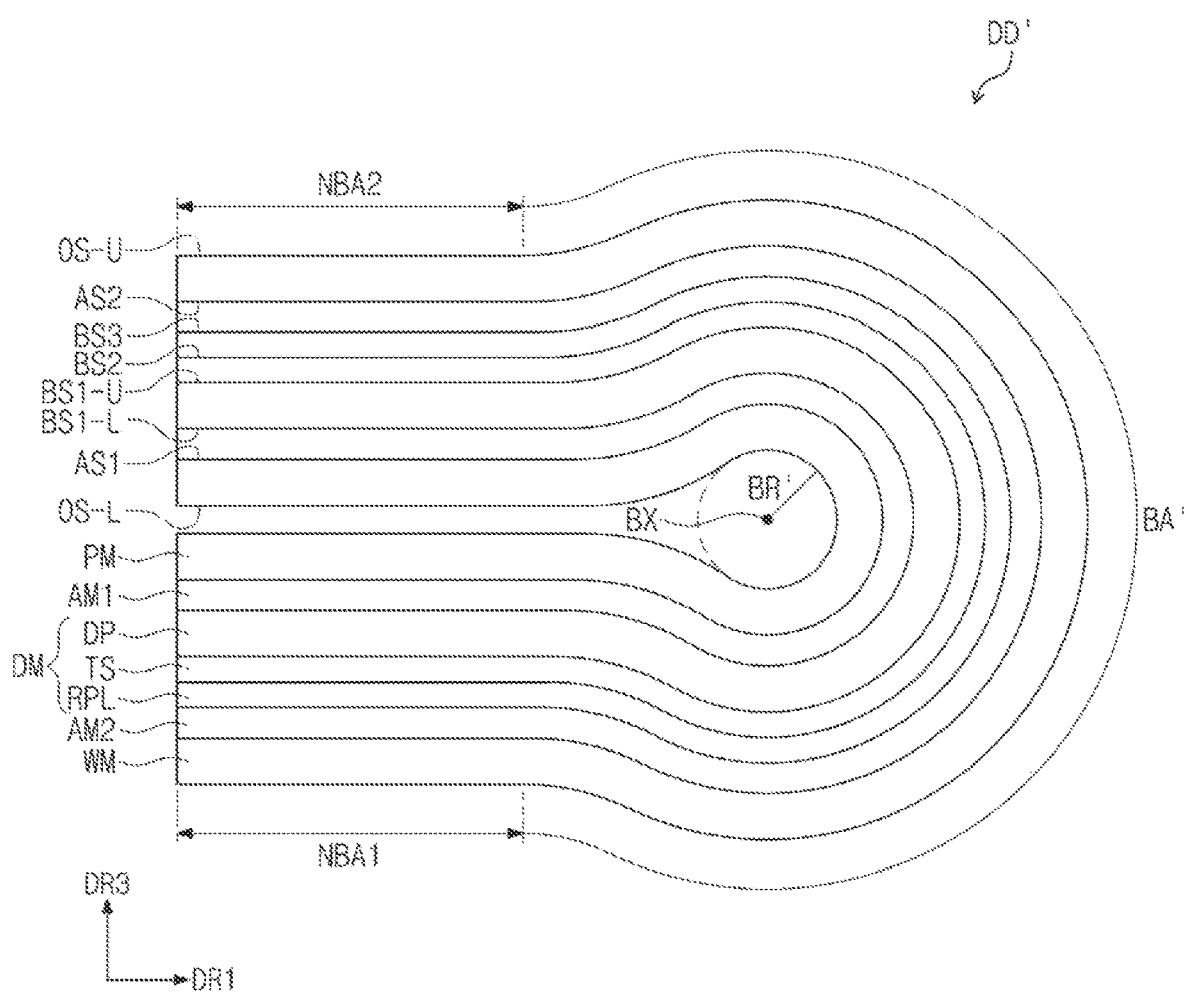
FIG. 3B is a cross-sectional view of the flexible display device of FIG. 3A in a third operational state, according to one or more exemplary embodiments.

FIGS. 3A and 3B are cross-sectional views of a flexible display device in second and third operational states, according to one or more exemplary embodiments. FIGS. 4A to 4D are cross-sectional views flexible display devices in first operational states, according to one or more exemplary embodiments. The flexible display devices of FIGS. 3A, 3B, and 4A to 4D are similar to the flexible display device DD of FIGS. 1A to 1C and 2A to 2C, and, as such, duplicative descriptions have been omitted to avoid obscuring exemplary embodiments described herein. In this manner, differences are primarily described below.

The flexible display device DD' may be bidirectionally bent in the shape illustrated in FIGS. 3A and 3B. The bending area BA' may be bent in a shape that is more similar to a circular shape to increase a surface area of the bending area BA' when compared to that of the being area BA of the flexible display device DD of FIGS. 1A to 1C and 2A to 2C. Also, the bending area BA' may be bent at a radius of curvature BR' greater than the radius of curvature BR illustrated in FIGS. 2B and 2C to reduce stress of the bending area BA.

Figure 4A:
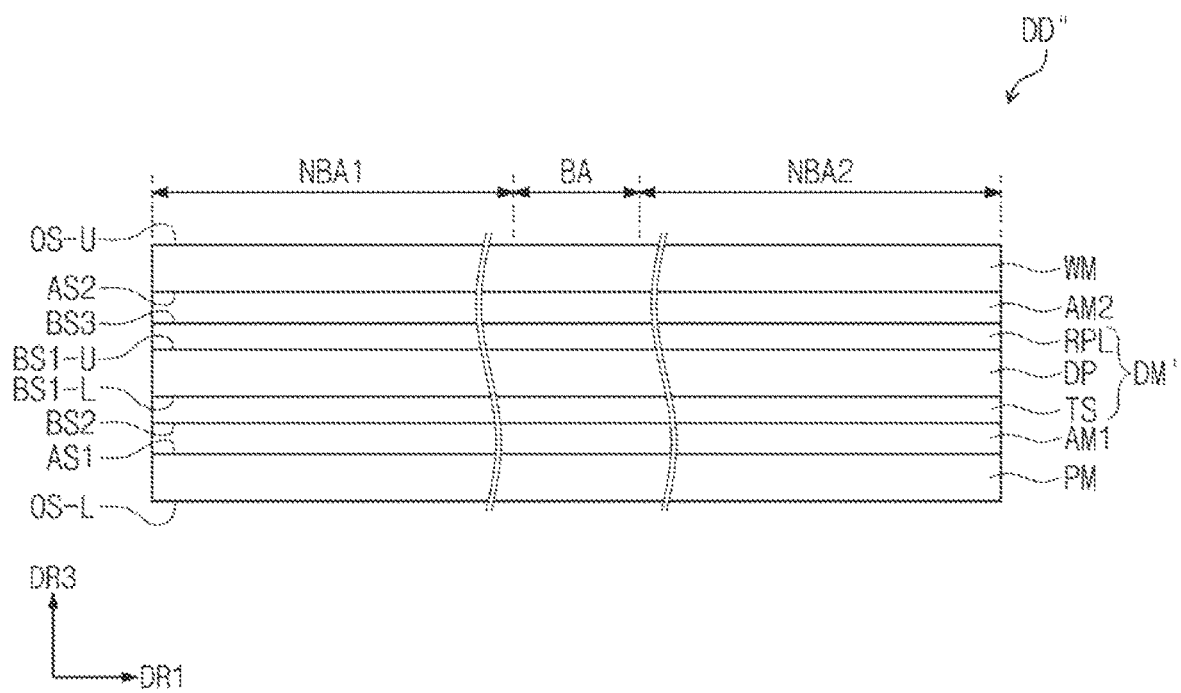
FIGS. 4A, 4B, 4C, and 4D are cross-sectional views of flexible display devices in first operational states, according to one or more exemplary embodiments.
Figure 4B:
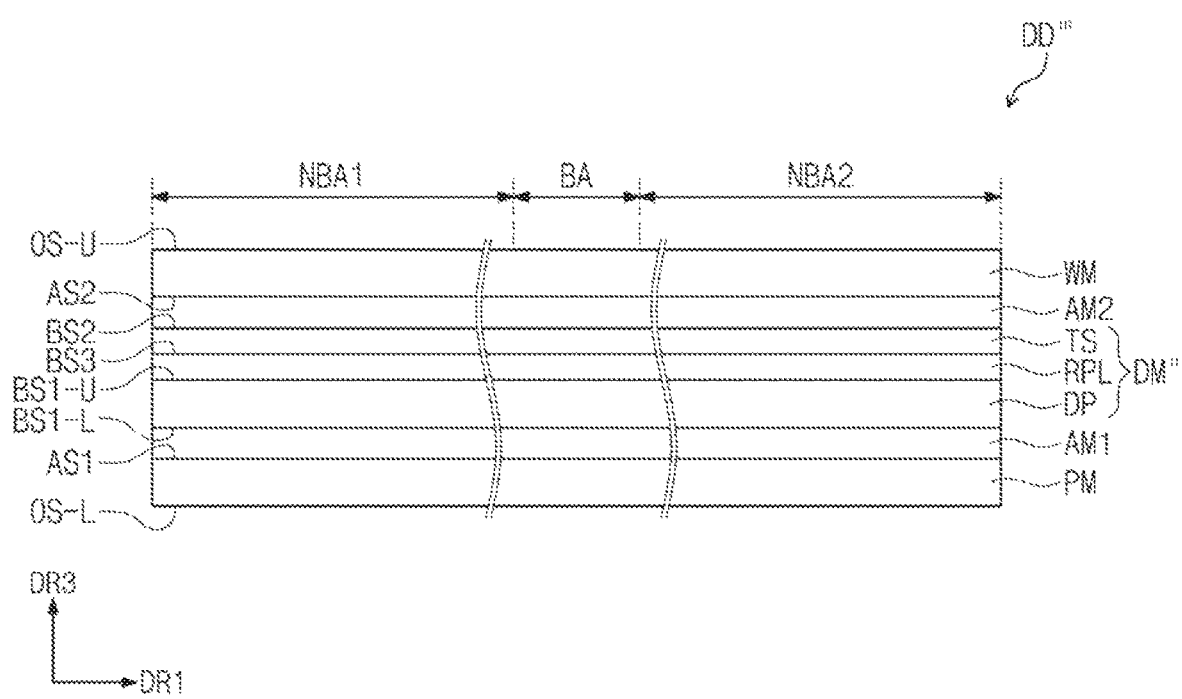

As illustrated in FIGS. 4A and 4B, functional layers may be changed in stacking order. Referring to FIG. 4A, a touch sensing layer TS may be disposed directly on a first display panel surface BS1-L. The first adhesion member AM1 is coupled to the first base surface BS2 through the first adhesion surface AS1. The reflection prevention layer RPL may be disposed directly on the second base surface BS1-U.

The second adhesion member AM2 is coupled to the second base surface BS3 through the second adhesion surface AS2. Adverting to FIG. 4B, the reflection prevention layer RPL may be disposed directly on the second display panel surface BS1-U. The touch sensing layer TS may be disposed directly on the second base surface BS3. The second adhesion member AM2 is coupled to the first base surface BS2 through the second adhesion surface AS2.

Figure 4C:
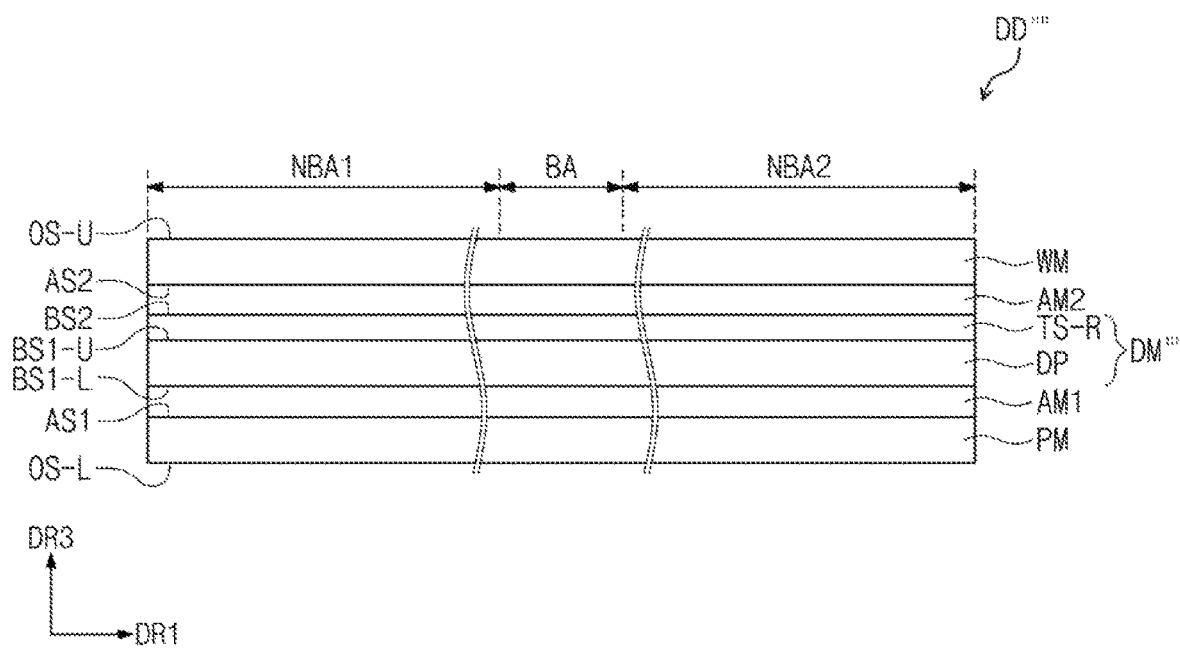
Figure 4D:
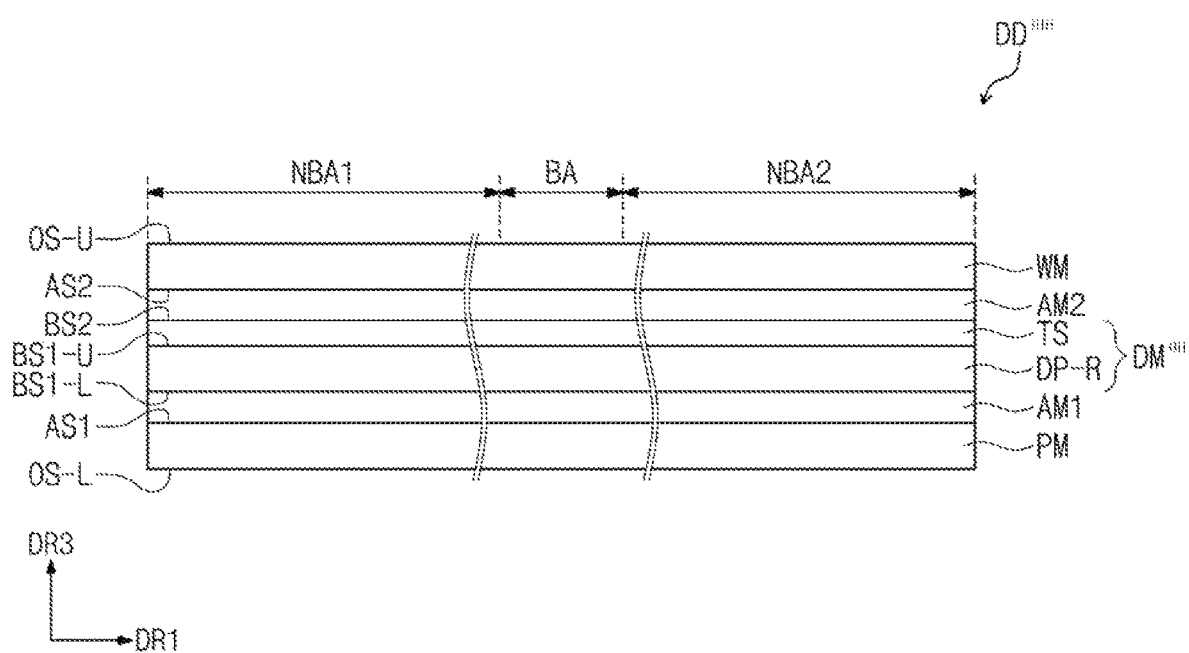

As illustrated in FIGS. 4C and 4D, the reflection prevention layer RPL that is separately formed in FIGS. 4A and 4B may be combined with another functional layer. In this manner, the reflection prevention layer may constitute a portion of the touch sensing layer TS or a portion of a display panel layer DP. Referring to FIG. 4C, the touch sensing layer TS-R may also have the function of the reflection prevention layer RPL. With reference to FIG. 4D, the display panel layer DP-R may also have the function of the reflection prevention layer RPL. As illustrated in FIGS. 4C and 4D, each of the touch sensing layers TS-R and TS is disposed directly on the second display panel surface BS1-U. The first adhesion member AM1 is coupled to the first display panel surface BS1-L through the first adhesion surface AS1.

Figure 5:
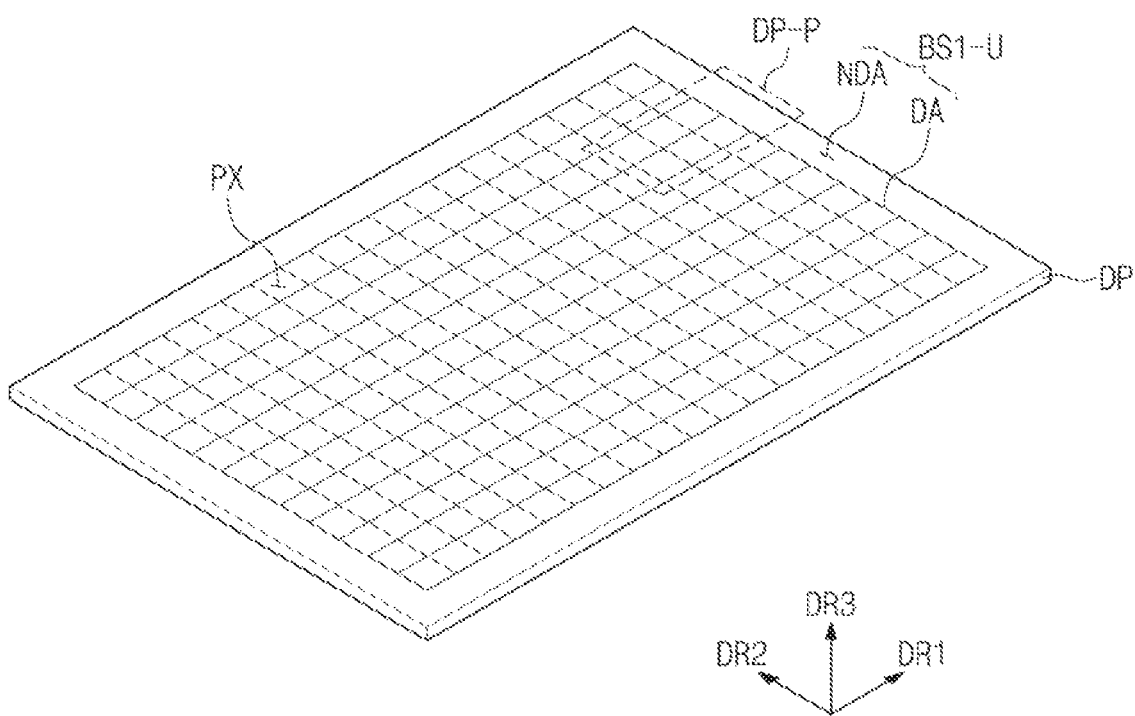
FIG. 5 is a perspective view of a flexible display panel, according to one or more exemplary embodiments.
Figure 6:
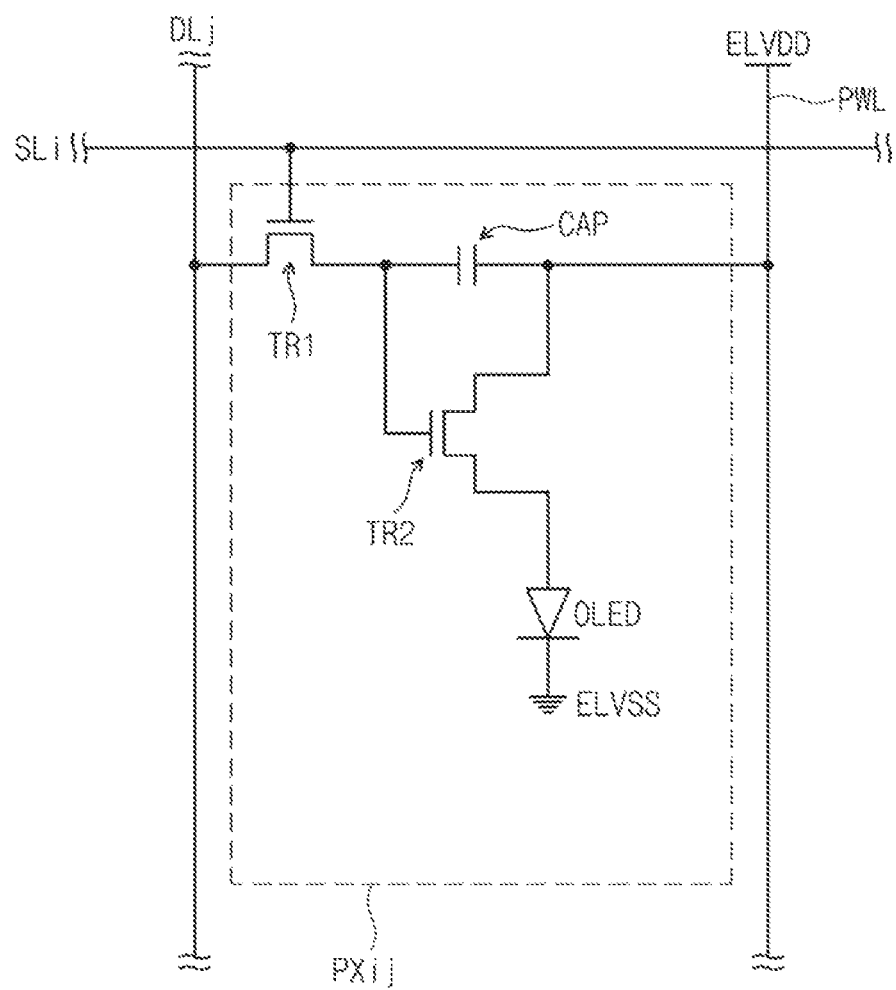
FIG. 6 is an equivalent circuit diagram of a pixel of the flexible display panel of FIG. 5, according to one or more exemplary embodiments.

FIG. 5 is a perspective view of a flexible display panel, according to one or more exemplary embodiments. FIG. 6 is an equivalent circuit diagram of a pixel of the flexible display panel of FIG. 5, according to one or more exemplary embodiments.

Hereinafter, the flexible display panel layer DP will be described as an organic light emitting display panel layer DP. The organic light emitting display panel layer DP includes a display area DA and a non-display area NDA on a plane. The second display panel surface BS1-U may be divided into the display area DA and the non-display area NDA. The display area DA and the non-display area NDA of the second display panel surface BS1-U do not need to match the display area DD-DA and the non-display area DD-NDA of the flexible display device DD of FIG. 1A. For example, the display area DA and the non-display area NDA of the second display panel surface BS1-U may be configured according a structure and/or design of the organic light emitting display panel layer DP.

As illustrated in FIG. 5, the organic light emitting display panel layer DP includes a plurality of pixels PX disposed on the display area DA. Although the plurality of pixels PX are shown as being arranged in a matrix shape, exemplary embodiments are not limited thereto or thereby. The plurality of pixels PX may be arranged in any suitable shape, such as a non-matrix shape, e.g., a pantile shape.

FIG. 6 illustrates an example of an equivalent circuit of a representative pixel PXij to which an i-th scan line SLi and a j-th source line DLj are connected. Although not separately shown, the plurality of pixels PX may have the same equivalent circuit as representative pixel PXij. The pixel PXij includes at least two transistors TR1 and TR2, at least one capacitor CAP, and an organic light emitting device OLED. Although a pixel driving circuit including two transistors TR1 and TR2 and one capacitor CAP is illustrated as an example, exemplary embodiments are not limited to the configuration of the pixel driving circuit.

An anode of the organic light emitting device OLED receives a first power voltage ELVDD applied to a power line PWL through the second transistor TR2. A cathode of the organic light emitting device OLED receives a second power voltage ELVSS. The first transistor TR1 outputs a data signal applied to a j-th source line DLj in response to a scanning signal applied to the i-th scan line SLi. The capacitor CAP charges a voltage to correspond to the data signal received from the first transistor TR1. The second transistor TR2 controls driving current flowing through the organic light emitting device OLED to correspond to a voltage stored in the capacitor CAP.

Figure 8A:
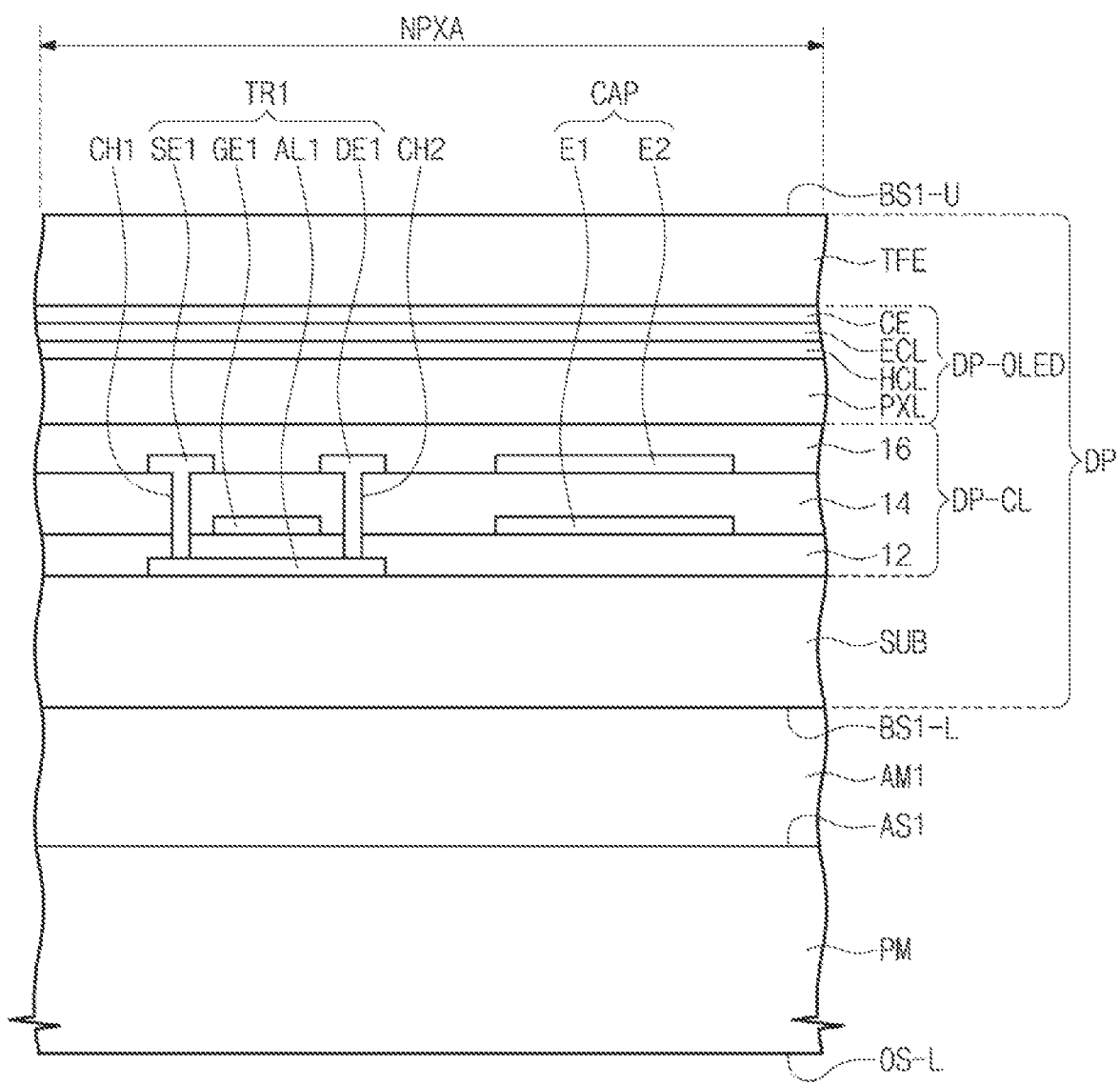
FIGS. 8A and 8B are partial cross-sectional views of the organic light emitting display panel of FIG. 7, according to one or more exemplary embodiments.
Figure 8B:
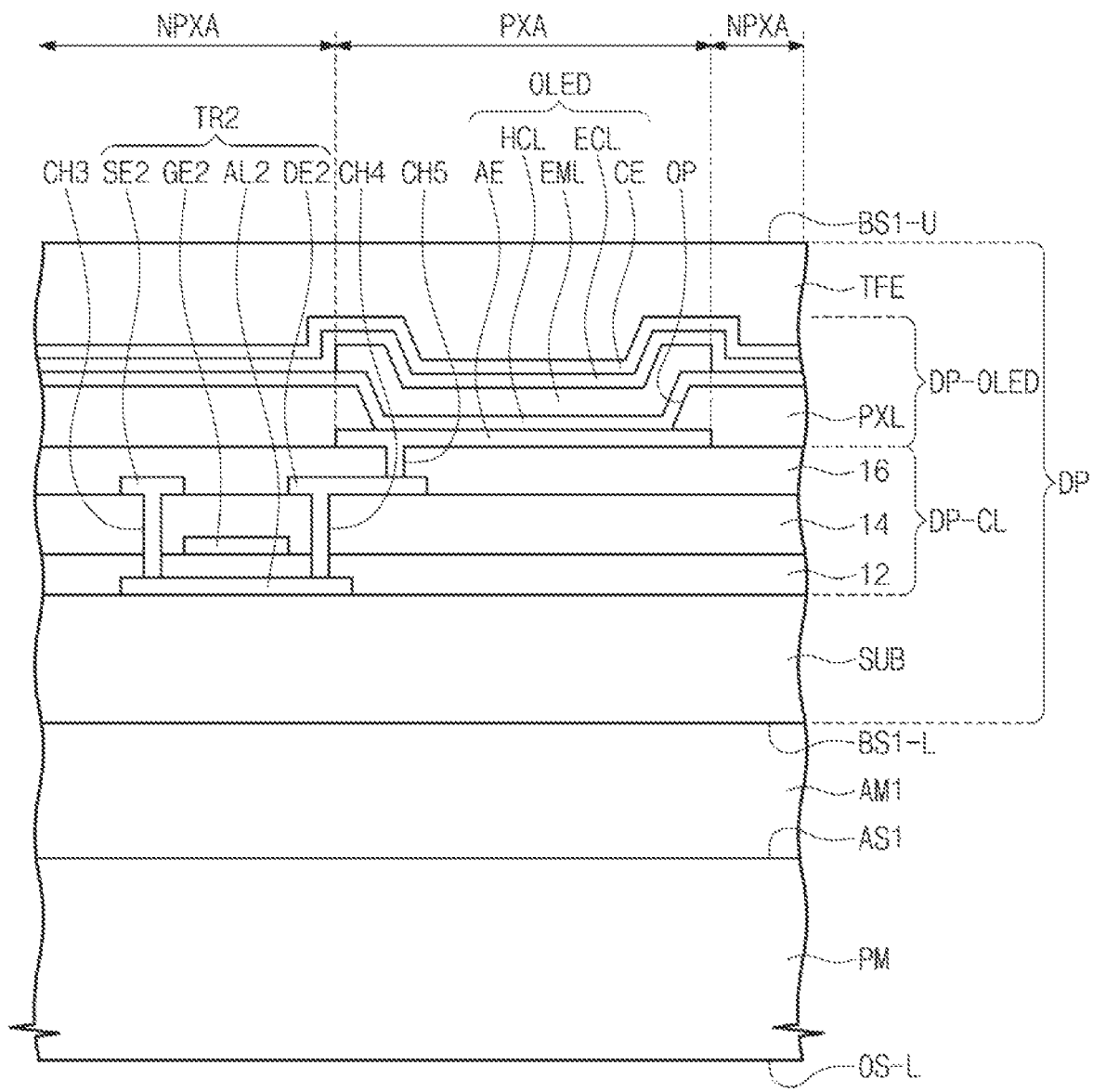

FIG. 7 is a partial plan view of a portion of the organic light emitting display panel of FIG. 5, according to one or more exemplary embodiments. FIGS. 8A and 8B are partial cross-sectional views of the organic light emitting display panel of FIG. 7, according to one or more exemplary embodiments.

FIG. 7 corresponds to a portion DP-P of the organic light emitting display panel of FIG. 5. FIG. 8A is a partial cross-sectional view of a portion corresponding to the first transistor TR1 and the capacitor CAP of the equivalent circuit of FIG. 6, whereas FIG. 8B is a partial cross-sectional view of a portion corresponding to the second transistor TR2 and the organic light emitting device OLED of the equivalent circuit of FIG. 6. In FIGS. 8A and 8B, the first adhesion member AM1 and the external protection member PM disposed on a first outer surface OS-L are additionally illustrated.

As illustrated in FIG. 7, the display area DA is defined as a plurality of light emitting areas PXA-R, PXA-G, and PXA-B and a non-light emitting area NPXA on a plane defined by the first directional axis DR1 and the second directional axis DR2. FIG. 7 illustrates an example of three types of light emitting areas PXA-R, PXA-G, and PXA-B that are arranged in a matrix shape. Organic light emitting devices that emit light having three colors different from each other may be disposed on the three types of light emitting areas PXA-R, PXA-G, and PXA-B, respectively. It is also contemplated that, in one or more exemplary embodiments, the organic light emitting devices that emit light having white colors may be disposed on the three types of light emitting areas PXA-R, PXA-G, and PXA-B, respectively. In this manner, three types of color filters having colors different from each other may overlap the three types of light emitting areas PXA-R, PXA-G, and PXA-B, respectively.

As used herein, a feature in which "light having a predetermined color is emitted from the light emitting area" may include a case in which light generated in the light emitting device is emitted as it is, as well as a case in which light generated in the corresponding light emitting device is converted in color and then emitted. In one or more exemplary embodiments, the plurality of light emitting areas PXA-R, PXA-G, and PXA-B may include four or more types of light emitting areas.

The non-light emitting area NPXA may be divided into first non-light emitting areas NPXA-1 surrounding the light emitting areas PXA-R, PXA-G, and PXA-B and a second non-light emitting area NPXA-2 defining a boundary of the first non-light emitting areas NPXA-1. A driving circuit of the pixel corresponding to each of the first non-light emitting areas NPXA-1, e.g., the transistors TR1 and TR2 (see FIG. 6) or the capacitor CAP (see FIG. 6) may be disposed on each of the first non-light emitting areas NPXA-1. The signal lines, e.g., the scan line SLi (see FIG. 6), the source line DLj (see FIG. 6), and the power line PWL (see FIG. 6) may be disposed on the second non-light emitting area NPXA-2. It is contemplated, however, that exemplary embodiments are not limited thereto or thereby. For example, the first non-light emitting areas NPXA-1 and the second non-light emitting area NPXA-2 may not be divided with respect to each other.

Although not separately shown, in one or more exemplary embodiments, each of the light emitting areas PXA-R, PXA-G, and PXA-B may have a shape that is similar to a diamond shape. Further, according to one or more exemplary embodiments, the organic light emitting devices that emit light having four colors different from each other may be disposed on the four types of light emitting areas that are repeatedly disposed.

As illustrated in FIGS. 8A and 8B, the organic light emitting display panel layer DP includes a base layer SUB, a circuit layer DP-CL, an organic light emitting device layer DP-OLED, and a thin film encapsulation layer TFE. The circuit layer DP-CL may include a plurality of conductive layers and a plurality of insulation layers, and the organic light emitting device layer DP-OLED may include a plurality of conductive layers and a plurality of functional organic layers. The thin film encapsulation layer TFE may include at least one organic layer and at least one inorganic layer.

The base layer SUB may include a plastic substrate, a glass substrate, a metal substrate, or an organic/inorganic composite substrate, which are formed of polyimide, as the flexible substrate. The base layer SUB may provide a first display panel surface BS1-L. In one or more exemplary embodiments, the base layer SUB may have a multi-layered structure. The first adhesion member AM1 adheres to the first display panel surface BS1-L through the first adhesion surface AS1.

A semiconductor pattern AL1 (hereinafter, referred to as a first semiconductor pattern) of the first transistor TR1 and a semiconductor pattern AL2 (hereinafter, referred to as a second semiconductor pattern) of the second transistor TR2 are disposed on the base layer SUB. The first and second semiconductor patterns AL1 and AL2 may be formed of amorphous silicon that is formed at a relatively low temperature. In addition, each of the first and second semiconductor patterns AL1 and AL2 may be formed of a metal oxide semiconductor. Although not separately shown, functional layers may be further disposed on a surface of the base layer SUB. The functional layers may include at least one of a barrier layer and a buffer layer. The first and second semiconductor patterns AL1 and AL2 may be disposed on the barrier layer or the buffer layer.

A first insulation layer 12 covering the first and second semiconductor patterns AL1 and AL2 is disposed on the base layer SUB. The first insulation layer 12 may include an organic layer and/or an inorganic layer. In one or more exemplary embodiments, the first insulation layer 12 may include a plurality of inorganic thin films. The plurality of inorganic thin films may include a silicon nitride layer and a silicon oxide layer.

A control electrode GE1 (hereinafter, referred to as a first control electrode) of the first transistor TR1 and a control electrode GE2 (hereinafter, referred to as a second control electrode) of the second transistor TR2 are disposed on the first insulation layer 12. A first electrode E1 of the capacitor CAP is disposed on the first insulation layer 12. The first control electrode GE1, the second control electrode GE2, and the first electrode E1 may be manufactured by the same photolithographic process as the scan line SLi (see FIG. 4). That is, the first electrode E1 may be formed of the same material as the scan line SLi.

The first control electrode GE1, a second insulation layer 14 covering the first and second control electrodes GE1 and GE2 and the first electrode E1 is disposed on the first insulation layer 12. The second insulation layer 14 includes an organic layer and/or an inorganic layer. In one or more exemplary embodiments, the second insulation layer 14 may include a plurality of inorganic thin films. The plurality of inorganic thin films may include a silicon nitride layer and a silicon oxide layer.

The source line DLj (see FIG. 6) and the power line PWL (see FIG. 6) may be disposed on the second insulation layer 14. An input electrode SE1 (hereinafter, referred to as a first input electrode) and an output electrode DE1 (hereinafter, referred to as a first output electrode) of the first transistor TR1 are disposed on the second insulation layer 14. An input electrode SE2 (hereinafter, referred to as a second input electrode) and an output electrode DE2 (hereinafter, referred to as a second output electrode) of the second transistor TR2 are disposed on the second insulation layer 14. The first input electrode SE1 is branched from the source line DLj. The second input electrode SE2 is branched from the power line PWL.

A second electrode E2 of the capacitor CAP is disposed on the second insulation layer 14. The second electrode E2 may be manufactured by the same photolithographic process as the source line DLj and the power line PWL, and, thereby, formed of the same material as the source line DLj and the power line PWL.

The first input electrode SE1 and the first output electrode DE1 are connected to the first semiconductor pattern AL1 through first and second through holes CH1 and CH2, which pass through the first and second insulation layers 12 and 14, respectively. The first output electrode DE1 may be electrically connected to the first electrode E1. For example, the first output electrode DE1 may be connected to the first electrode E1 through a through hole (not shown) passing through the second insulation layer 14. The second input electrode SE2 and the second output electrode DE2 are connected to the second semiconductor pattern AL2 through third and fourth through holes CH3 and CH4, which pass through the first and second insulation layers 12 and 14, respectively. According to one or more exemplary embodiments, at least one of the first and second transistors TR1 and TR2 may be formed as a bottom gate structure.

A third insulation layer 16 covering the first input electrode SE1, the first output electrode DE1, the second input electrode SE2, and the second output electrode DE2 is disposed on the second insulation layer 14. The third insulation layer 16 includes an organic layer and/or an inorganic layer. In one or more exemplary embodiments, the third insulation layer 16 may be formed of an organic material to provide a flat surface.

A pixel defining layer PXL and an organic light emitting device OLED are disposed on the third insulation layer 16. An opening OP is defined in the pixel defining layer PXL. The pixel defining layer PXL may be another insulation layer. The opening OP of FIGS. 8A and 8B may correspond to openings OP-R, OP-G, and OP-B of FIG. 7.

The anode AE of organic light emitting device OLED is connected to the second output electrode DE2 through a fifth through hole CH5 passing through the third insulation layer 16. The opening OP of the pixel defining layer PXL exposes at least a portion of the anode AE. A hole control layer HCL may be commonly defined in the light emitting areas PXA-R, PXA-G, and PXA-B (see FIG. 7) and the non-light emitting area NPXA (see FIG. 7). An organic light emitting layer EML and an electron control layer ECL are successively formed on the hole control layer HCL. The hole control layer HCL includes at least one hole transfer layer, and the electron control layer ECL includes at least one electron transfer layer. Thereafter, the cathode CE may be commonly formed on the light emitting areas PXA-R, PXA-G, and PXA-B and the non-light emitting area NPXA.

The cathode CE may be formed by a deposition or sputtering process according to its layered structure.

The thin film encapsulation layer TFE encapsulating the organic light emitting device layer DP-OLED is disposed on the cathode CE. The thin film encapsulation layer TFE protects the organic light emitting device OLED against moisture and foreign substances. In one or more exemplary embodiments, the thin film encapsulation layer TFE provides a second display panel surface BS1-U. In one or more exemplary embodiments, a buffer layer (not shown) may be disposed on the thin film encapsulation layer TFE, and, as such, may provide the second display panel surface BS1-U.

According to one or more exemplary embodiments, the light emitting area PXA may be defined as an area from which light is emitted. The light emitting area PXA may be defined to correspond to the anode AE or the light emitting layer EML of the organic light emitting device OLED. Although the patterned organic light emitting layer EML is illustrated as an example, the organic light emitting layer EML may be commonly disposed on the non-light emitting area NPXA (see FIG. 5) and the light emitting areas PXA-R, PXA-G, and PXA-B (see FIG. 5). In this manner, the organic light emitting layer EML may emit white light.

Figure 9A:
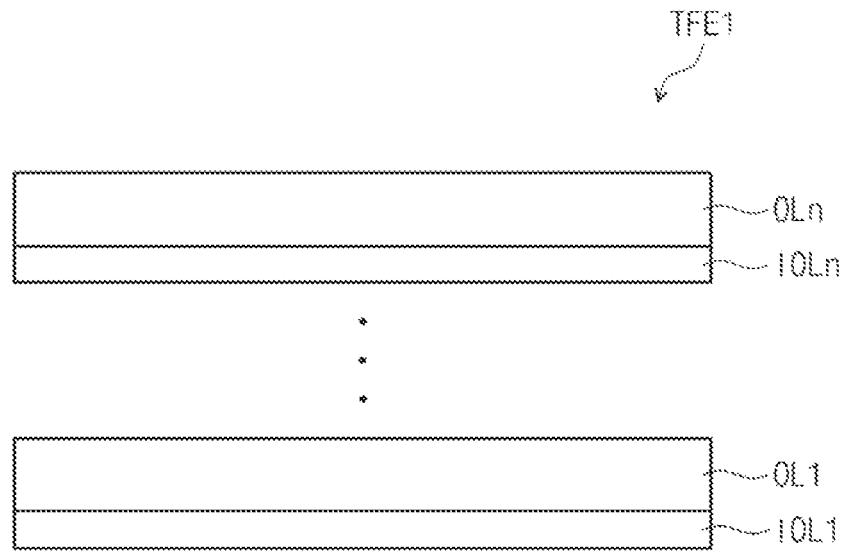
FIGS. 9A, 9B, and 9C are cross-sectional views of thin film encapsulation layers, according to one or more exemplary embodiments.
Figure 9B:
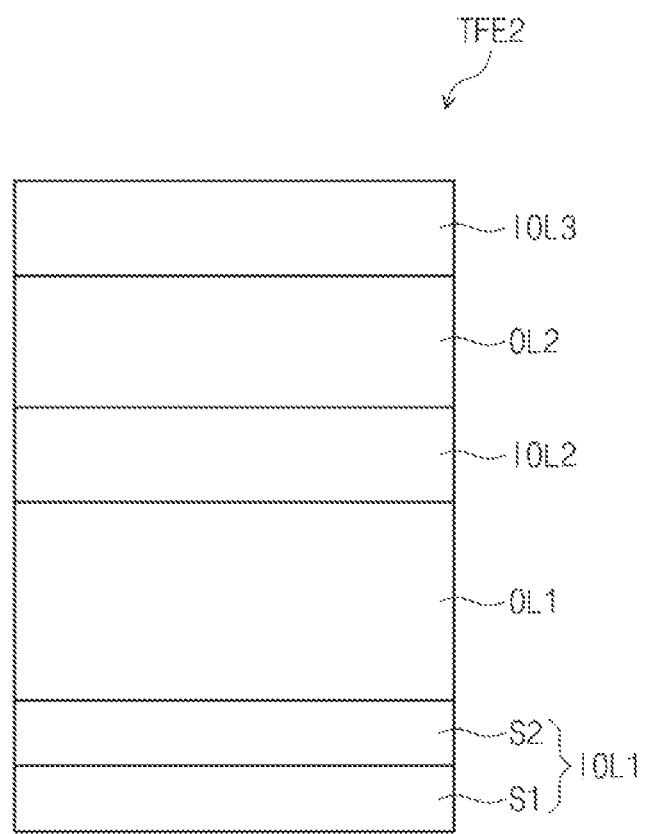
Figure 9C:
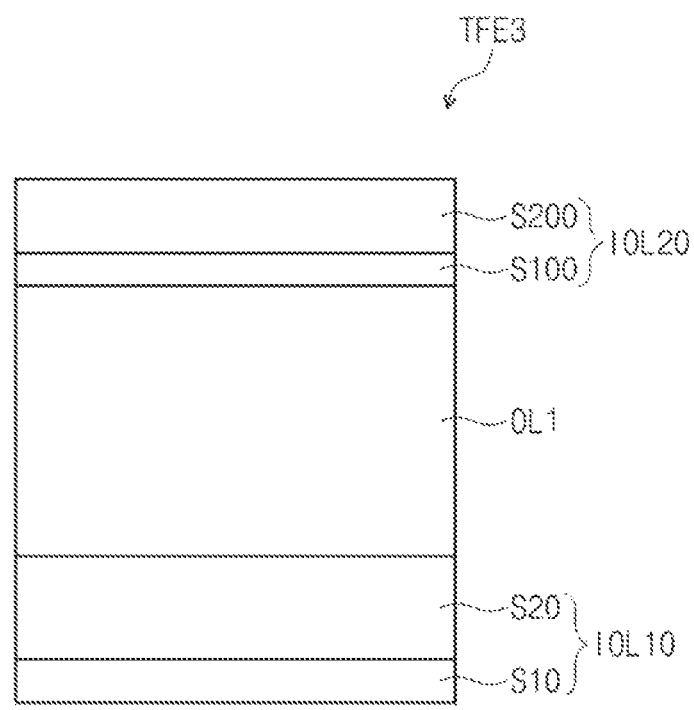

FIGS. 9A to 9C are cross-sectional views of thin film encapsulation layers, according to one or more exemplary embodiments. The thin film encapsulation layers TFE1, TFE2, and TFE3 will be described with reference to FIGS. 9A, 9B, and 9C, respectively.

According to one or more exemplary embodiments, a thin film encapsulation layer may include at least two inorganic thin films and an organic thin film disposed between the at least two inorganic thin films. The inorganic thin films protect the organic light emitting device OLED against moisture, and the organic thin film protects the organic light emitting device OLED against foreign substances, such as dust particles.

As illustrated in FIG. 9A, the thin film encapsulation layer TFE1 may include n (n being a natural number) inorganic thin films IOL1 to IOLn including the first inorganic thin film IOL1 contacting the cathode CE (see FIG. 8B). The first inorganic thin film IOL1 may be defined as a lower inorganic thin film, and the inorganic thin films except for the first inorganic thin film IOL1 of the n inorganic thin films IOL1 to IOLn may be defined as upper inorganic thin films. The thin film encapsulation layer TFE1 includes n organic thin films OL1 to OLn. The n organic thin films OL1 to OLn and the n inorganic thin films IOL1 to IOLn may be alternately disposed with respect to each other. The uppermost layer may be the organic layer or the inorganic layer. Each of the n organic thin films OL1 to OLn may generally have a thickness greater than that of each of the organic thin films IOL1 to IOLn.

In one or more exemplary embodiments, each of the n inorganic thin films IOL1 to IOLn may have a single layer structure formed of one material or a multi-layer structure respectively formed of materials different from each other. Each of the n organic thin films OL1 to OLn may be formed by depositing organic monomers. The organic monomers may be acrylic-based monomers.

As illustrated in FIGS. 9B and 9C, the inorganic thin films of each of the thin film encapsulation layers TFE2 and TFE3 may be formed of the same inorganic material or inorganic materials different from each other and have the same thickness or thicknesses different from each other. The organic thin films of each of the thin film encapsulation layers TFE2 and TFE3 may be formed of the same organic material or organic materials different from each other and have the same thickness or thicknesses different from each other.

Referring to FIG. 9B, the thin film encapsulation layer TFE2 may include a first inorganic thin film IOL1, a first organic thin film OL1, a second inorganic thin film IOL2, a second organic thin film OL2, and a third inorganic thin film IOL3 that are successively stacked on one another. The first inorganic thin film IOL1 may have a two-layer structure. A first sub-layer S1 may be a lithium fluoride layer, and a second sub-layer S2 may be an aluminum oxide layer. The first organic thin film OL1 may be a first organic monomer layer, the second inorganic thin film IOL2 may be a first silicon nitride layer, the second organic thin film OL2 may be a second organic monomer layer, and the third inorganic thin film IOL3 may be a second silicon nitride layer.

As illustrated in FIG. 9C, the thin film encapsulation layer TFE3 may include a first inorganic thin film IOL10, a first organic thin film OL1, and a second inorganic thin film IOL20 that are successively stacked on one another. The first inorganic thin film IOL10 may have a two-layer structure. A first sub-layer S10 may be a lithium fluoride layer, and a second sub-layer S20 may be a silicon oxide layer. The first organic thin film OL1 may be an organic monomer, and the second inorganic thin film IOL20 may have a two-layer structure. The second inorganic thin film IOL20 may include a first sub-layer S100 and a second sub layer S200 that are deposited under different deposition environments than each other. The first sub-layer S100 may be deposited under a lower power condition, and the second sub-layer S200 may be deposited under a high power condition. Each of the first sub-layer S100 and the second sub-layer S200 may be a silicon nitride layer.

Figure 10A:
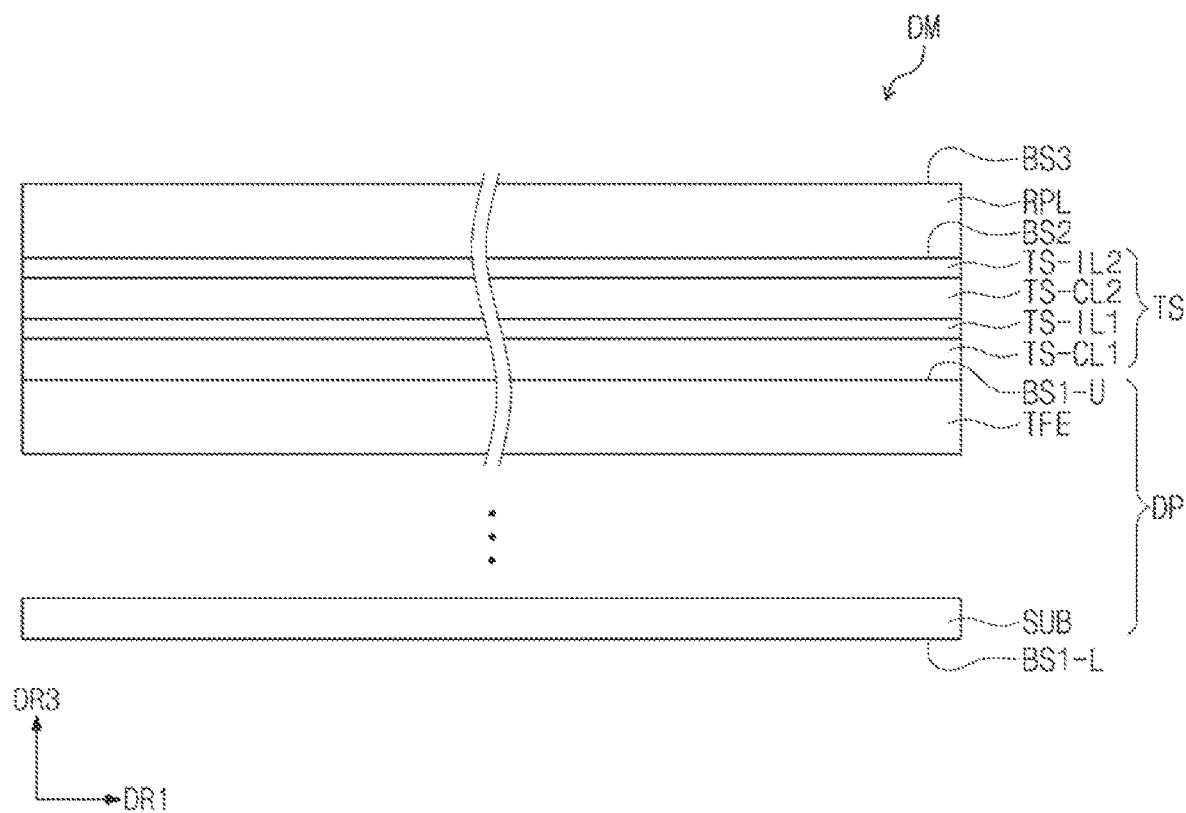
FIGS. 10A, 10B, and 10C are cross-sectional views of display devices, according to one or more exemplary embodiments.
Figure 10B:
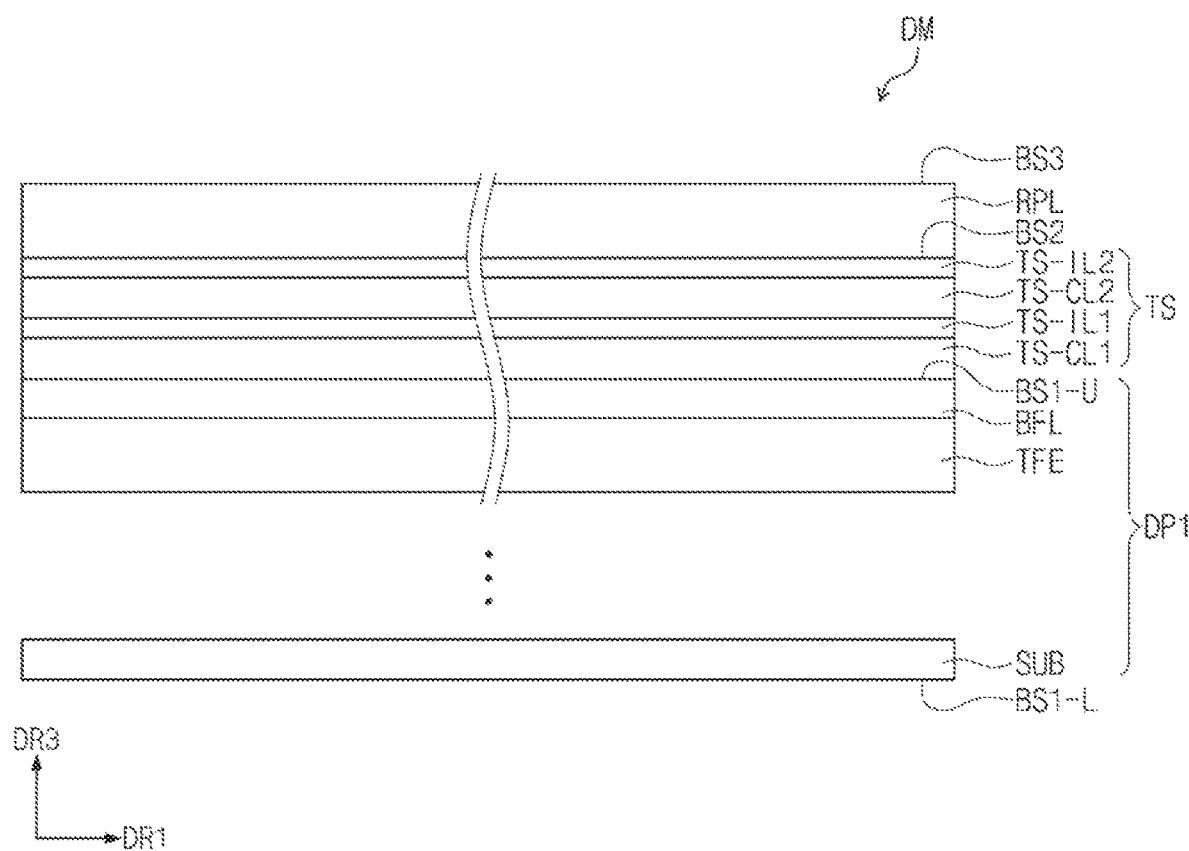
Figure 10C:
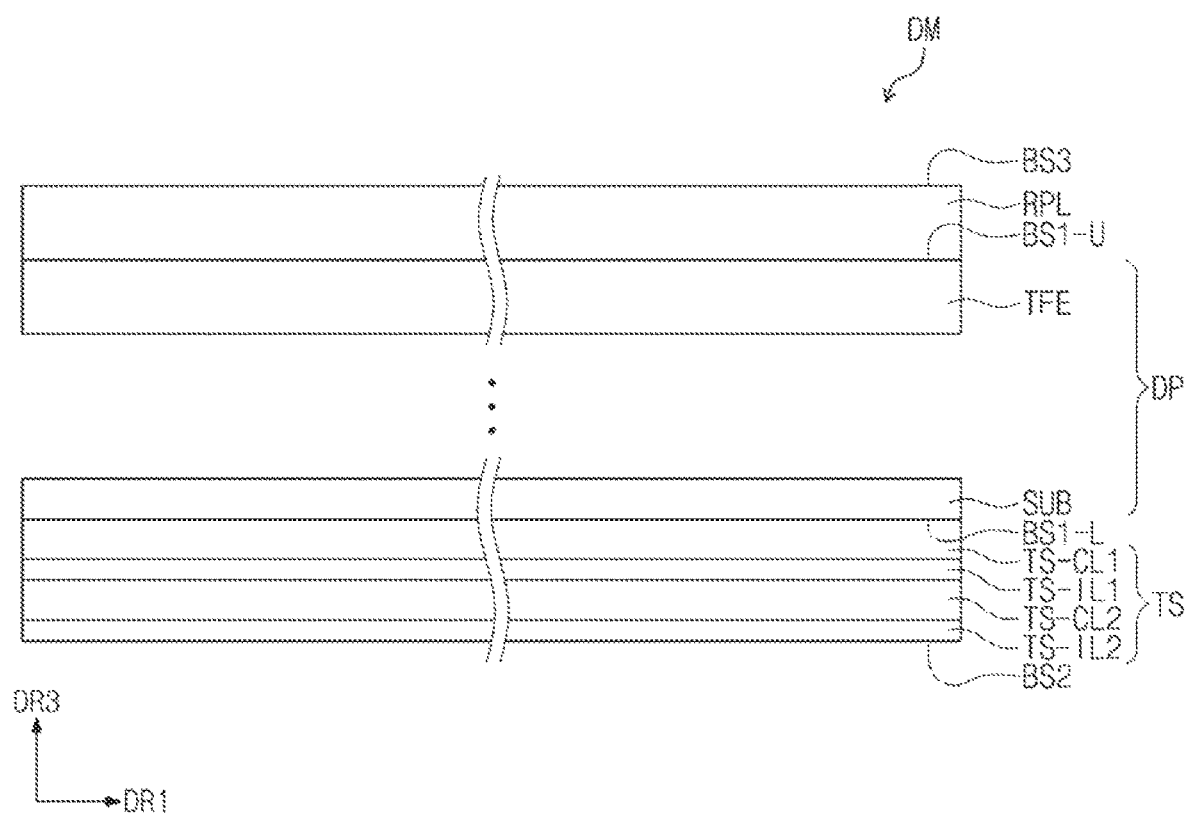

FIGS. 10A, 10B, and 10C are cross-sectional views of display devices, according to one or more exemplary embodiments. For illustrative and descriptive convenience, the reflection prevention layer RPL is shown as a single layer, and only a portion of the display panel layer DP is shown. As illustrated in FIGS. 10A to 10C, the touch sensing layer TS may include a first conductive layer TS-CL1, a first touch insulation layer TS-IL1, a second conductive layer TS-CL2, and a second touch insulation layer TS-IL2.

Each of the first conductive layer TS-CL1 and the second conductive layer TS-CL2 may have a single-layer structure or a multi-layer structure in which a plurality of layers are stacked in the third directional axis DR3. A conductive layer having a multi-layer structure may include a transparent conductive layer and at least one metal layer. The conductive layer having the multi-layer structure may include metal layers formed of metals different from each other. The transparent conductive layer may be formed of indium tin oxide (ITO), indium zinc oxide (IZO), zinc oxide (ZnO), indium tin zinc oxide (ITZO), PEDOT, a metal nano wire, and graphene. The metal layer may be formed of at least one of molybdenum, silver, titanium, copper, aluminum, and an alloy thereof.

Each of the first and second conductive layers TS-CL1 and TS-CL2 may include a plurality of patterns. Hereinafter, a structure in which the first conductive layer TS-CL1 includes first conductive patterns, and the second conducive layer TS-CL2 includes second conductive patterns will be described. Each of the first and second conductive patterns may include touch electrodes and touch signal lines.

According to one or more exemplary embodiments, each of the first and second touch insulation layers TS-IL1 and TS-IL2 may be formed of inorganic or organic material. The inorganic material may include silicon oxide or silicon nitride. The organic material may include at least one of an acrylic-based resin, a methacrylic-based resin, a polyisoprene-based resin, a vinyl-based resin, an epoxy-based resin, a urethane-based resin, a cellulose-based resin, or a perylene-based resin. If the first touch insulation layer TS-IL1 insulates the first and second touch insulation layers TS-IL1 and TS-IL2 from each other, exemplary embodiments may not be limited to a shape of the first touch insulation layer TS-ILL The first touch insulation layer TS-IL1 may be deformed in shape according to shapes of the first and second conductive patterns. The first touch insulation layer TS-IL1 may entirely cover the second display panel surface BS1-U that will be described later in more detail or include a plurality of insulation patterns.

As illustrated in FIG. 10A, the first conductive layer TS-CL1 may be disposed on the thin film encapsulation layer TFE. That is, the thin film encapsulation layer TFE provides the second display panel surface BS1-U on which the touch sensing layer TS is disposed.

The display panel layer DP1 of FIG. 10B may further include a buffer layer BFL disposed on the thin film encapsulation layer TFE when compared to the display panel layer DP of FIG. 10A. As such, the buffer layer BFL provides the second display panel surface BS1-U. In one or more exemplary embodiments, the buffer layer BFL may be an organic layer and formed of a different material according to the function to be performed by the buffer layer BFL. The buffer layer BFL may be an organic/inorganic layer that that matches a refraction index of surrounding layers or a color filter layer for reducing reflection of external light.

Referring to FIG. 10C, the first conductive layer TS-CL1 may be disposed on the first display panel surface BS1-L. The first touch insulation layer TS-IL1 is disposed on the first conductive layer TS-CL1, the second conductive layer TS-CL2 is disposed on the first touch insulation layer TS-IL1, and the second touch insulation layer TS-IL2 is disposed on the second conductive layer TS-CL2.

Figure 11A:
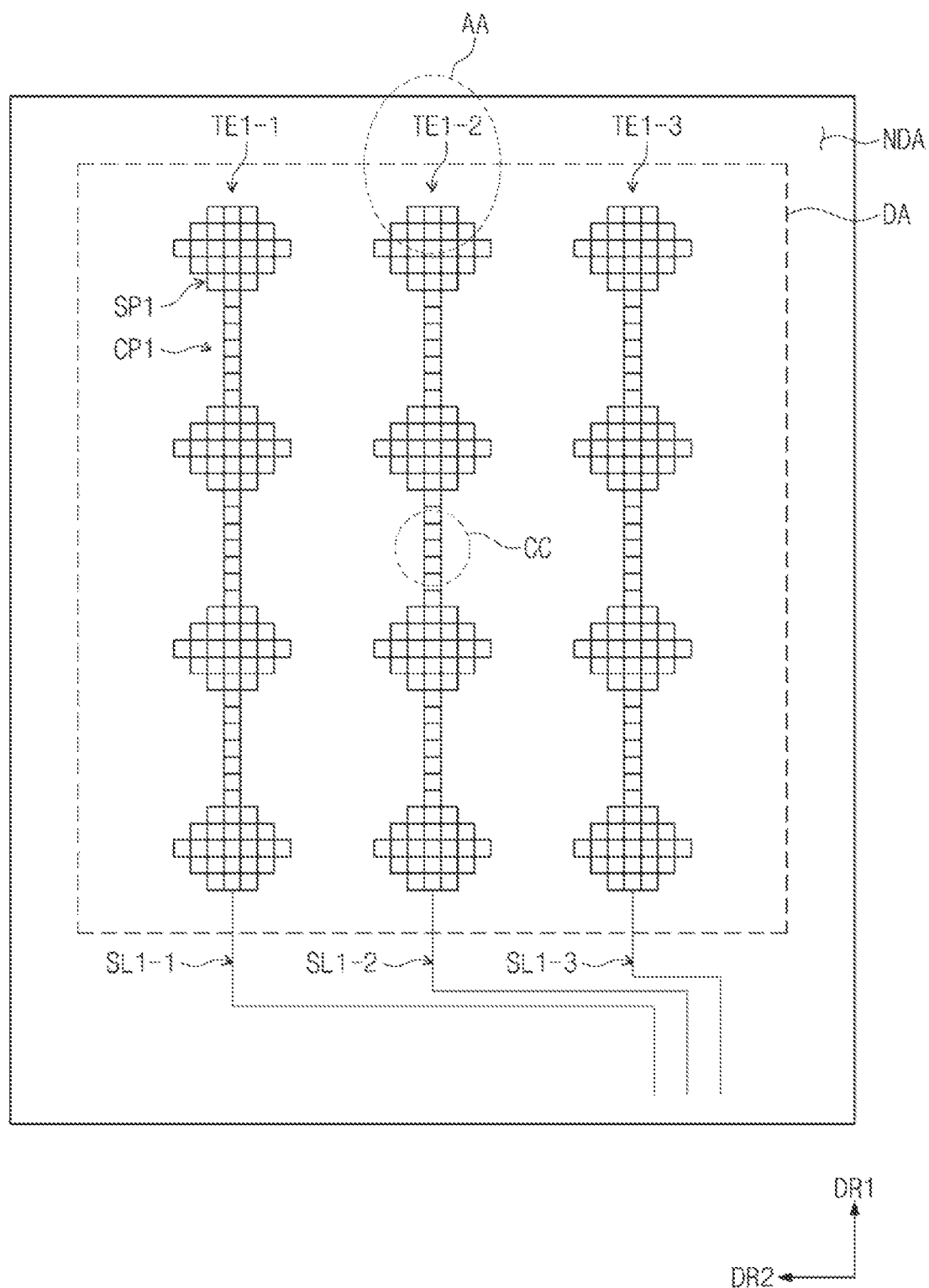
FIGS. 11A and 11B are plan views illustrating conductive layers of a touch detection member, according to one or more exemplary embodiments.
Figure 11B:
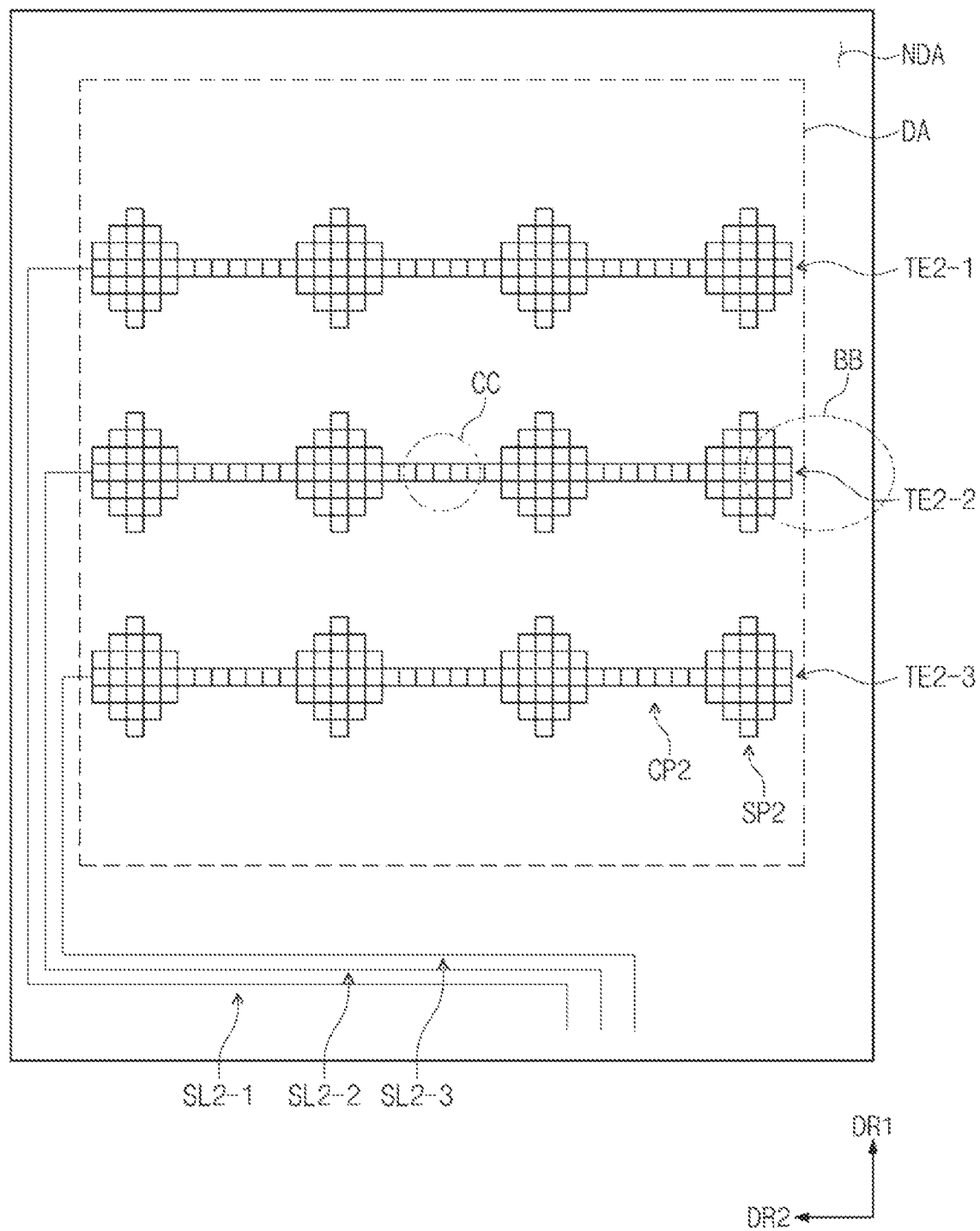
Figure 12A:
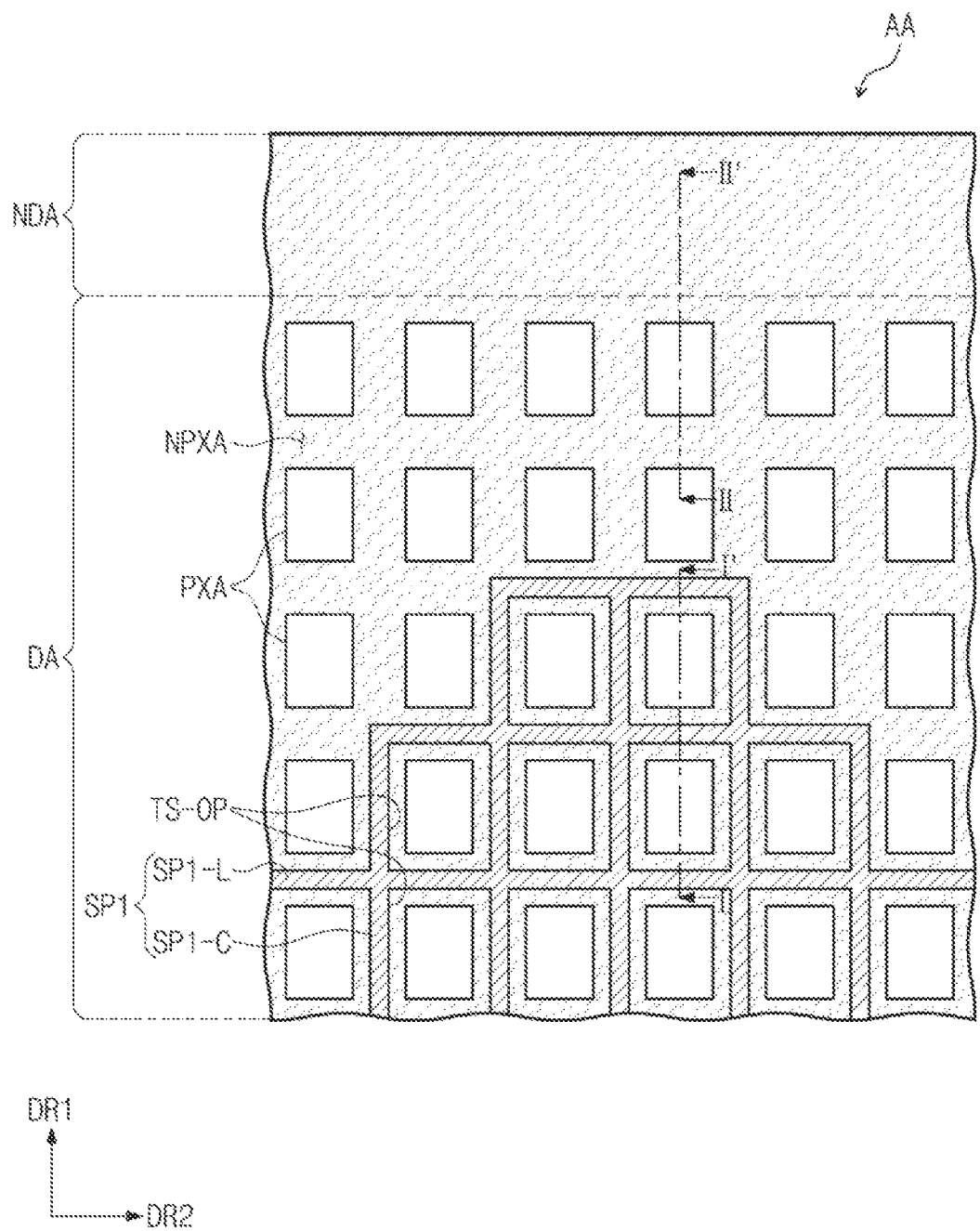
FIG. 12A is a partial enlarged view of area AA in FIG. 11A, according to one or more exemplary embodiments.
Figure 12B:
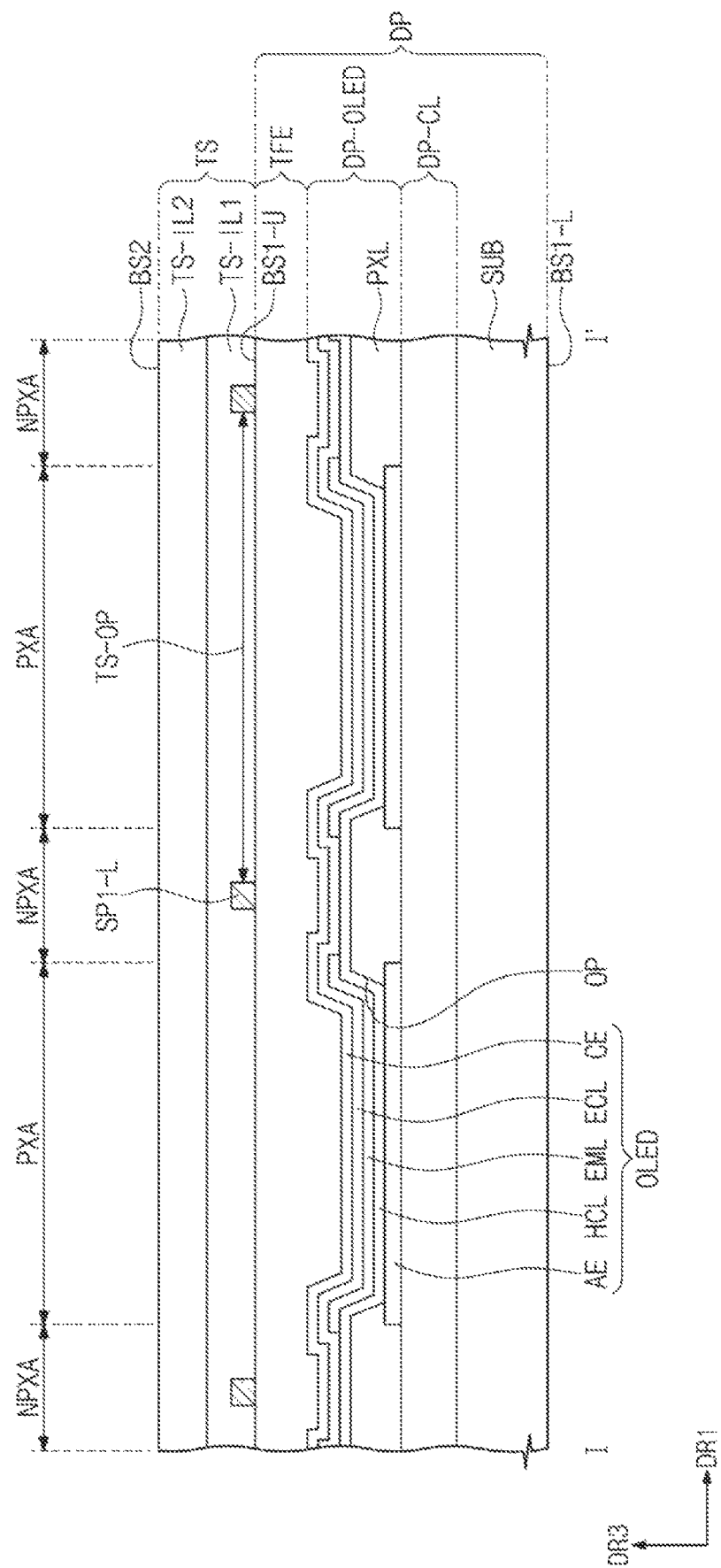
FIGS. 12B and 12C are a partial cross-sectional views of FIG. 12A respectively taken along sectional lines I-I' and II-IF, according to one or more exemplary embodiments.
Figure 12C:
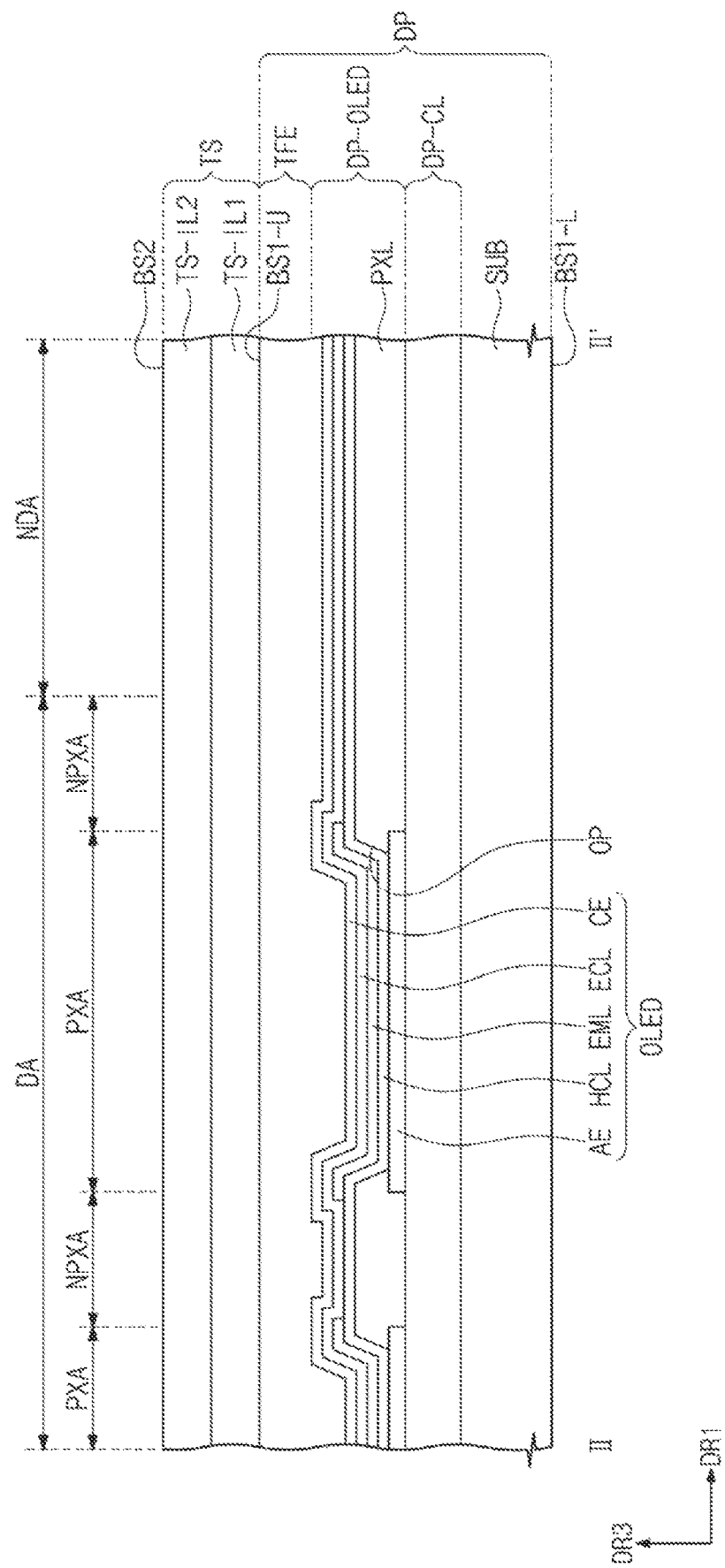
Figure 13A:
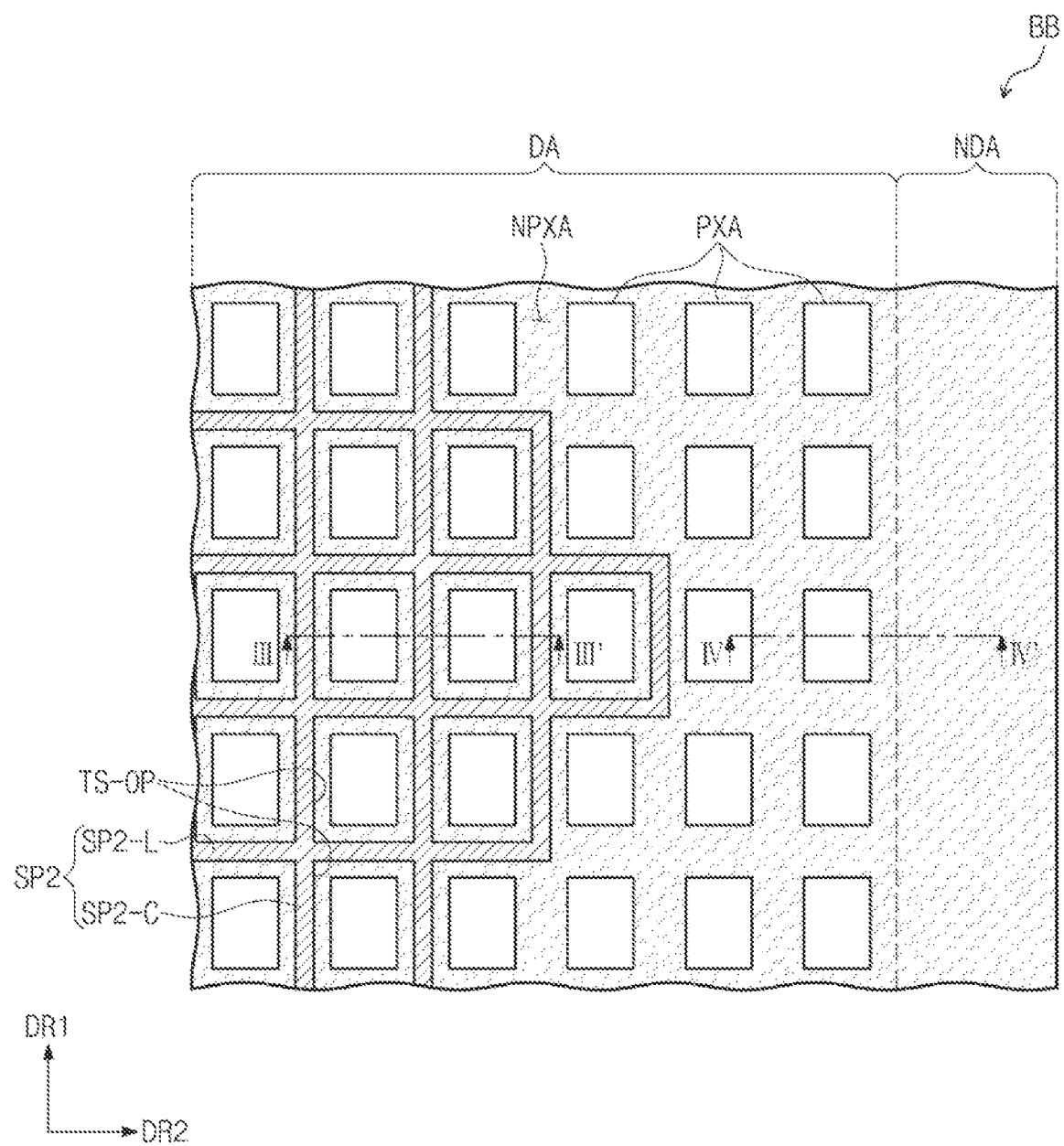
FIG. 13A is a partial enlarged view of area BB in FIG. 11B, according to one or more exemplary embodiments.
Figure 13B:
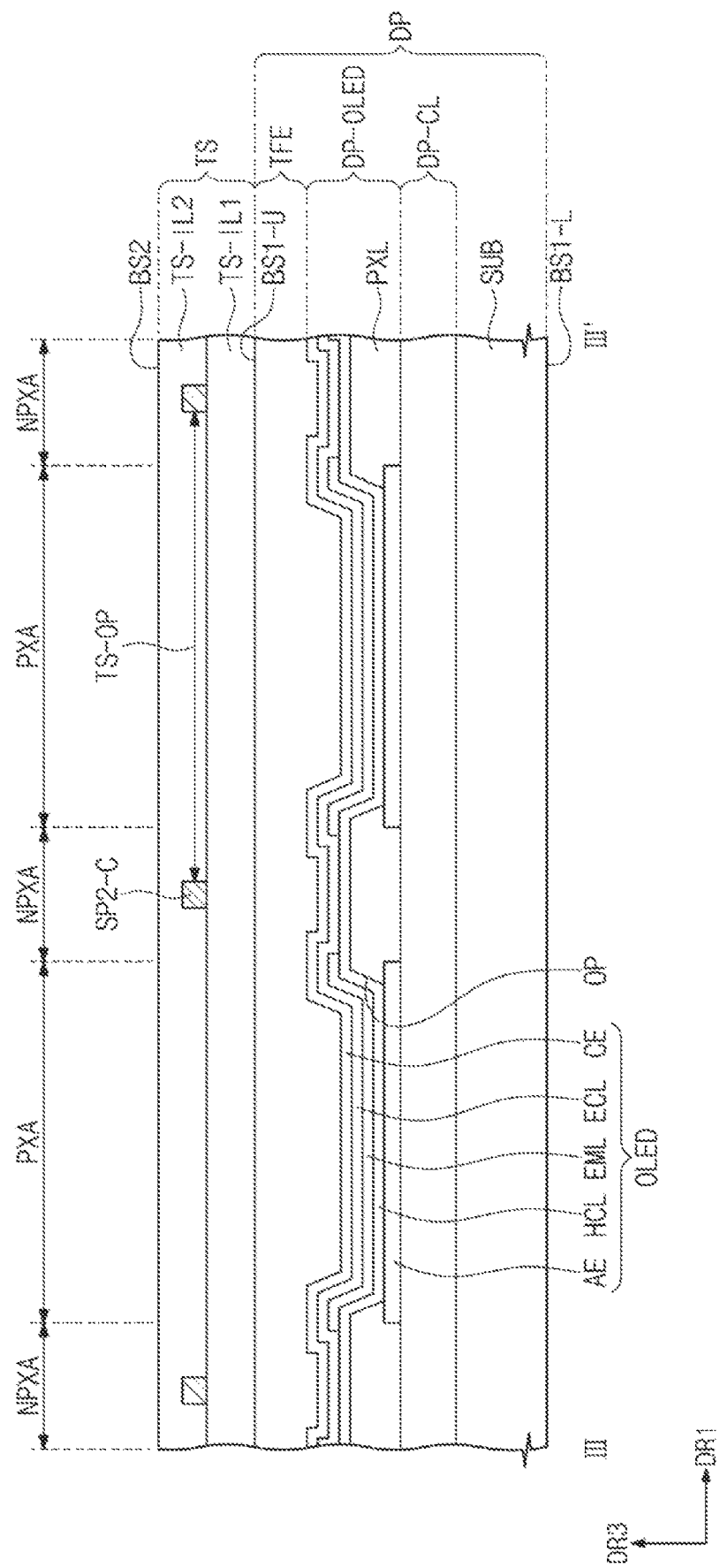
FIGS. 13B and 13C are partial cross-sectional views of FIG. 13A respectively taken along sectional lines III-III' and IV-IV', according to one or more exemplary embodiments.
Figure 13C:
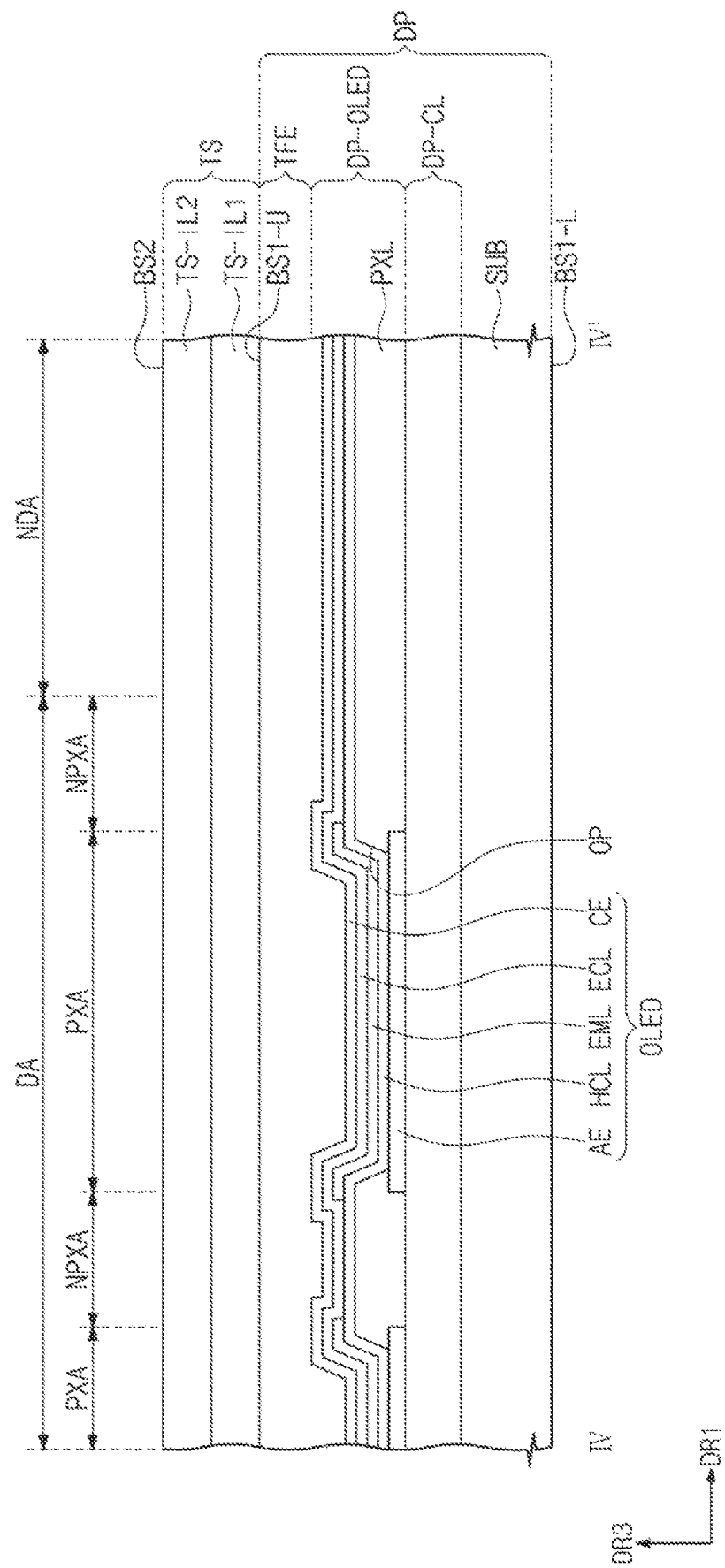
Figure 14A:
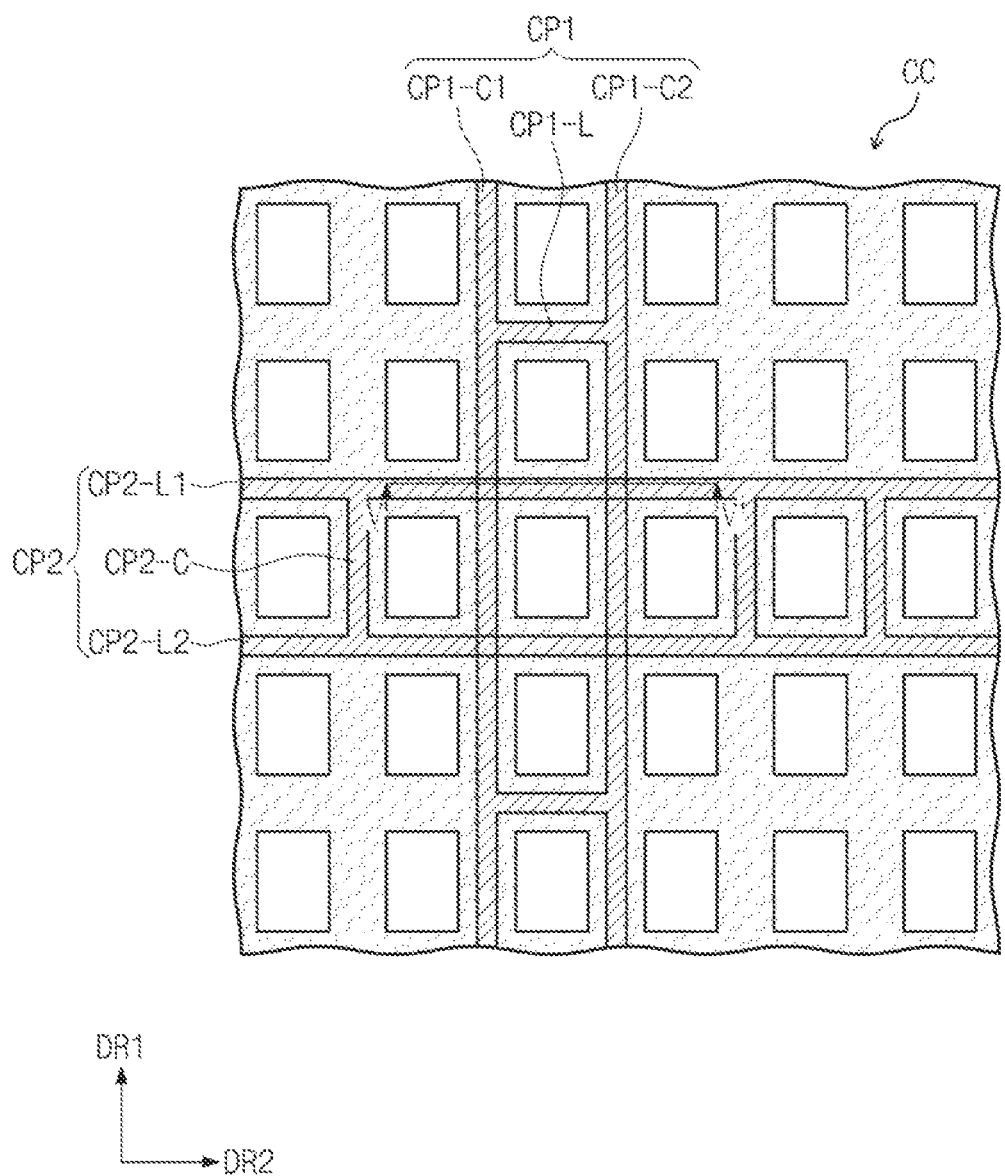
FIG. 14A is a partial enlarged view of area CC in FIG. 11B, according to one or more exemplary embodiments.
Figure 14B:
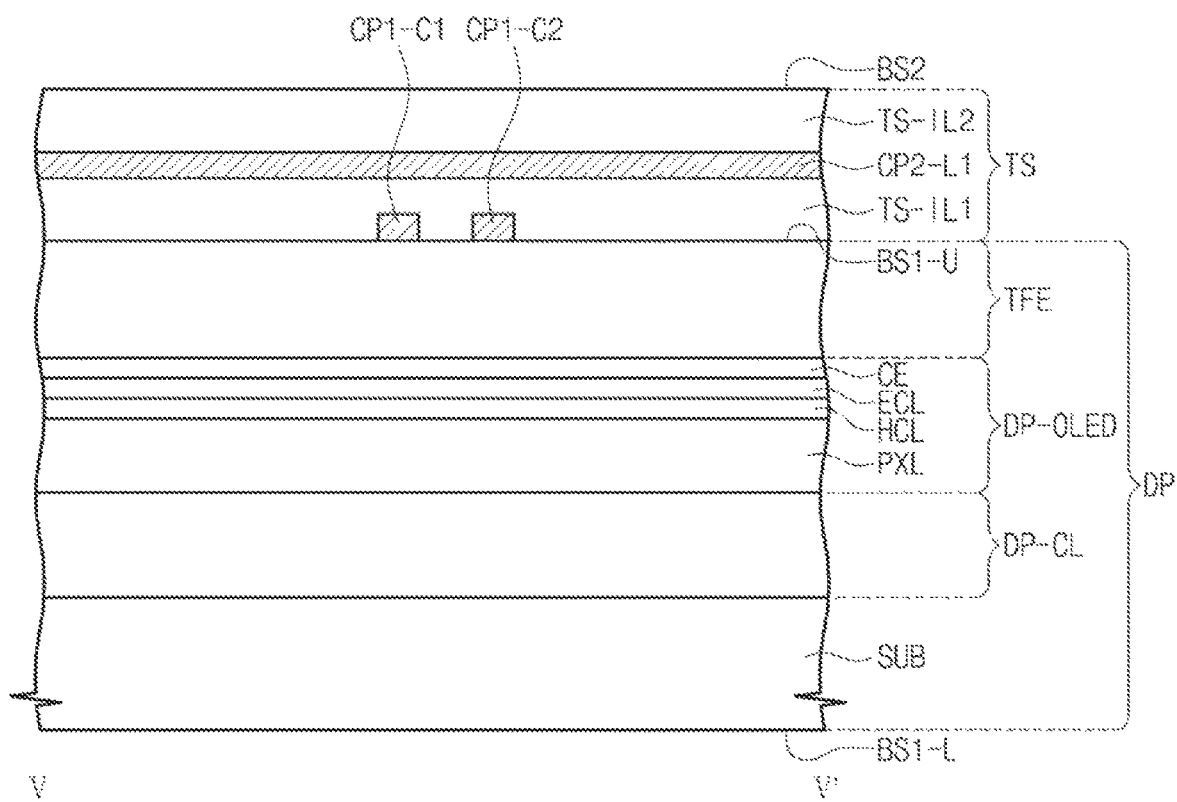
FIG. 14B is a partial cross-sectional view of FIG. 14A taken along sectional line V-V', according to one or more exemplary embodiments.

FIGS. 11A and 11B are plan views illustrating the conductive layers TS-CL1 and TS-CL2 of the touch detection member TS, according to one or more exemplary embodiments. FIG. 12A is a partial enlarged view of area AA of FIG. 11A, according to one or more exemplary embodiments. FIGS. 12B and 12C are partial cross-sectional views of FIG. 12A respectively taken along sectional lines I-I' and II-IF, according to one or more exemplary embodiments. FIG. 13A is a partial enlarged view of area BB of FIG. 11B, according to one or more exemplary embodiments. FIGS. 13B and 13C are partial cross-sectional views of FIG. 13A respectively taken along sectional lines III-III' and IV-IV', according to one or more exemplary embodiments. FIG. 14A is a partial enlarged view of area CC of FIG. 11B, according to one or more exemplary embodiments. FIG. 14B is a partial cross-sectional view of FIG. 14A taken along cross-sectional line V-V', according to one or more exemplary embodiments. It is noted that the touch sensing layer TS and the display panel layer DP of the constituents of a display module will be mainly illustrated and described in association with FIGS. 11A, 11B, 12A to 12C, 13A to 13C, 14A, and 14B. To this end, the circuit layer DP-CL is schematically illustrated and will be described in association with FIGS. 12B, 12C, 13B, 13C, and 14B.

According to one or more exemplary embodiments, a two-layer capacitive touch detection member is illustrated as an example. A two-layer capacitive touch sensing layer may acquire coordinate information at a touched point (or a hovering touch interaction) in a self-capacitance manner or a mutual capacitance manner. Exemplary embodiments, however, are not limited to or by the driving manner for acquiring the coordinate information. The first conductive patterns of FIG. 11A may correspond to the first conductive layer TS-CL1 of FIGS. 10A to 10C, and the second conductive patterns of FIG. 11B may correspond to the second conductive layer TS-CL2 of FIGS. 10A to 10C.

As illustrated in FIG. 11A, the first conductive patterns may include first touch electrodes TE1-1 to TE1-3 and first touch signal lines SL1-1 to SL1-3. Three first touch electrodes TE1-1 to TE1-3 and three first touch signal lines SL1-1 to SL1-3 respectively connected to the three first touch electrodes TE1-1 to TE1-3 are illustrated in FIG. 11A. It is contemplated, however, that any suitable number of first touch electrodes and first touch signal lines may be utilized in association with exemplary embodiments described herein.

The first touch electrodes TE1-1 to TE1-3 extend in the first direction DR1 and are arranged in the second direction DR2. Each of the first touch electrodes TE1-1 to TE1-3 may have a mesh shape in which a plurality of touch openings are defined. The mesh shape will be described later in more detail. Each of the first touch electrodes TE1-1 to TE1-3 includes a plurality of first sensing parts SP1 and a plurality of first connection parts CP1. The first sensing parts SP1 are arranged in the first direction DR1. Each of the first connection parts CP1 connects two first sensing parts SP1, which are adjacent to each other, of the first sensing parts SP1. Although not illustrated, each of the first touch signal lines SL1-1 or SL1-3 may also have a mesh shape. The first touch signal lines SL1-1 to SL1-3 may have the same layered structure as the first touch electrodes TE1-1 to TE1-3.

Referring to FIG. 11B, the second conductive patterns may include second touch electrodes TE2-1 to TE2-3 and second touch signal lines SL2-1 to SL2-3. Three second touch electrodes TE2-1 to TE2-3 and three second touch signal lines SL2-1 to SL2-3 respectively connected to the three second touch electrodes TE2-1 to TE2-3 are illustrated in FIG. 11B. It is contemplated, however, that any suitable number of second touch electrodes and second touch signal lines may be utilized in association with exemplary embodiments described herein. The second touch electrodes TE2-1 to TE2-3 are insulated from the first touch electrodes TE1-1 to TE1-3 and cross the first touch electrodes TE1-1 to TE1-3. Each of the second touch electrodes TE2-1 to TE2-3 may have a mesh shape in which a plurality of touch openings are defined.

Each of the second touch electrodes TE2-1 to TE2-3 includes a plurality of second sensing parts SP2 and a plurality of second connection parts CP2. The second sensing parts SP2 are arranged in the second direction DR2. Each of the second connection parts CP2 connects two second sensing parts SP2, which are adjacent to each other, of the second sensing parts SP2. Although not illustrated, each of the second touch signal lines SL2-1 or SL2-3 may also have a mesh shape. The second touch signal lines SL2-1 to SL2-3 may have the same layered structure as the second touch electrodes TE2-1 to TE2-3.

According to one or more exemplary embodiments, the first touch electrodes TE1-1 to TE1-3 and the second touch electrodes TE2-1 and TE2-3 are capacitively coupled to each other. Since touch detection signals are applied to the first touch electrodes TE1-1 to TE1-3, capacitors are formed (or disposed) between the first sensing parts SP1 and the second sensing parts SP2. The shapes of the first touch electrodes TE1-1 to TE1-3 and the second touch electrodes TE2-1 to TE2-3 that include the respective sensing parts and the respective connection parts of FIGS. 11A to 11B are merely examples, and, as such, exemplary embodiments are not limited thereto or thereby. For example, the connection parts may only be defined as portions at which the first touch electrodes TE1-1 to TE1-3 and the second touch electrodes TE2-1 to TE2-3 cross each other, and the sensing parts may only be defined as portions at which the first touch electrodes TE1-1 to TE1-3 and the second touch electrodes TE2-1 to TE2-3 overlap each other. In one or more exemplary embodiments, each of the first touch electrodes TE1-1 to TE1-3 and the second touch electrodes TE2-1 to TE2-3 may have a bar shape having a determined width.

As illustrated in FIG. 12A, the first sensing parts SP1 overlap with the non-light emitting area NPXA. The first sensing parts SP1 include a plurality of first vertical portions SP1-C extending in the first direction DR1 and a plurality of first horizontal portions SP1-L extending in the second direction DR2. The plurality of first vertical portions SP1-C and the plurality of first horizontal portions SP1-L may be defined as mesh lines. Each of the mesh lines may have a line width of several micrometers.

The plurality of first vertical portions SP1-C and the plurality of first horizontal portions SP1-L may be connected to each other to define a plurality of touch openings TS-OP. That is, the first sensing parts SP1 may have a mesh shape having the plurality of touch openings TS-OP. Although the structure in which the touch openings TS-OP are shown as having one-to-one correspondence with the light emitting areas PXA, exemplary embodiments are not limited thereto or thereby. For instance, a touch opening TS-OP may correspond to two or more light emitting areas PXA.

As illustrated in FIGS. 12B and 12C, the first touch insulation layer TS-IL1 overlaps with the display area DA and the non-display area NDA. The first touch insulation layer TS-IL1 is disposed on the second display panel surface BS1-U to cover the first sensing part SP1 (the first horizontal portions SP1-L are shown in FIG. 12B as being covered by the first touch insulation layer TS-IL1). Although not separately shown, the first touch insulation layer TS-IL1 may cover the first connection parts CP1 and the first touch signal lines SL1-1 to SL1-3. In one or more exemplary embodiments, the second display panel surface BS1-U is provided by the thin film encapsulation layer TFE. The second touch insulation layer TS-IL2 is disposed on the first touch insulation layer TS-IL1 to overlap with the display area DA and the non-display area NDA. The second touch insulation layer TS-IL2 provides the first base surface BS2.

Referring to FIGS. 13A to 13C, the second sensing parts SP2 are disposed on the first touch insulation layer TS-ILL The second sensing parts SP2 overlap the non-light emitting area NPXA. The second sensing parts SP2 include a plurality of second vertical portions SP2-C extending in the first direction DR1 and a plurality of second horizontal portions SP2-L extending in the second direction DR2. The plurality of second vertical portions SP2-C and the plurality of second horizontal portions SP2-L may be connected to each other to define a plurality of touch openings TS-OP. That is, the second sensing parts SP2 have a mesh shape. The second touch insulation layer TS-IL2 is disposed on the first touch insulation layer TS-IL1 to cover the second sensing parts SP2. As seen in FIG. 13B, the second vertical portions SP2-C are shown as being covered by the second touch insulation layer TS-IL2. Although not separately shown, the second touch insulation layer TS-IL2 may cover the second connection parts CP2 and the second touch signal lines SL2-1 to SL2-3.

FIG. 14 illustrates an overlapping portion of the conductive layers of FIGS. 11A and 11B. As illustrated in FIGS. 14A and 14B, the first connection part CP1 may include third vertical portions CP1-C1 and CP1-C2 disposed on the thin film encapsulation layer TFE and third horizontal portions CP1-L connecting the third vertical portions CP1-C1 and CP1-C2 to each other. Although two third vertical portions CP1-C1 and CP1-C2 are illustrated, exemplary embodiments are not limited thereto or thereby. The second connection parts CP2 may include fourth horizontal portions CP2-L1 and CP2-L2 disposed on the first touch insulation layer TS-IL1 and fourth vertical portions CP2-C connecting the fourth horizontal portions CP2-L1 and CP2-L2 to each other. The first connection parts CP1 may have a mesh shape, and the second connection parts CP2 may also have a mesh shape. Although two fourth horizontal portions CP2-L1 and CP2-L2 are illustrated, exemplary embodiments are not limited thereto or thereby.

As described above, since each of the first touch electrodes TE1-1 to TE1-3 and the second touch electrodes TE2-1 to TE2-3 has a mesh shape, and the plurality of touch openings are defined in the first and second insulation layers TS-IL1 and TS-IL2, the flexible display device DD may be improved in flexibility. When the flexible display device DD is bent, tension stress/compression stress applied to the first touch electrodes TE1-1 to TE1-3 and the second touch electrodes TE2-1 to TE2-3 may be reduced, which may prevent (or at least reduce) the potential of the touch electrodes from being cracked.

Figure 15A:
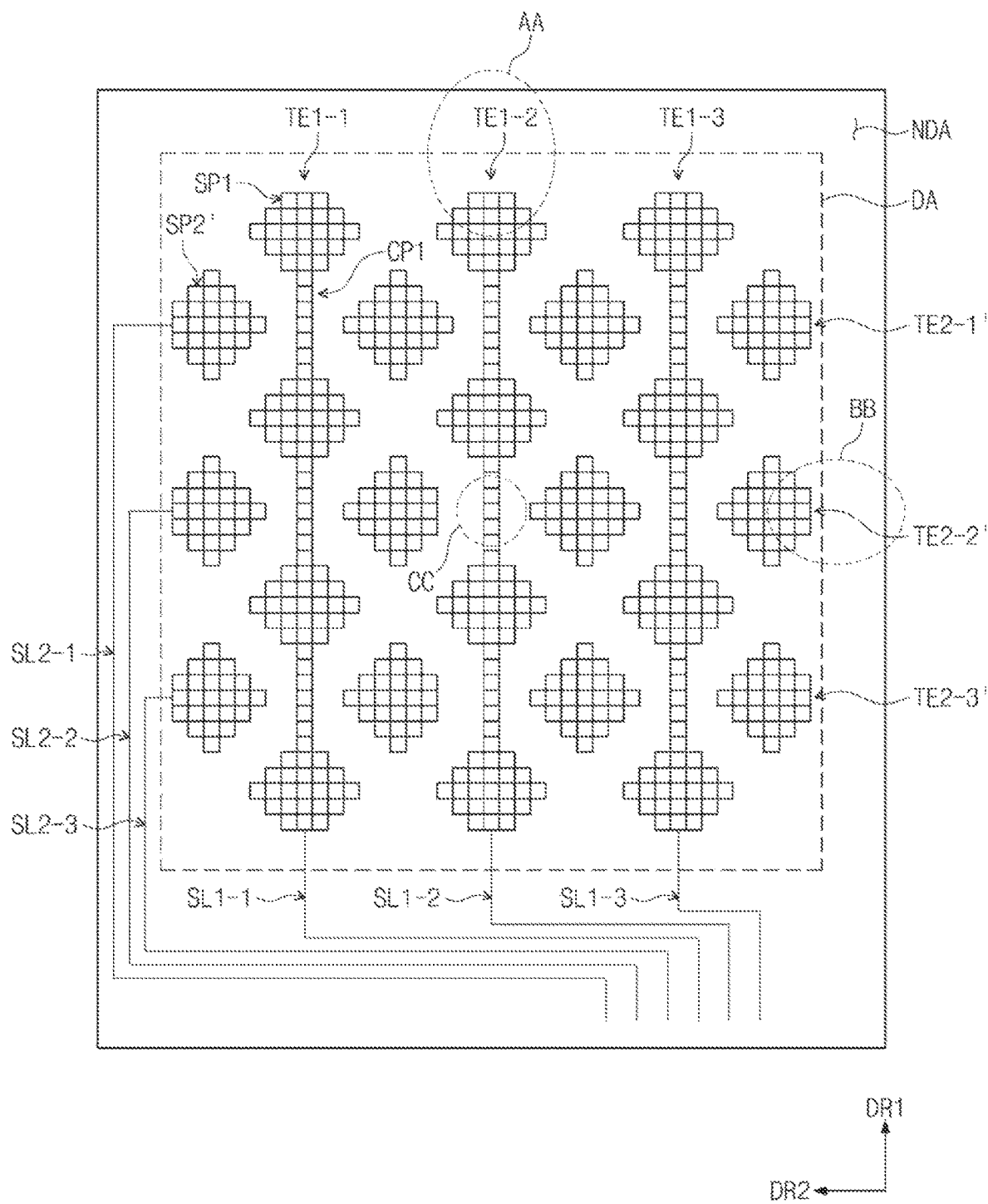
FIGS. 15A and 15B are plan views illustrating conductive layers of a touch detection member, according to one or more exemplary embodiments.
Figure 15B:
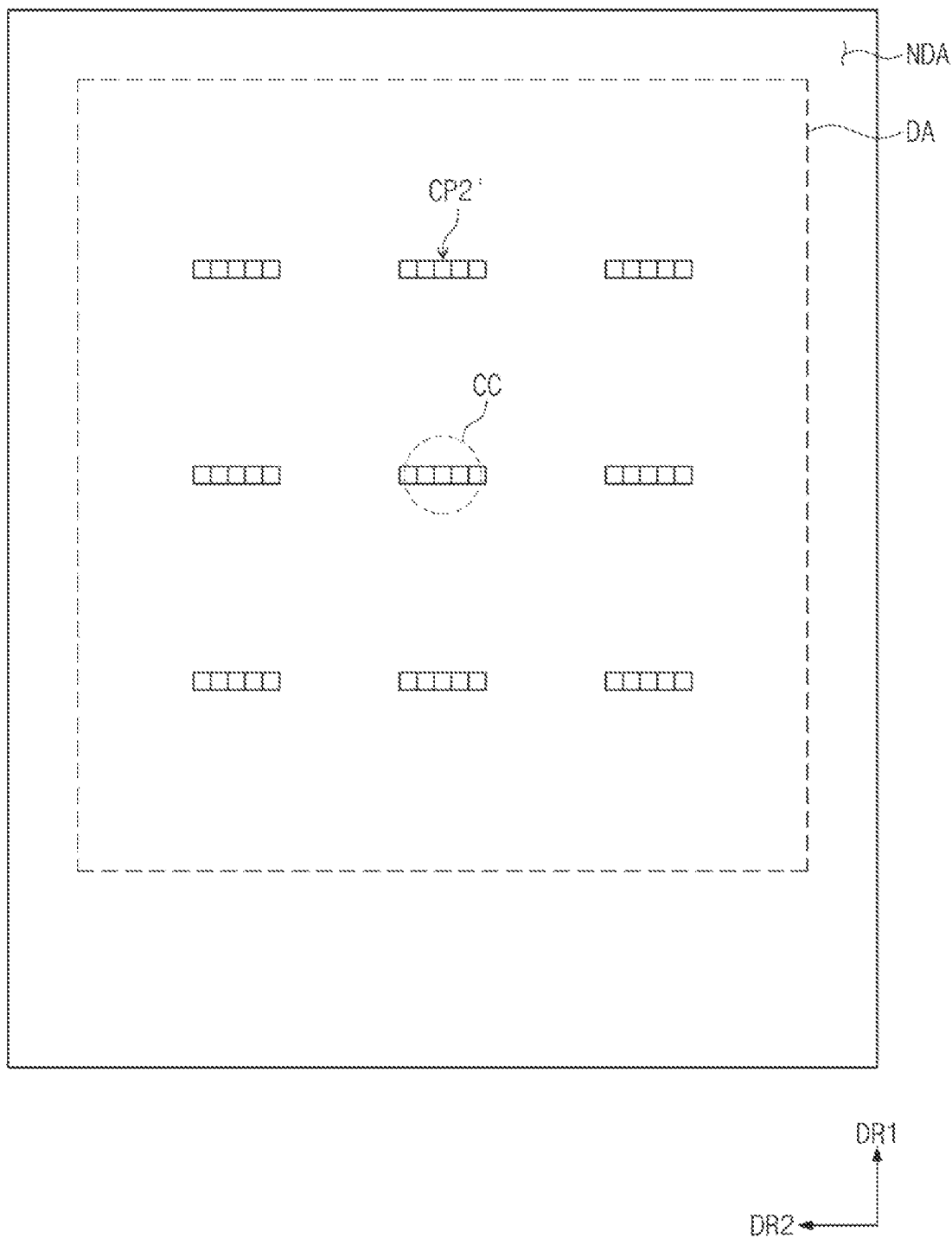
Figure 15C:
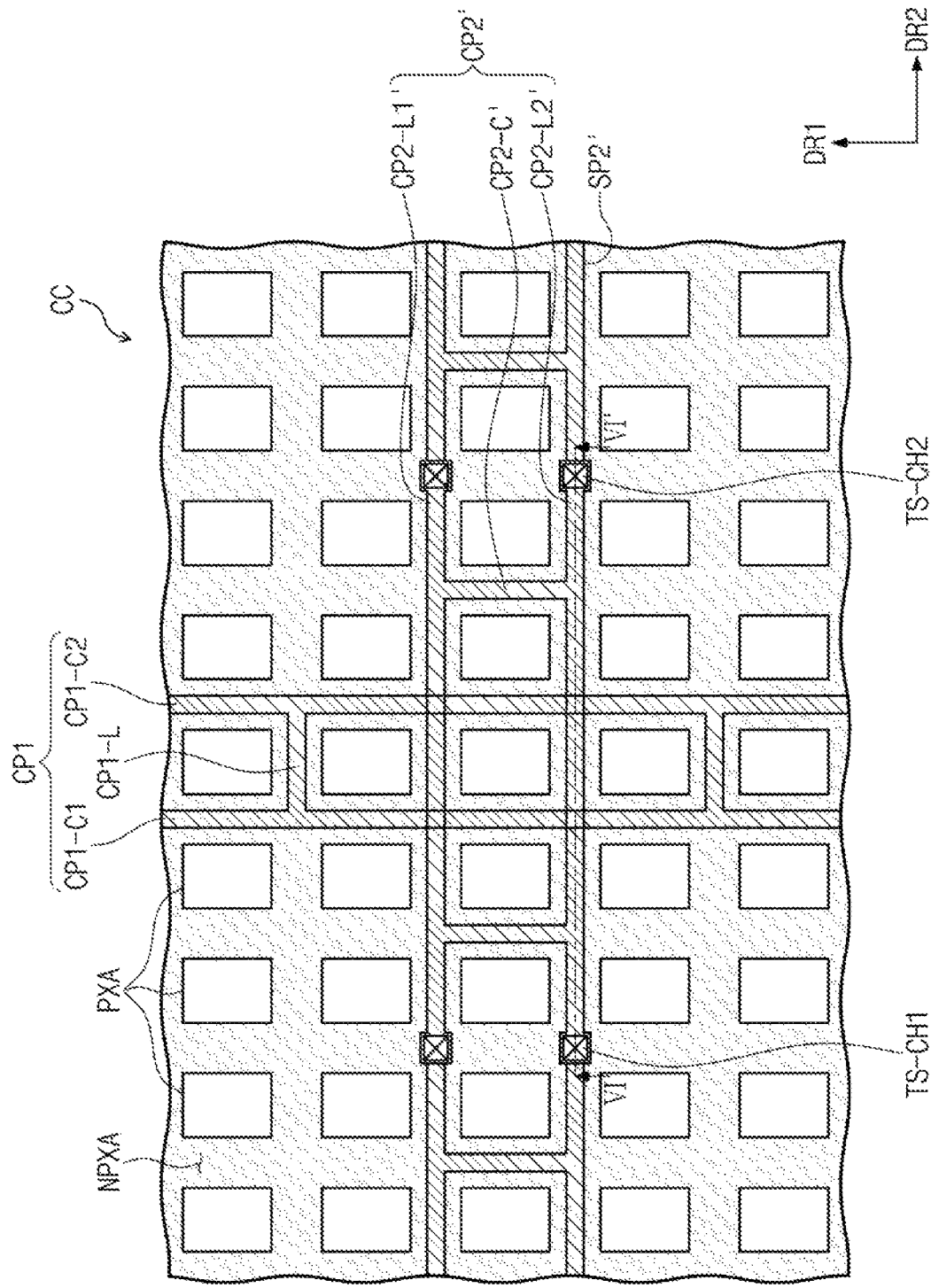
FIG. 15C is a partial enlarged view of area CC in FIG. 15B, according to one or more exemplary embodiments.
Figure 15D:
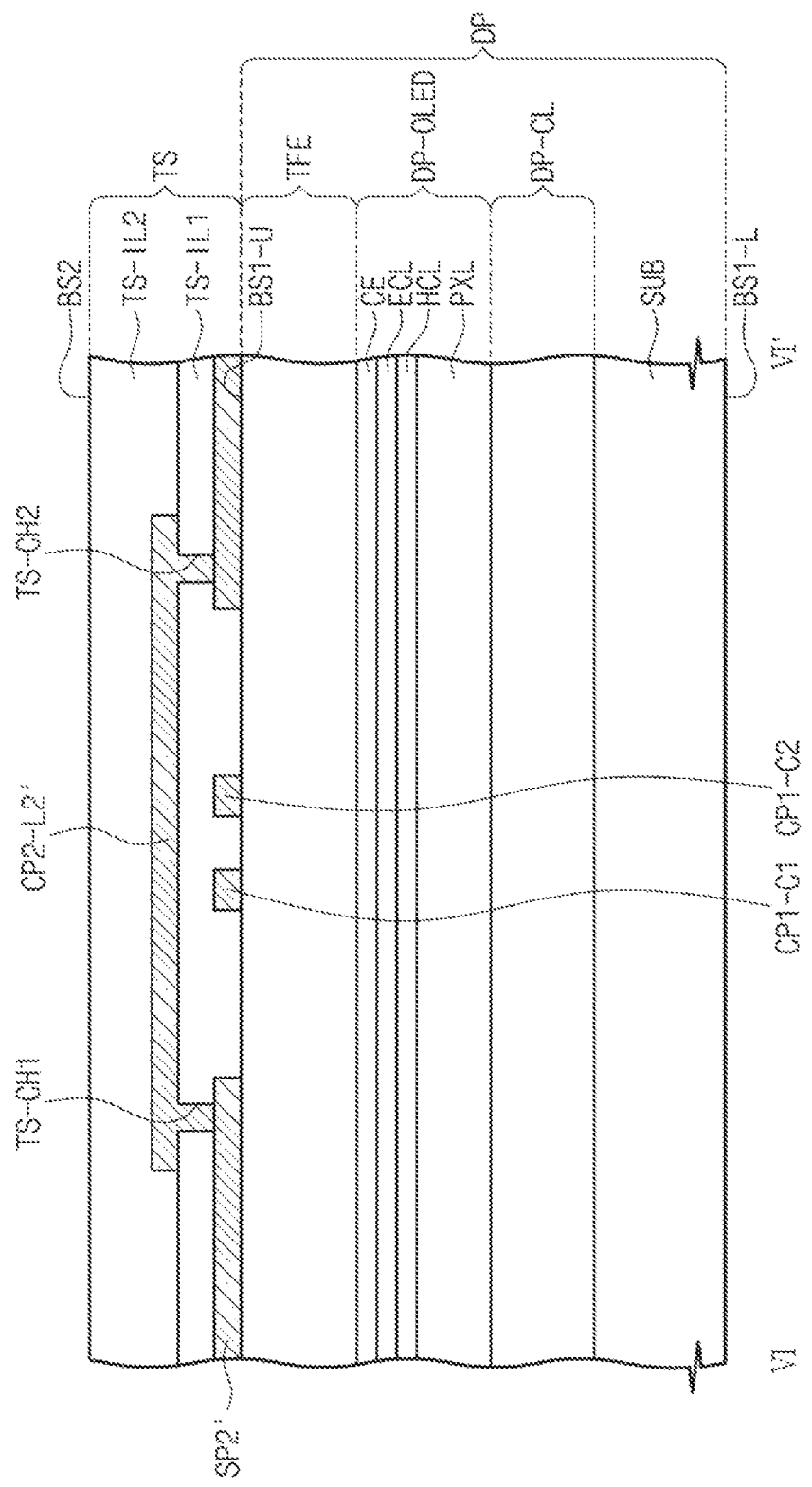
FIG. 15D is a partial cross-sectional view of FIG. 15C taken along sectional line VI-VI', according to one or more exemplary embodiments.

FIGS. 15A and 15B are plan views illustrating conductive layers of a touch detection member, according to one or more exemplary embodiments. FIG. 15C is a partial enlarged view of area CC in FIG. 15B, according to one or more exemplary embodiments. FIG. 15D is a partial cross-sectional view of FIG. 15C taken along sectional line VI-VI', according to one or more exemplary embodiments. It is noted that the circuit layer DP-CL is illustrated in FIG. 15D. Further, it is noted that the structures illustrated in FIGS. 15A to 15D are similar to the structures of FIGS. 11A, 11B, 14A, and 14B, and, as such, duplicative descriptions have been omitted to avoid obscuring exemplary embodiments described herein. In this manner, differences are primarily described below.

According to one or more exemplary embodiments, a single layer capacitive touch detection member is illustrated. The single layer capacitive touch detection member may be driven in a self-capacitance manner. It is contemplated, however, that exemplary embodiments are not limited to or by the driving manner to acquire the coordinate information associated with touch event detection. In one or more exemplary embodiments, the first conductive patterns of FIG. 15A may correspond to the first conductive layer TS-CL1 of FIGS. 10A to 10C, and the second conductive patterns of FIG. 15B may correspond to the second conductive layer TS-CL2 of FIGS. 10A to 10C. In one or more exemplary embodiments, the first conductive patterns of FIG. 15A may correspond to the second conductive layer TS-CL2 of FIGS. 10A to 10C, and the second conductive patterns of FIG. 15B may correspond to the first conductive layer TS-CL1 of FIGS. 10A to 10C.

As illustrated in FIG. 15A, the first conductive patterns may include first touch electrodes TE1-1 to TE1-3, first touch signal lines SL1-1 to SL1-3, second sensing parts SP2' of second touch electrodes TE2-1' to TE2-3', and second touch signal lines SL2-1 to SL2-3. Each of the first touch electrodes TE1-1 to TE1-3 includes a plurality of first sensing parts SP1 and a plurality of first connection parts CP1. As illustrated in FIG. 15B, the second conductive patterns may include a plurality of second connection parts CP2' of the second touch electrodes TE2-1' to TE2-3'. Each of the second connection parts CP2' may have a bridge function.

Referring to FIGS. 15C and 15D, the second connection parts CP2' electrically connect two second sensing parts SP2', which are adjacent to each other in the second direction DR2, of the second sensing parts SP2' through first and second through holes TS-CH1 and TS-CH2 passing through the first touch insulation layer TS-IL1. In one or more exemplary embodiments, the plane of the first touch insulation layer TS-IL1 may be changed in shape. The first touch insulation layer TS-IL1 may not cover the entire display area DA. For instance, the first touch insulation layer TS-IL1 may only overlap the plurality of second connection parts CP2' of FIG. 15B. Also, the first touch insulation layer TS-IL1 may include a plurality of insulation patterns disposed to correspond to the plurality of second connection parts CP2'.

The conductive patterns of the touch detection member TS, according to one or more exemplary embodiments, are illustrated in FIGS. 11A to 15D. The exemplary embodiments of the touch detection member TS are not limited to or by the constituents of the touch detection member TS illustrated in FIGS. 11A to 15D. For instance, the touch detection member TS may further include a noise shield pattern for reducing noise and dummy patterns for improving optical balance.

FIGS. 16A, 16B, 16C, 16D, 16E, 16F, and 16G are cross-sectional views of display devices, according to one or more exemplary embodiments. It is noted that the display member DM, the second adhesion member AM2, and the window member WM of the various constituents of the display devices are illustrated. The display devices of FIGS. 16A to 16G are similar to the display devices of FIGS. 1A to 15D, and, as such, duplicative descriptions will be omitted to avoid obscuring exemplary embodiments described herein. In this manner, primarily differences will be described below.

Figure 16A:
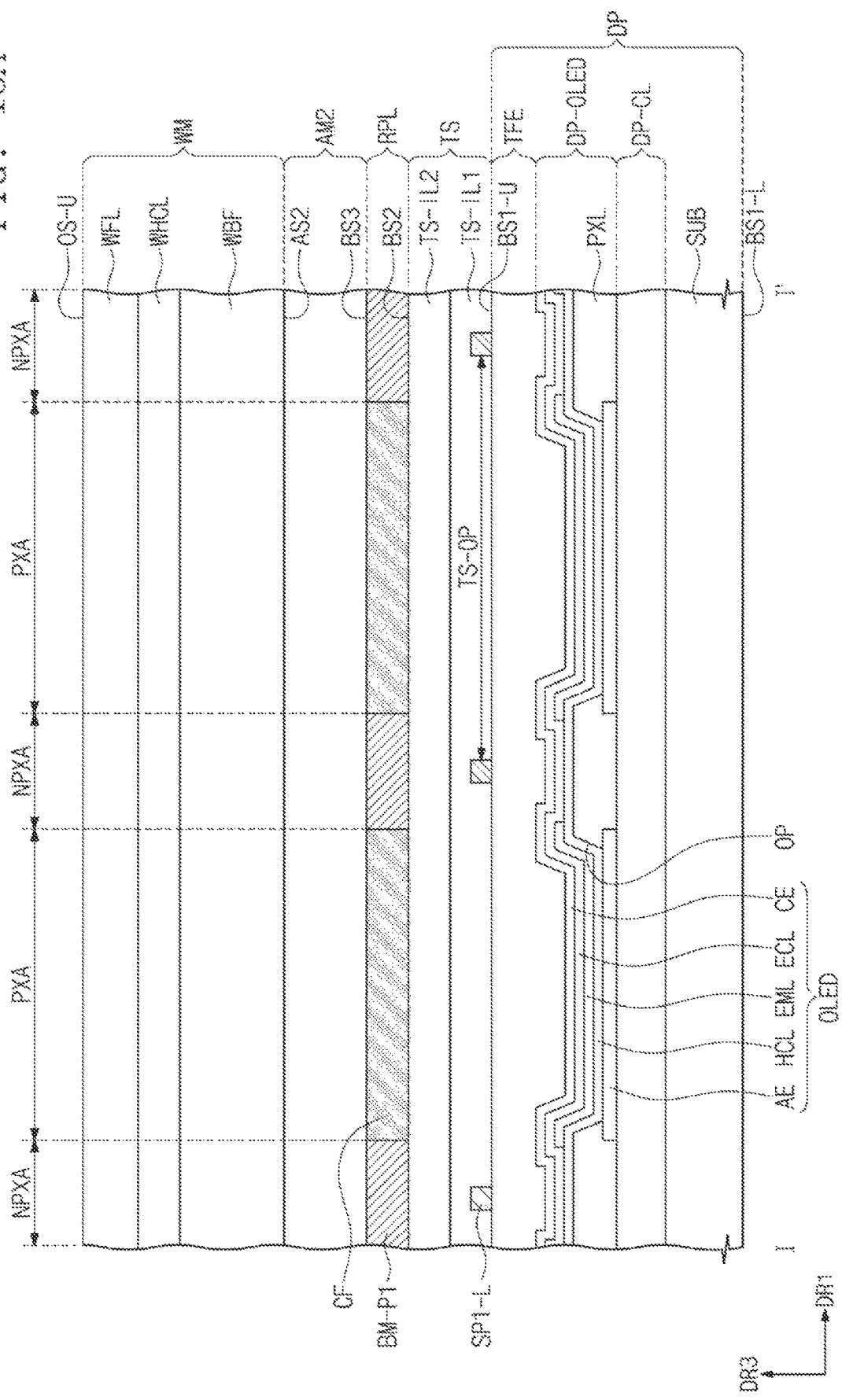
Figure 16B:
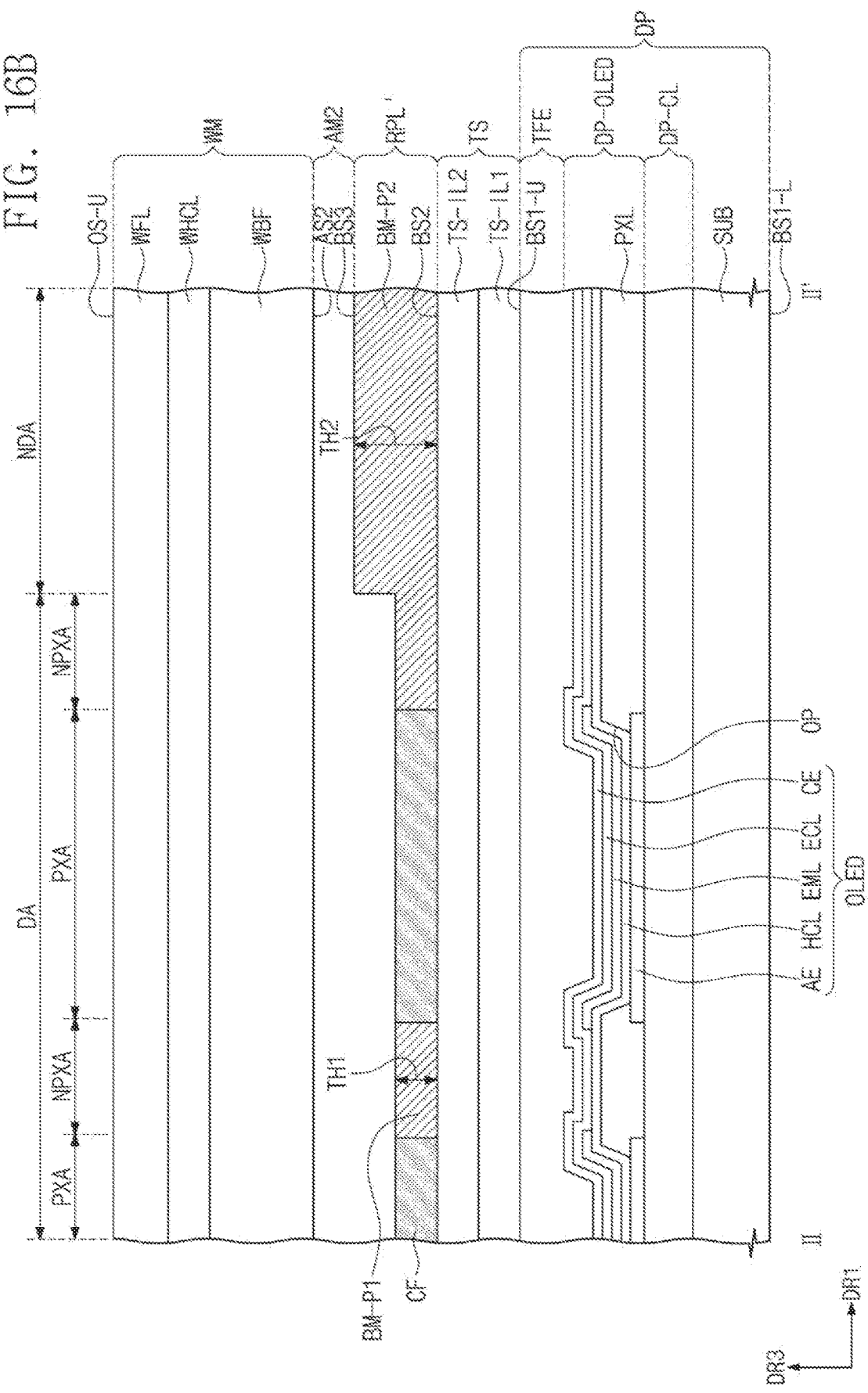

FIGS. 16A and 16B are cross-sectional views respectively taken along sectional lines I-I' of FIG. 12A and sectional line II-IF of FIG. 12C. The reflection prevention layer RPL is disposed on the first base surface BS2. The reflection prevention layer RPL includes black matrixes BM-P1 and BM-P2 and color filters CF. The black matrixes BM-P1 and BM-P2 overlap with the non-light emitting area NPXA and the non-display area NDA, and the color filters CF respectively overlap with the light emitting areas PXA. The black matrixes BM-P1 and BM-P2 and the color filters CF may define a second base surface BS3.

In one or more exemplary embodiments, the color filters CF may include plural groups of color filters. For example, the color filters CF may include red color filters, green color filters, and blue color filters. The color filters CF may include a gray filter. It is contemplated, however, that any suitable color for a color filter CF may be utilized in association with exemplary embodiments described herein.

The black matrixes BM-P1 and BM-P2 may be formed of a material that is capable of blocking light. The black matrixes BM-P1 and BM-P2 may prevent light emitted from the organic light emitting devices OLED from being mixed with each other and absorb light (hereinafter, referred to as external light) incident from the outside. For example, each of the black matrixes BM-P1 and BM-P2 may be formed of an organic material having relatively high light absorption. Each of the black matrixes BM-P1 and BM-P2 may include a black pigment or a black dye. Each of the black matrixes BM-P1 and BM-P2 may include a photosensitive organic material, e.g., a coloring, such as a pigment or a dye. Each of the black matrixes BM-P1 and BM-P2 may have a single or multi-layer structure.

The color filters CF may transmit light emitted from the organic light emitting devices OLED and reduce a reflective index of the external light. The external light may pass through the color filters CF, and, as such, may be reduced in intensity by about ⅓. A portion of light passing through the color filters CF may be dissipated, and a portion of the light that is reflected by the constituents of the display device disposed under the color filters CF, e.g., the organic light emitting device layer DP-OLED and the thin film encapsulation layer TFE. The reflected light may be incident again into the color filters CF. The reflected light is reduced in brightness (or intensity) while passing through the color filters CF. In this manner, only a portion of the external light may be reflected from the display device. That is, the external light is reduced in reflectance.

The black matrixes BM-P1 and BM-P2 include a light shield portion BM-P1 overlapping with the non-light emitting area NPXA and a bezel portion BM-P2 overlapping with the non-display area NDA. The light shield portion BM-P1 has a first thickness TH1, and the bezel portion BM-P2 has a second thickness TH2 greater than the first thickness TH1. The bezel portion BM-P2 has a light shield efficiency greater than that of the light shield portion BM-P1. The light shield portion BM-P1 may only to have a thickness that is enough to prevent colors of light generated from the light emitting areas PXA from being mixed with each other. The bezel portion BM-P2, however, may have a higher light shield ratio so that the first touch signal lines SL1-1 to SL1-3 (see FIG. 11A) and the second touch signal lines SL2-1 to SL2-3 (see FIG. 11B) are not recognized (or otherwise perceived) by a user. In this manner, the bezel portion BM-P2 may have a thickness greater than that of the light shield portion BM-P1.

According to one or more exemplary embodiments, the light shield portion BM-P1 and the bezel portion BM-P2 may be integrated with each other. A pre-black matrix layer may be formed on the first base surface BS2 and patterned to remove areas in which the color filters CF will be formed, as well as partially removed in an area in which the light shield portion BM-P1 will be formed versus the bezel portion BM-P2. The pre-black matrix layer may be gradually reduced in thickness according to various areas to form an integrated black matrix having thicknesses different from each other in the various areas. It is contemplated, however, that exemplary embodiments are not limited thereto or thereby. For example, the light shield portion BM-P1 and the bezel portion BM-P2 may have the same thickness as each other.

The second adhesion member AM2 is disposed directly on the second base surface BS3. The second adhesion member AM2 is coupled to the second base surface BS3 through the second adhesion surface AS2.

The window member WM includes a base film WBF, a hard coating layer WHCL, and a functional coating layer HFL. In one or more exemplary embodiments, the base film WBF may be coupled to the second adhesion surface AS2 of the second adhesion member AM2. The base film WBF may be a plastic film formed of at least one of a polyimide-based resin, an acrylic-based resin, a methacrylic-based resin, a polyisoprene-based resin, a vinyl-based resin, an epoxy-based resin, a urethane-based resin, a cellulose-based resin, and a perylene-based resin. A material forming the base film WBF is not limited to plastic resins. For example, the base film WBF may be formed of an organic/inorganic composite material. The base film WBF may include a porous organic layer and an inorganic material that is filled into pores of the organic layer.

The hard coating layer WHCL increases hardness of the window member WM. The hard coating layer WHCL may include a silicon-based polymer. It is contemplated, however, that exemplary embodiments are not limited to or by the material for the hard coating layer, but may include any suitable hard coating material. Although not shown, the function coating layer HFL may include a fingerprint layer, a reflection prevention layer, and a self-restoring layer. In one or more exemplary embodiments, one of the hard coating layer WHCL and the functional coating layer HFL may be omitted or provided in plurality. It is also contemplated that the base film WBF, the hard coating layer WHCL, and the functional coating layer HFL may be changed in stacking order.

According to one or more exemplary embodiments, each of the hard coating layer WHCL and the functional coating layer HFL may be formed on the base film WBF in a coating or printing manner. It is also contemplated that each of the hard coating layer WHCL and the functional coating layer HFL may be formed through roll coating, silkscreen coating, spray coating, and/or slit coating.

Figure 16D:
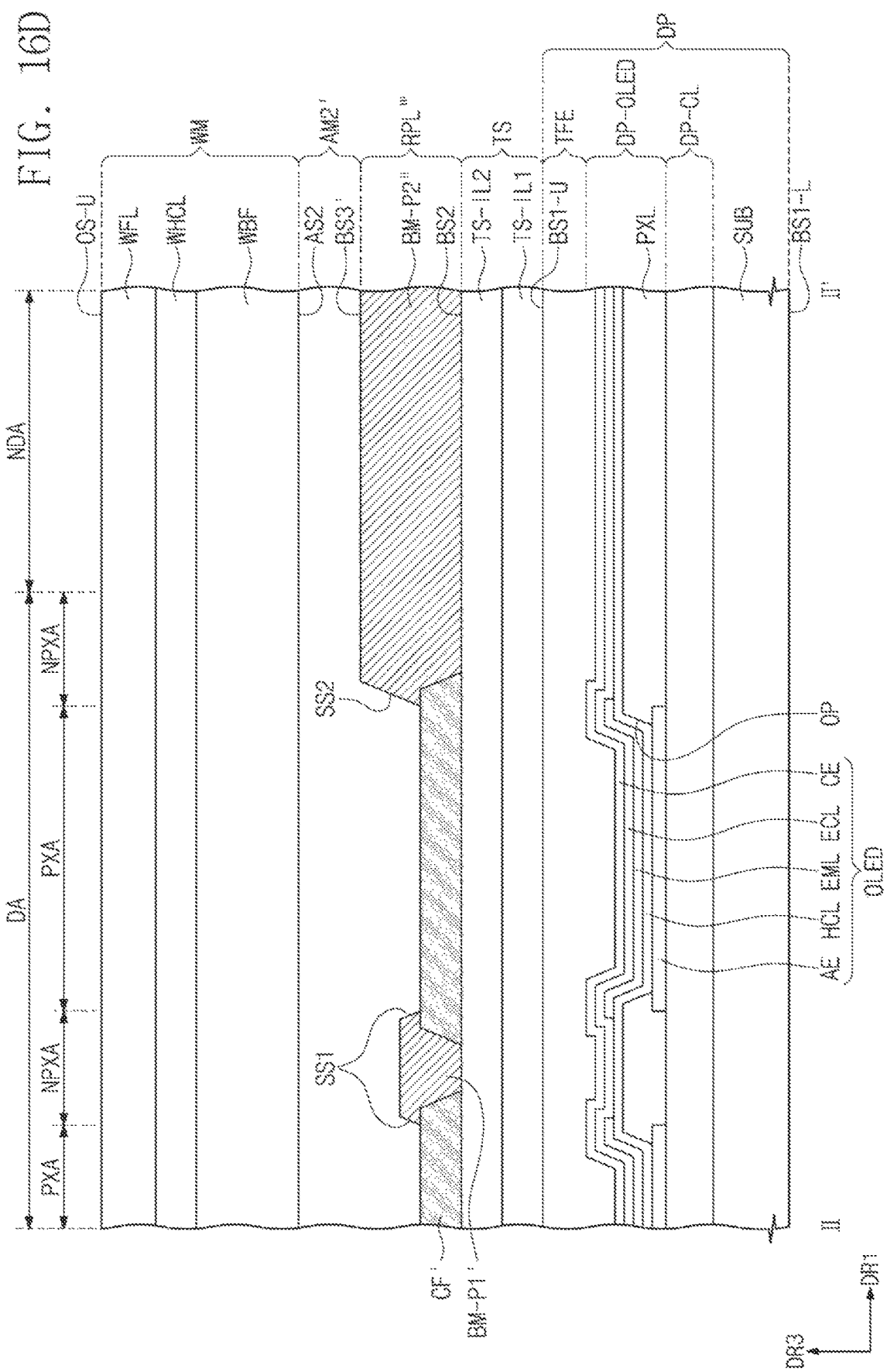
Figure 10E:
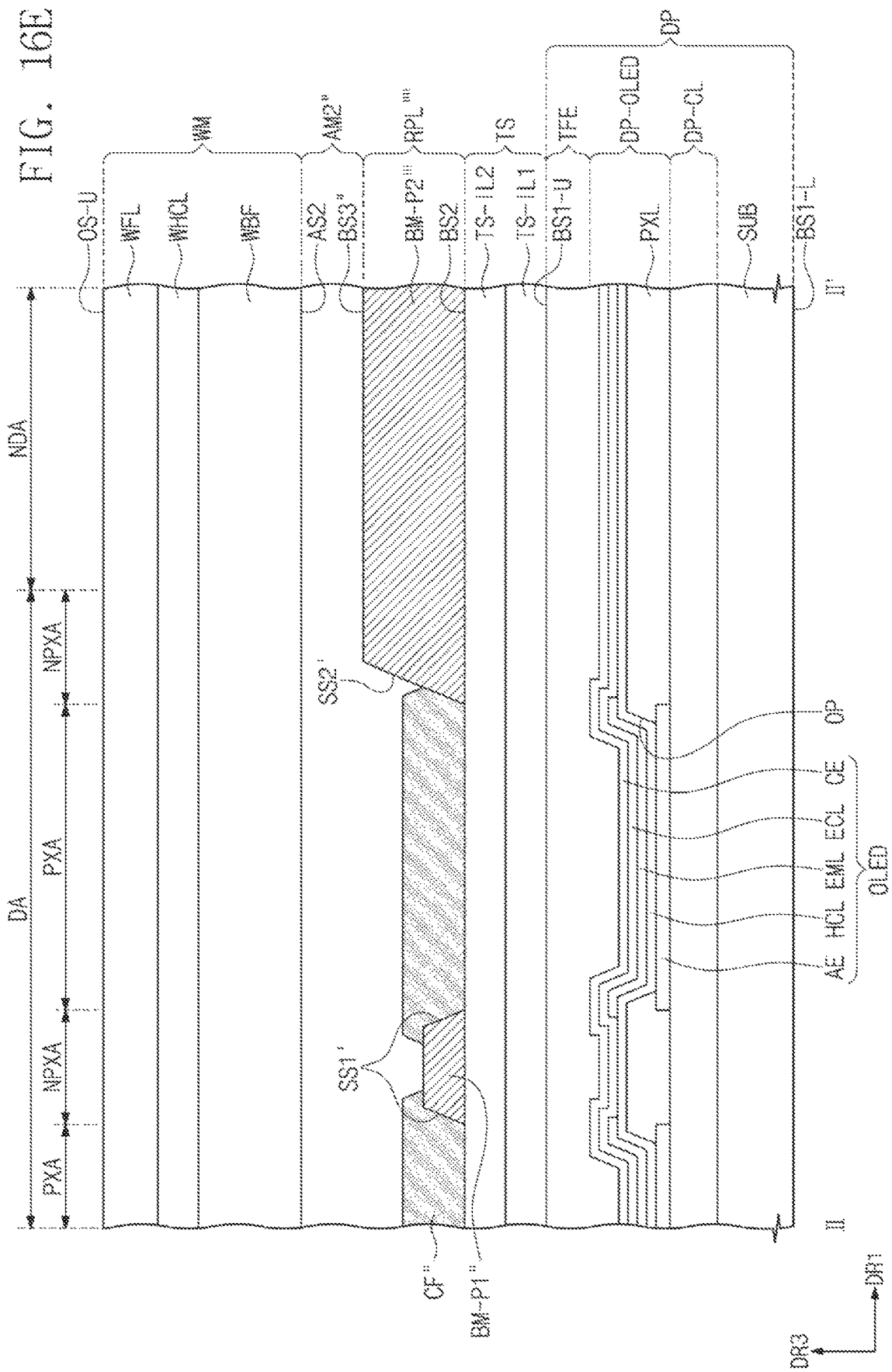

FIGS. 16C to 16E are cross-sectional views taken along sectional line II-IF of FIG. 12A, according to one or more exemplary embodiments. The display devices of FIGS. 16C to 16E are similar to the display devices of FIGS. 16A to 16B, and, as such, duplicative descriptions will be omitted to avoid obscuring exemplary embodiments described herein. In this manner, primarily differences will be described below. For instance, differences between the reflection prevention layers of FIGS. 16C to 16E and the reflection prevention layer of FIGS. 16A and 16B will be mainly described.

As illustrated in FIG. 16C, the bezel portion BM-P2' may include a plurality of layers. FIG. 16C illustrates an example of the bezel portion BM-P2' having a three-layer structure. The lowermost layer of the plurality of layers may have a shape that is integrated with the light shield portion BM-P1. The first preliminary layer may be formed and then patterned to form a first layer (the lowermost layer). A second preliminary layer and a third preliminary layer may be formed and then patterned to successively form a second layer and a third layer. The first to third preliminary layers may be successively formed and then differently patterned according to the areas to form the bezel portion BM-P2' having the three-layer structure and the light shield portion BM-P1 having the single-layer structure.

According to one or more exemplary embodiments, the first to third layers may be formed of the same material or materials different from each other. The first layer may include a black pigment or black dye, and each of the second and third layers may include a colored pigment or dye having a color different from the black color. The second and third layer may include a pigment or dye having the same color as one another. The second layer may be a decoration layer that provides a geometric pattern, such as a hair line or a weaving pattern. The decoration layer may increase the aesthetic appeal of the display device. The third layer may be an optical layer capable of adjusting reflectance or a reflection wavelength of the external light.

Referring to FIG. 16D, the black matrixes BM-P1' and BM-P2" overlap with a non-light emitting area NPXA, and color filters CF' respectively overlap with light emitting areas PXA. The color filters CF' may partially overlap with the non-light emitting area NPXA. The color filters CF' may be disposed on the first base surface BS2, and, then, the black matrixes BM-P1' and BM-P2" may be formed. The color filters CF' and the black matrixes BM-P1' and BM-P2" may be formed through a photolithographic process. Each of the black matrixes BM-P1' and BM-P2" may have a height greater than that of each of the color filters CF'.

Adverting to FIG. 16E, the black matrixes BM-P1" and BM-P2'" overlap with a non-light emitting area NPXA, and color filters CF'" respectively overlap with light emitting areas PXA. The color filters CF'" may partially overlap with the non-light emitting area NPXA. The black matrixes BM-P1" and BM-P2'" may be disposed on the first base surface BS2, and, then, the color filters CF'" may be formed. Each of the color filters CF'" may have a height greater than that of each of the black matrixes BM-P1" and BM-P2'".

As illustrated in FIGS. 16D and 16E, each of the light shield portions BM-P1' and BM-P1" and the bezel portions BM-P2" and BM-P2'" may have an inclined side surface. The light shield portions BM-P1' and BM-P1" include first side surfaces SS1 and SS1' facing each other in the first direction DR1. The bezel portions BM-P2" and BM-P2'" include inclined second side surfaces SS2 and SS2'. Since the black matrix is directly formed on the second base surface BS2 through photolithographic processes, the side surfaces SS1, SS1', SS2, and SS2" may be inclined. The side surfaces SS1, SS1', SS2, and SS2' may be changed in shape according to the manufacturing order of the black matrixes BM-P1', BM-P1", BM-P2", and BM-P2'" and the color filters CF' and CF'".

As illustrated in FIG. 16D, portions of the side surfaces SS1 and SS2, which are exposed from the color filters CF', may be inclined. Unlike the drawings, the inclinations of the exposed portions of the side surfaces SS1 and SS2 may be different from each other. Referring to FIG. 16E, the side surfaces SS1' and SS2' may have the same inclination as a whole. It is noted, however, that although the side surfaces SS1' and SS2' are shown with a uniform inclination, this is a merely an example. In one or more exemplary embodiments, the inclinations of the side surfaces SS1' and SS2' may be different from each other.

As illustrated in FIGS. 16D and 16E, a bottom surface (a surface contacting the second touch insulation layer TS-IL2) of each of the light shield portions BM-P1' and BM-P1" and the bezel portions BM-P2" and BM-P2'" may have a width greater than that of a top surface (the other surface opposing the surface contacting the second touch insulation layer TS-IL2) thereof. The width is measured in the first direction DR1.

Figure 16F:
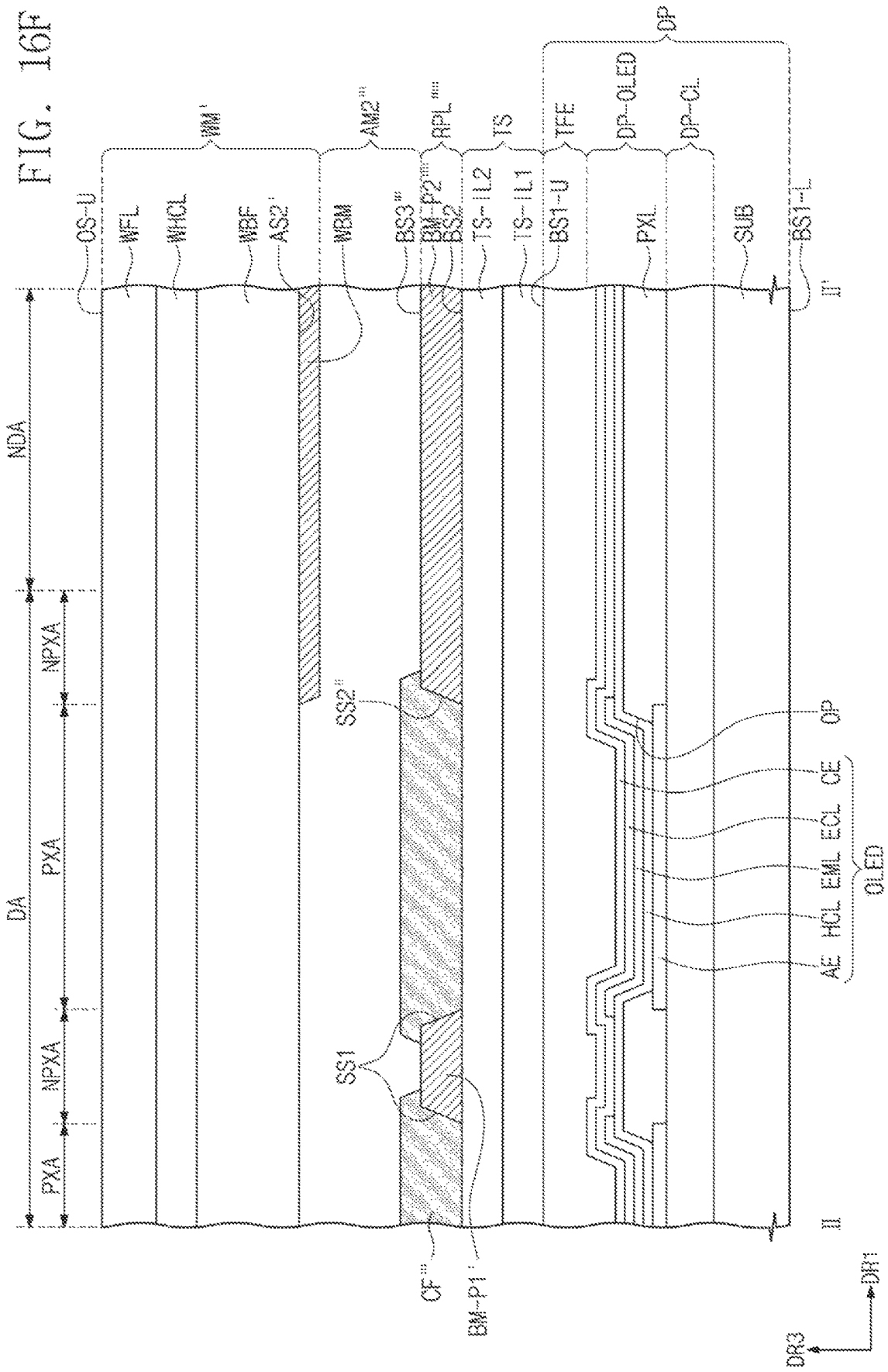

FIGS. 16F and 16G are cross-sectional views taken along sectional line II-IF of FIG. 12A, according to one or more exemplary embodiments. The display devices of FIGS. 16F and 16G are similar to the display devices of FIGS. 16A to 16E, and, as such, duplicative descriptions will be omitted to avoid obscuring exemplary embodiments described herein. In this manner, primarily differences will be described below. For instance, differences between the window members and the reflection prevention layers of FIGS. 16F and 16G and the window member and reflection prevention layer of FIGS. 16A to 16E will be mainly described.

As illustrated in FIG. 16F, the light shield portion BM-P1' and the bezel portion BM-P2'" have the same thickness as one another. The window member WM' may further include an edge black matrix WBM disposed directly on the second adhesion surface AS2'. The edge black matrix WBM may overlap the non-display area NDA. The edge black matrix WBM may supplement the bezel portion BM-P2''' to reduce reflectance of the external light on the non-display area NDA.

Referring to FIG. 16G, the bezel portion BM-P2 may be omitted. Here, the edge black matrix WBM' may have a greater thickness than in FIG. 16F. It is contemplated, however, that exemplary embodiments are not limited to or by the layer structure and shape of the edge black matrix WBM'. For example, the edge matrix WBM' may have the same layer structure and shape as those of the bezel portions described with reference to FIGS. 16A to 16E.

Figure 17A:
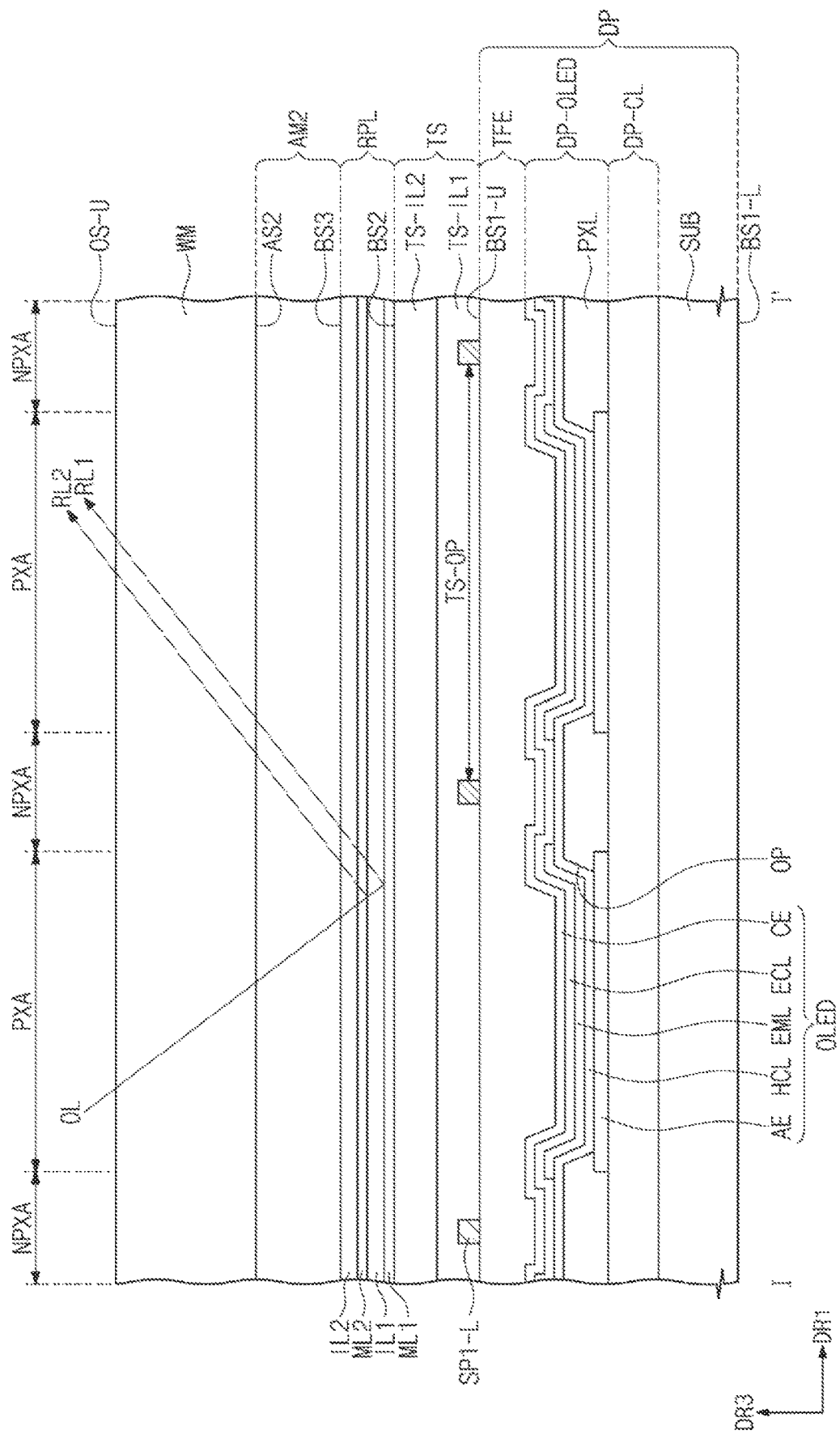
FIGS. 17A, 17B, 17C, and 17D are cross-sectional views of display devices, according to one or more exemplary embodiments.
Figure 17B:
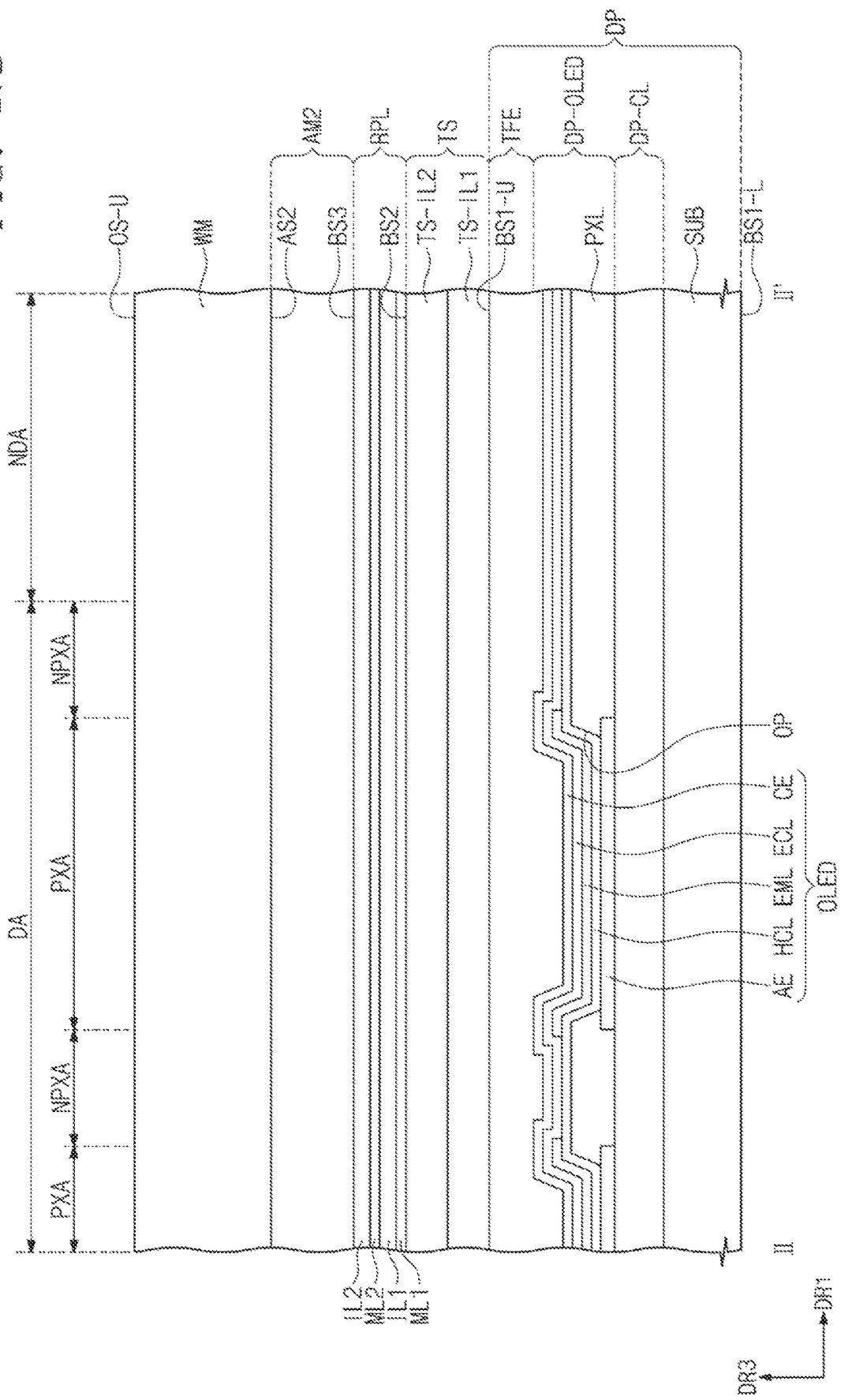
Figure 17C:
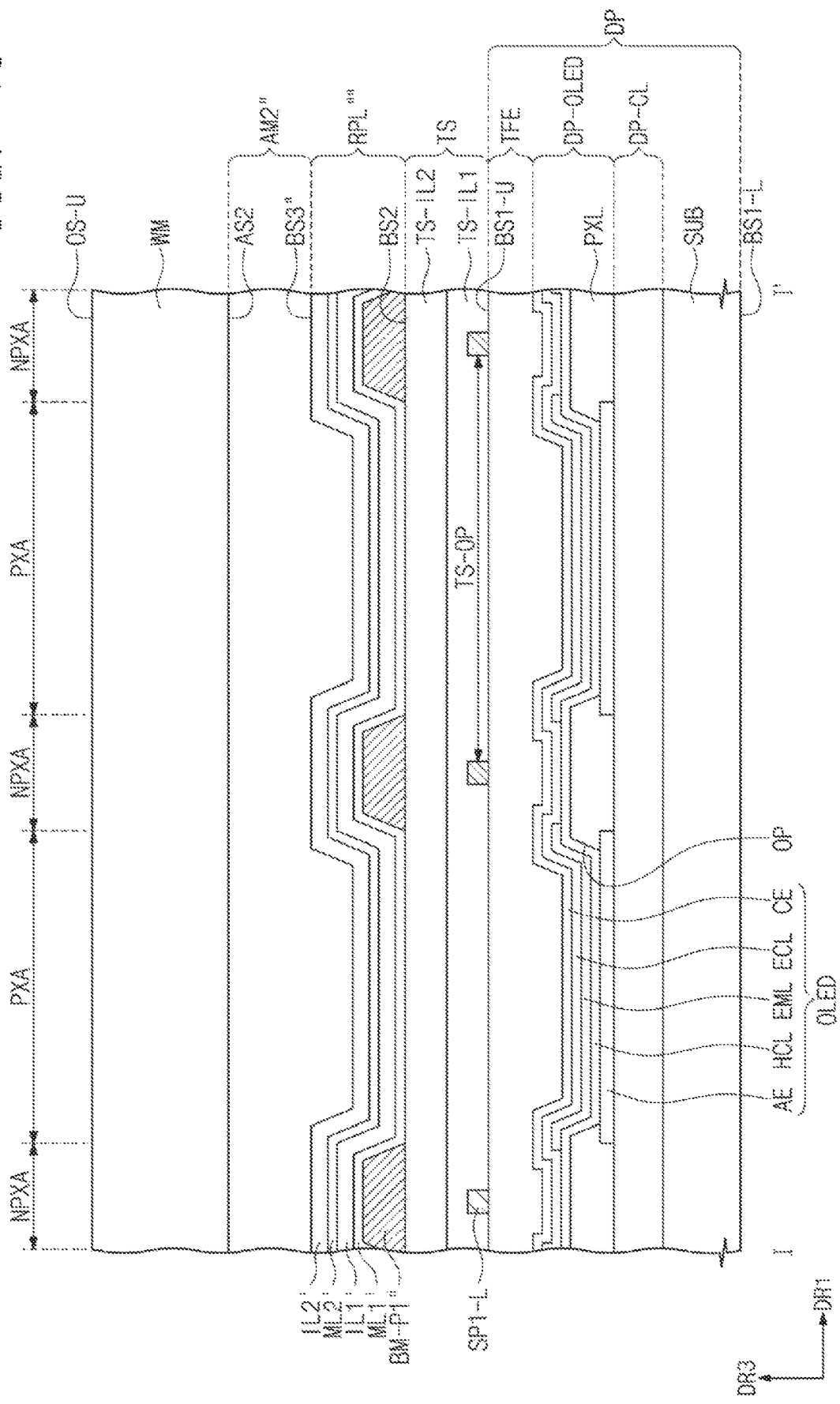
Figure 17D:
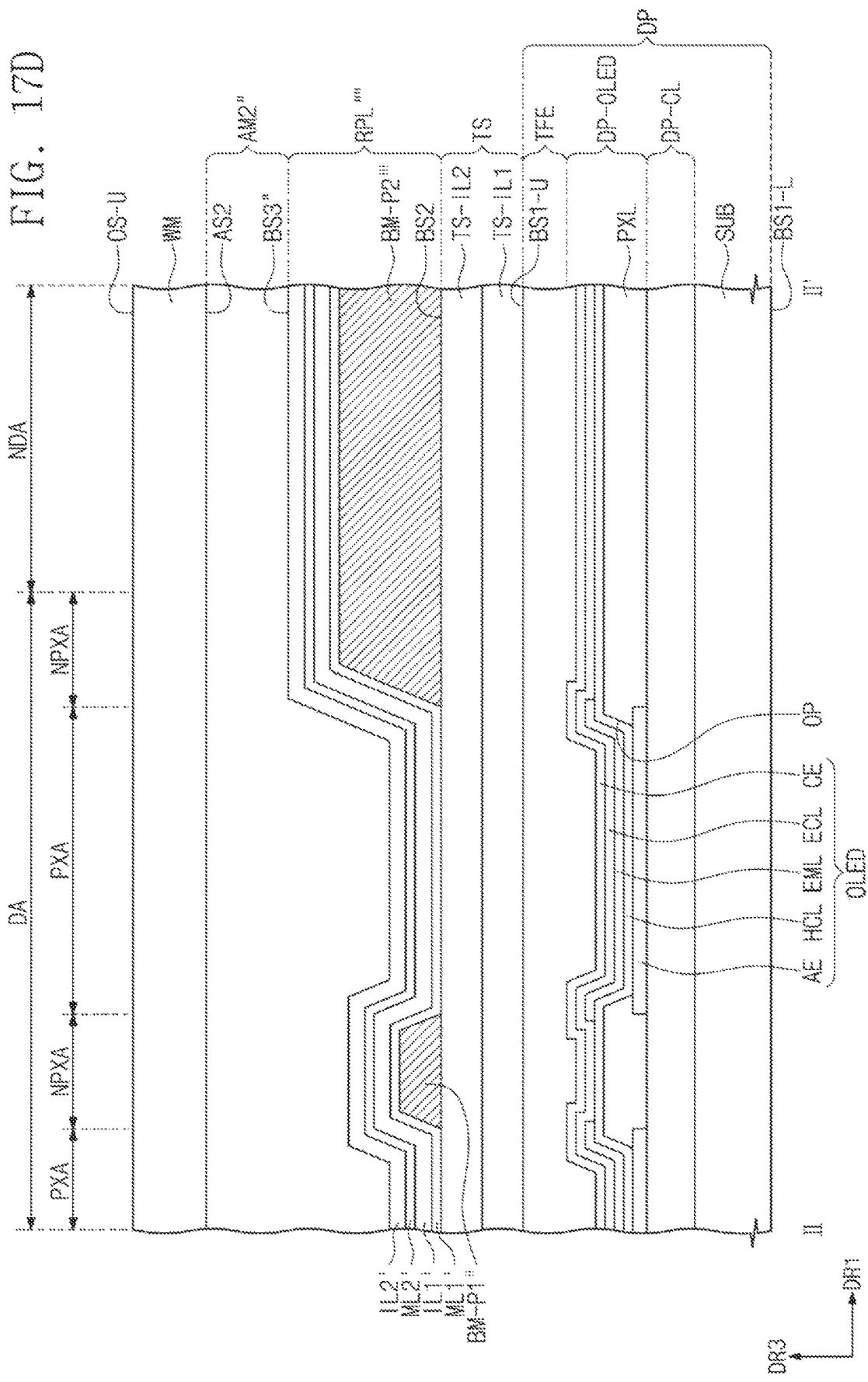

FIGS. 17A to 17D are cross-sectional views of display devices, according to one or more exemplary embodiments. The display devices of FIGS. 17A to 17D are similar to the display devices of FIGS. 1A to 16G, and, as such, duplicative descriptions will be omitted to avoid obscuring exemplary embodiments described herein. In this manner, primarily differences will be described below. It is noted that FIGS. 17A and 17C are cross-sectional views taken along sectional line I-I' of FIG. 12A, whereas FIGS. 17B and 17D are cross-sectional views taken along sectional line II-IF of FIG. 12A. The display member DM, the second adhesion member AM2, and the window member WM of the various constituents of the display devices are illustrated. For illustrative and descriptive convenience, the window member WM is illustrated as a single layer.

As illustrated in FIGS. 17A and 17B, the reflection prevention layer RPL may include first and second metal-containing layers ML1 and ML2, each of which respectively overlaps with the display area DA and the non-display area NDA, and first and second dielectric layers IL1 and IL2, each of which respectively overlaps with the display area DA and the non-display area NDA. The reflection prevention layer RPL including first and second metal-containing layers ML1 and ML2 and first and second dielectric layers IL1 and IL2 are illustrated as merely an example. It is contemplated that any suitable number of metal-containing layers and any suitable number of dielectric layers may be utilized in association with exemplary embodiments described herein.

According to one or more exemplary embodiments, the first and second metal-containing layers ML1 and ML2 and the first and second dielectric layers IL1 and IL2 are alternately stacked with respect to each other. Exemplary embodiments, however, are not limited to the illustrated stacking order. The first metal-containing layer ML1 may include a metal having an absorption rate of about 30% or more. The first metal-containing layer ML1 may be formed of a material having a refractive index of about 1.5 to about 7, and an absorption coefficient k of about 1.5 to about 7. The first metal-containing layer ML1 may be formed of at least one of chrome (Cr), molybdenum (Mo), tungsten (W), titanium (Ti), nickel (Ni), cobalt (Co), copper oxide (CuO), nitrided titanium (TiNx), and nickel sulfide (NiS). The first metal-containing layer ML1 may be a metal layer formed of one or more of the aforementioned materials, as may the second metal-containing layer ML2.

In one or more exemplary embodiments, each of the first dielectric layer IL1 and the second dielectric layer IL2 may be formed of one selected from the group consisting of silicon dioxide ($SiO_2$), titanium dioxide ($TiO_2$), lithium fluoride (LiF), calcium fluoride ($CaF_2$), magnesium fluoride ($MaF_2$), silicon nitride ($SiN_x$), tantalum oxide ($Ta_2O_5$), niobium oxide ($Nb_2O_5$), silicon carbon nitride (SiCN), molybdenum oxide ($MoOx$), iron oxide ($FeO_x$), and chromium oxide ($CrO_x$). Light OL incident from the outside is partially reflected by the first metal-containing layer ML1 (hereinafter, referred to as first reflected light RL1) and the second metal-containing layer ML2 (hereinafter, referred to as second reflected light RL2).

The first dielectric layer IL1 may adjust a phase of light passing through the first dielectric layer IL1 so that the first reflected layer RL1 and the second reflected light RL2 have a phase difference of about 180° therebetween. In this manner, the first reflected light RL1 and the second reflected light RL2 may be destructively combined. As such, the first metal-containing layer ML1, the second metal-containing layer ML2, the first dielectric layer Ill, and the second dielectric layer IL2 may be selected in thickness and material to satisfy conditions for destructive interference between the first reflected light RL1 and the second reflected light RL2. Exemplary embodiments, however, are not limited thereto or thereby.

As illustrated in FIGS. 17C and 17D, the reflection prevention layer RPL'''' may further include black matrixes BM-P1'' and BM-P2'''. Although the black matrix having the same shape as each of the black matrixes BM-P1'' and BM-P2''' described with reference to FIG. 16E is illustrated, exemplary embodiments are not limited to the shape, thickness, and/or stacked structure of each of the black matrixes BM-P1'' and BM-P2'''. It is noted, however, that the shape and configuration of the first and second metal layers ML1' and ML2' and the shape and configuration of the first and second dielectric layer IL1' and IL2' may be configured based on the configuration of the black matrixes BM-P1'' and BM-P2'''. Although not separately shown, the window member and the black matrixes of FIGS. 17C and 17D may be formed in shape and configuration as illustrated in FIGS. 16F and 16G.

FIGS. 18A to 18F are cross-sectional views of display devices of FIG. 12A taken along sectional line I-I', according to one or more exemplary embodiments. The display devices of FIGS. 18A to 18F are similar to the display devices of FIGS. 1A to 17D, and, as such, duplicative descriptions will be omitted to avoid obscuring exemplary embodiments described herein. In this manner, primarily differences will be described below. It is noted that the display member DM, the second adhesion member AM2, and the window member WM of the various constituents of the display devices are illustrated. For illustrative and descriptive convenience, the window member WM is illustrated as a single layer.

According to one or more exemplary embodiments, the display devices illustrated in FIGS. 18A to 18F may be examples of the display device of FIG. 4C. The touch sensing layer TS-R may detect an external input and reduce the reflection of the external light. As described below, these features are achieved, at least in part, by the touch sensing layer TS-R including color filters.

Figure 18A:
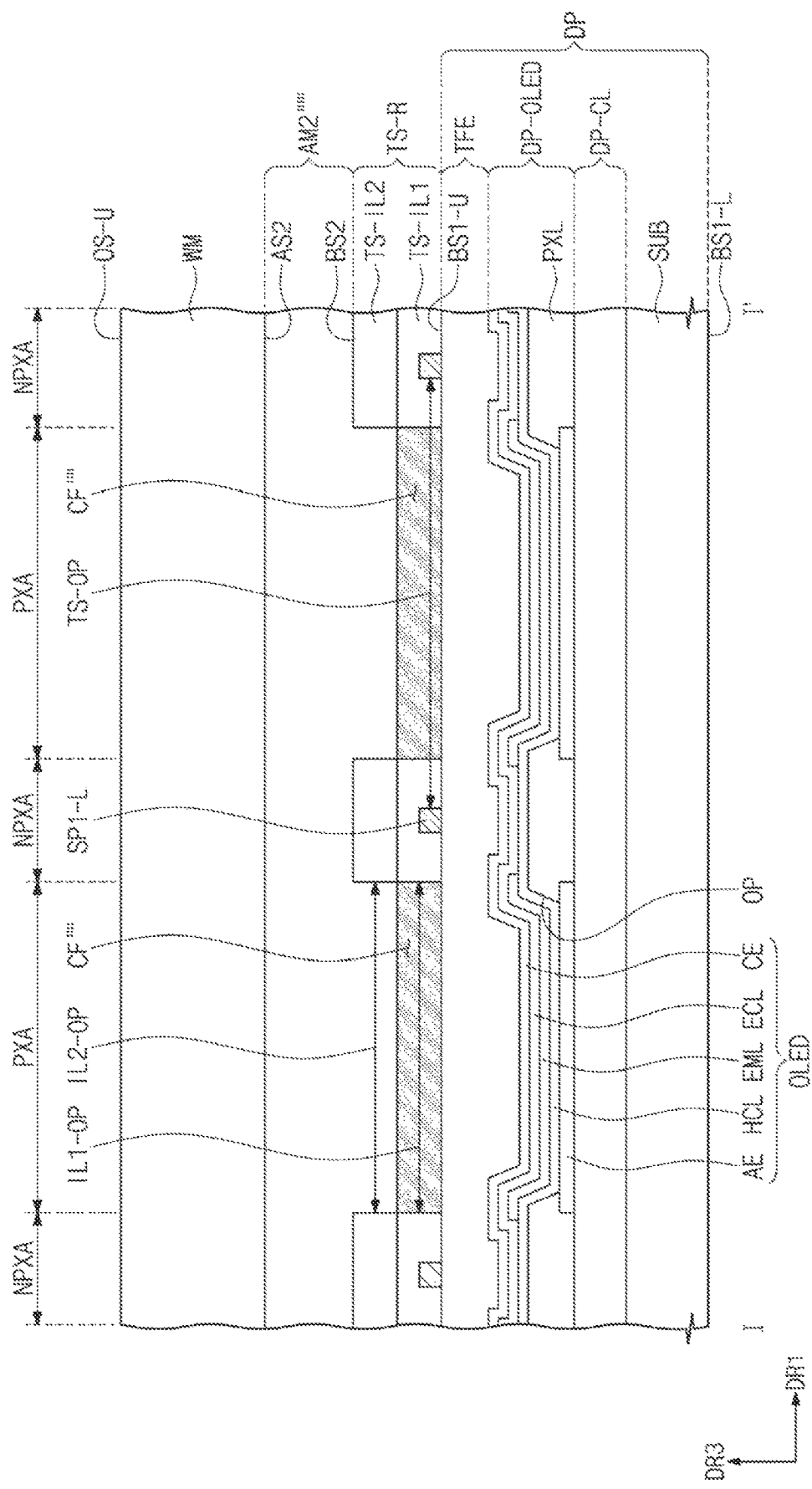

As illustrated in FIG. 18A, the first touch insulation layer TS-IL1 is disposed on the second display panel surface BS1-U. A plurality of first insulation openings IL1-OP corresponding to the plurality of light emitting areas PXA are defined in the first touch insulation layer TS-IL1, respectively. The color filters CF'''' may be disposed in the plurality of first insulation openings IL1-OP. Colors of the color filters CF'''' may be differently selected for the first insulation openings IL1-OP in consideration of colors of light emitted from the organic light emitting devices OLED. For example, red color filters may be disposed to overlap the organic light emitting devices OLED that emit red light, green color filters may be disposed to overlap the organic light emitting devices OLED that emit green light, and blue color filters may be disposed to overlap the organic light emitting devices OLED that emit blue light. It is noted, however, that any suitable color for a color filter may be utilized in association with exemplary embodiments described herein.

The color filters CF"" may transmit light emitted from the organic light emitting devices OLED and reduce a reflective index of external light. Also, the external light may pass through the color filters CF"", and, as such, be reduced in intensity by about ⅓. A portion of the light passing through the color filters CF"" may be dissipated, and a portion of the light may be reflected by the organic light emitting device layer DP-OLED and the thin film encapsulation layer TFE. The reflected light may be incident to the color filters CF"". The reflected light is reduced in intensity (e.g., brightness) while passing through the color filters CF"". As a result, only a portion of the external light may be reflected from the display device.

In one or more exemplary embodiments, the first touch insulation layer TS-IL1 and the color filters CF"" may be provided as one layer. Further, in one or more exemplary embodiments, the first touch insulation layer TS-IL1 may correspond to the black matrix that is described with reference to FIGS. 16B and 16C.

The second touch insulation layer TS-IL2 is disposed on the first touch insulation layer TS-ILL A plurality of second insulation openings IL2-OP corresponding to the plurality of light emitting areas PXA are defined in the second touch insulation layer TS-IL2. The second touch insulation layer TS-IL2 and the color filters CF"" may provide a first base surface BS2 having a stepped shape. Although not separately shown, the touch sensing layer TS-R may further include an insulation layer that provides a first base surface BS2.

According to one or more exemplary embodiments, the first touch insulation layer TS-IL1 and the second touch insulation layer TS-IL2 may be successively stacked, and, then, the first insulation openings IL1-OP and the second insulation openings IL2-OP, which correspond to each other, may be formed at the same time through one process. Once the first insulation openings IL1-OP and the second insulation openings IL2-OP are formed, the color filters CF"" may be formed. The color filters CF"" may be formed using a printing manner, such as an inkjet printing or a photolithographic manner.

Although a cross-section of the display device taken along sectional line II-IF of FIG. 12A is not illustrated, the display device may be the same as that of FIG. 12C or further include the black matrixes BM-P1 and BM-P2 disposed on the non-display area NDA. Further, although a cross-section taken along sectional line III-III' of FIG. 13A is not illustrated, the display device may be the same as that of FIG. 18A except for a position of the sensing part.

Figure 18B:
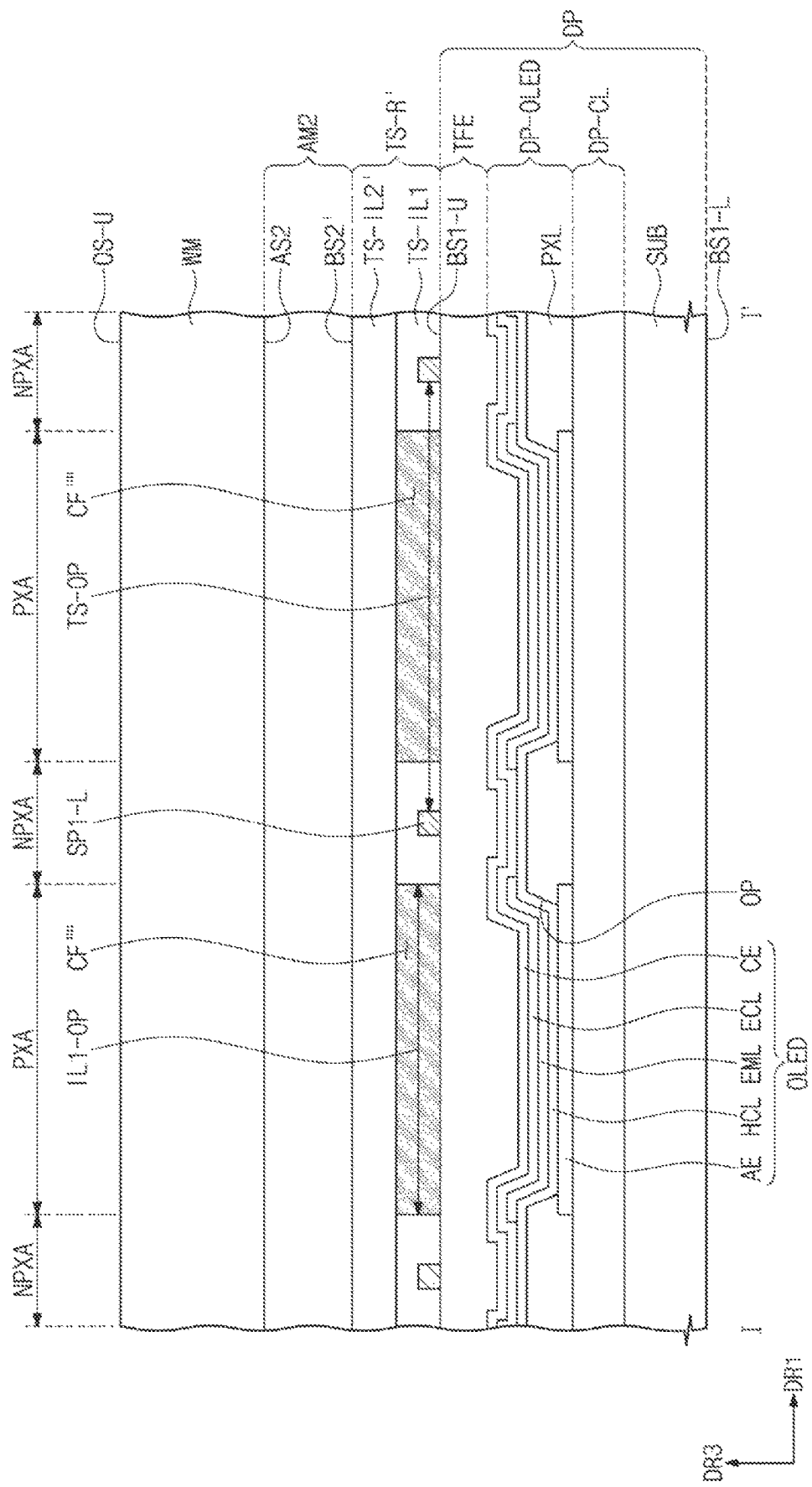

As illustrated in FIG. 18B, the second touch insulation layer TS-IL2' is disposed on the first touch insulation layer TS-ILL Unlike in FIG. 18A, the plurality of second insulation openings IL2-OP are not provided in the second touch insulation layer TS-IL2'. The second touch insulation layer TS-IL2' provides the first base surface BS2'.

Figure 18C:
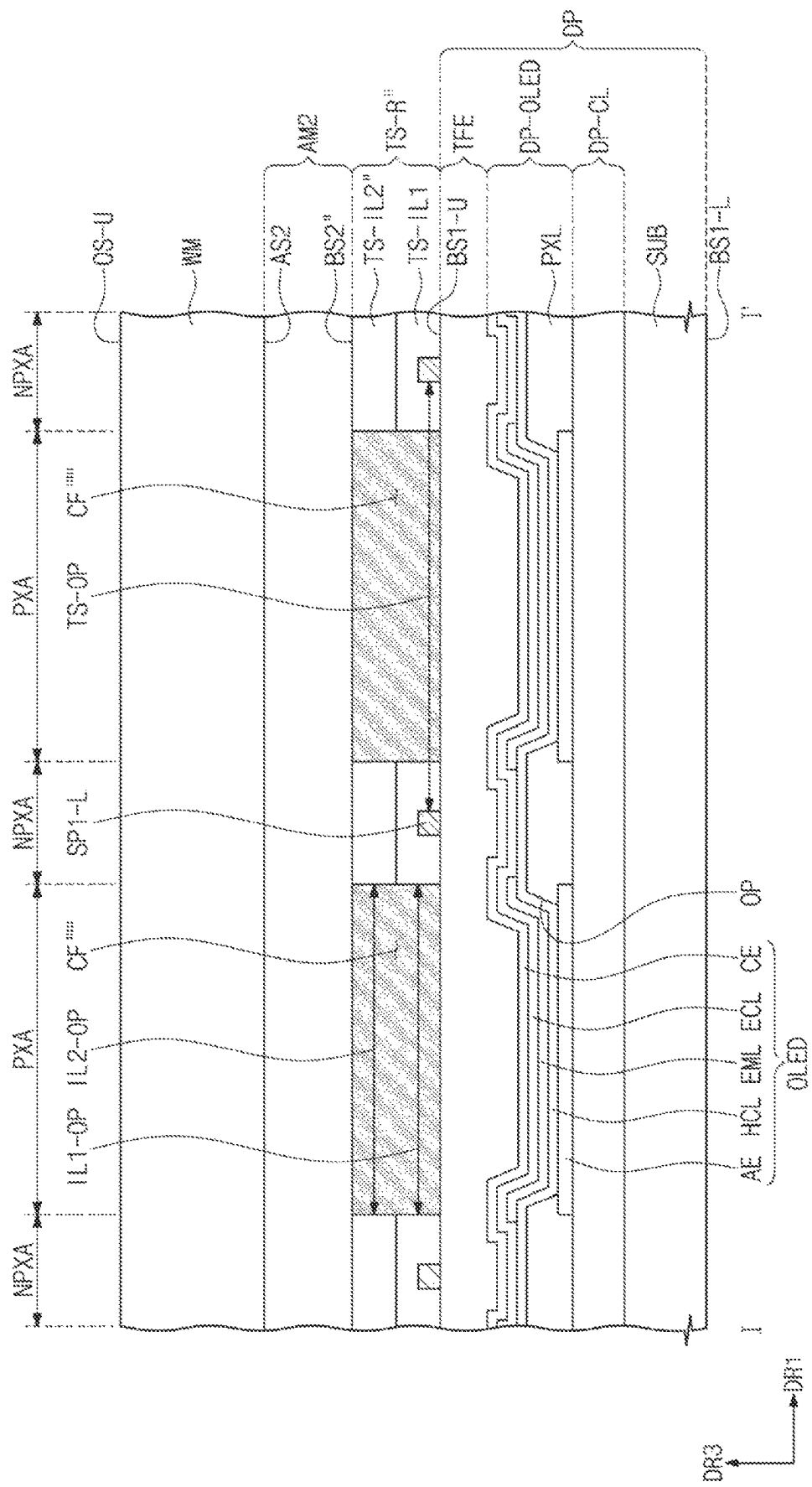

Referring to FIG. 18C, the color filters CF"" may be disposed at the same time in the first and second insulation openings IL1-OP and IL2-OP. Since the first and second insulation openings IL1-OP and IL2-OP are formed at the same time, the first insulation opening IL1-OP and the second insulation opening IL2-OP may be aligned with each other. The color filters CF"" may extend from the inside of the first insulation opening IL1-OP to the inside of the second insulation opening IL2-OP. The color filters CF"" may have a thickness that is substantially the same as the sum of thicknesses of the first touch insulation layer TS-IL1 and the second touch insulation layer TS-IL2" in the third direction DR3. The second touch insulation layer TS-IL2" and the color filters CF"" may provide a flat first base surface BS2" upon which the window member WM is disposed.

Adverting to FIG. 18D, the black matrix BM may be disposed on the second touch insulation layer TS-IL2. A plurality of transmission openings BM-OP corresponding to the light emitting areas PXA are defined in the black matrix BM. The black matrix BM and the color filters CF"" may provide a first base surface BS2''' having a stepped shape. Although not illustrated, the black matrix BM may further cover an inner wall of each of the first and second insulation openings IL1-OP and IL2-OP.

Although not shown, according to one or more exemplary embodiments, at least one of the first and second touch insulation layers TS-IL1 and TS-IL2/TS-IL2'/TS-IL2" of FIGS. 18A and 18C may be replaced with the black matrix BM. The first touch insulation layer TS-IL1 of FIG. 18B may be replaced with the black matrix BM.

Figure 18E:
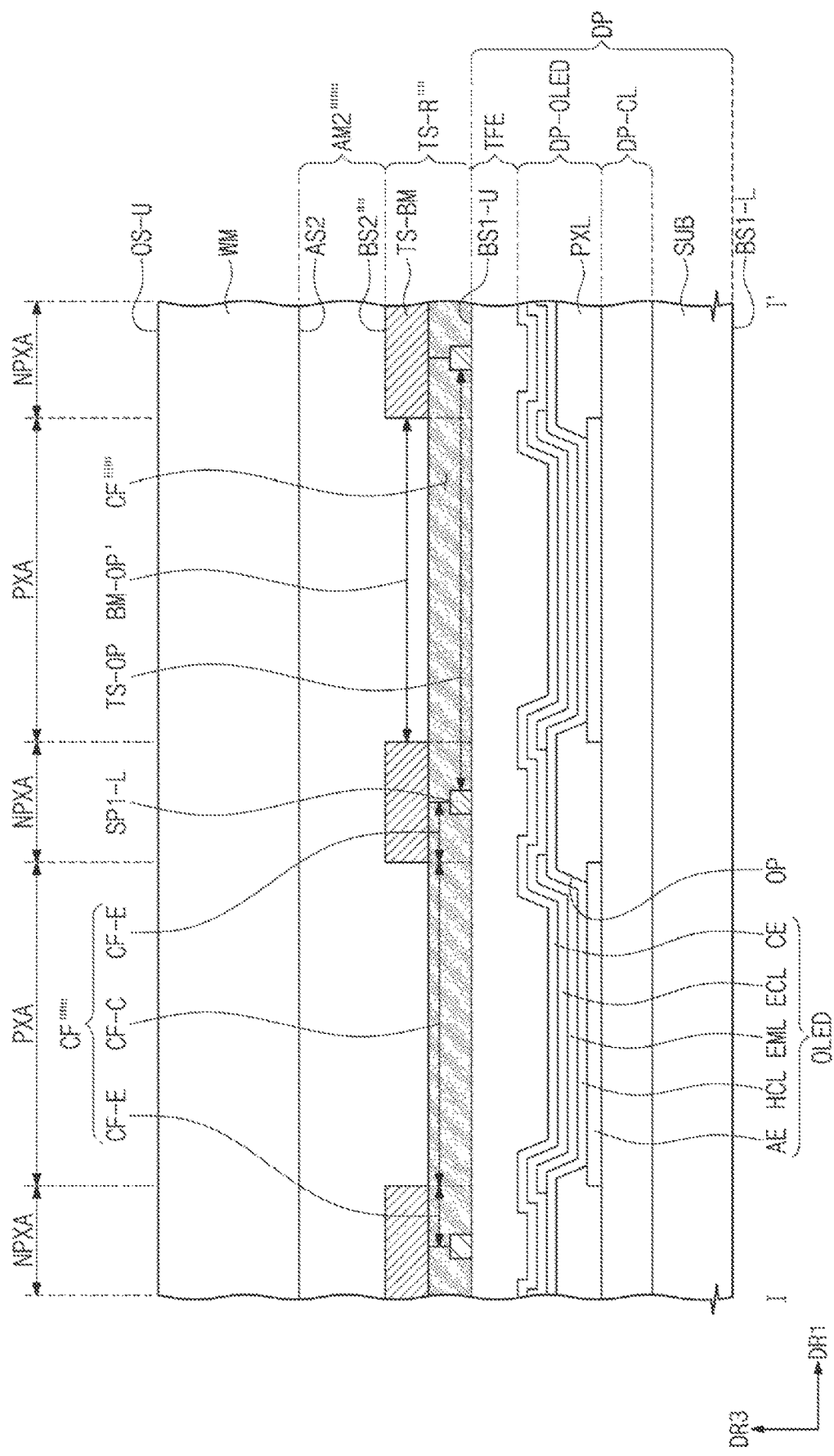

As illustrated in FIG. 18E, the thin film encapsulation layer TFE provides a second display panel surface BS1-U. The color filters CF' are disposed on the second display panel surface BS1-U. Each of the color filters CF""" may include a central portion CF-C and edge portions CF-E. The central portion CF-C overlaps with the corresponding light emitting area of the plurality of light emitting areas PXA. The edge portions CF-E extend from the central portion CF-C and overlap with the non-light emitting areas NPXA. For instance, the edge portion CF-E may overlap with the first conductive pattern, e.g., the first horizontal portion SP1-L of the first sensing part SP1. Although not separately shown, the color filters CF""" may also overlap the first connection part CP1. When each of the color filters CF""" is disposed on a plane, the edge portion CF-E may surround the central portion CF-C.

According to one or more exemplary embodiments, the edge portion CF-E of each of the color filters CF""" adjacent to each other may contact and cover the first horizontal portion SP1-L of the first sensing part SP1. The edge portions CF-E of the color filters CF""" adjacent to each other may contact each other. The edge portions CF-E of the color filters CF""" adjacent to each other may partially cover the first horizontal portion SP1-L to completely cover the first conductive pattern.

A black matrix TS-BM is disposed on the color filters CF""". As illustrated in FIG. 18E, the black matrix TS-BM may be directly disposed on the color filters CF""". A plurality of transmission openings BM-OP' corresponding to the light emitting areas PXA are defined in the black matrix TS-BM. The black matrix TS-BM and the color filters CF""" may provide a first base surface BS2"".

In one or more exemplary embodiments, the black matrix TS-BM may be disposed to correspond to the non-light emitting areas NPXA. The plurality of light emitting areas PXA and the plurality of transmission openings BM-OP' may have the same shape on the plane. That is, the black matrix TS-BM has substantially the same shape as the non-light emitting areas NPXA (for example, the black matrix TS-BM has the same width as the non-light emitting area NPXA in the first and second directions DR1 and DR2). It is contemplated, however, that exemplary embodiments are not limited thereto or thereby. For example, the plurality of light emitting areas PXA and the plurality of transmission openings BM-OP' may have shapes different from each other.

Figure 18F:
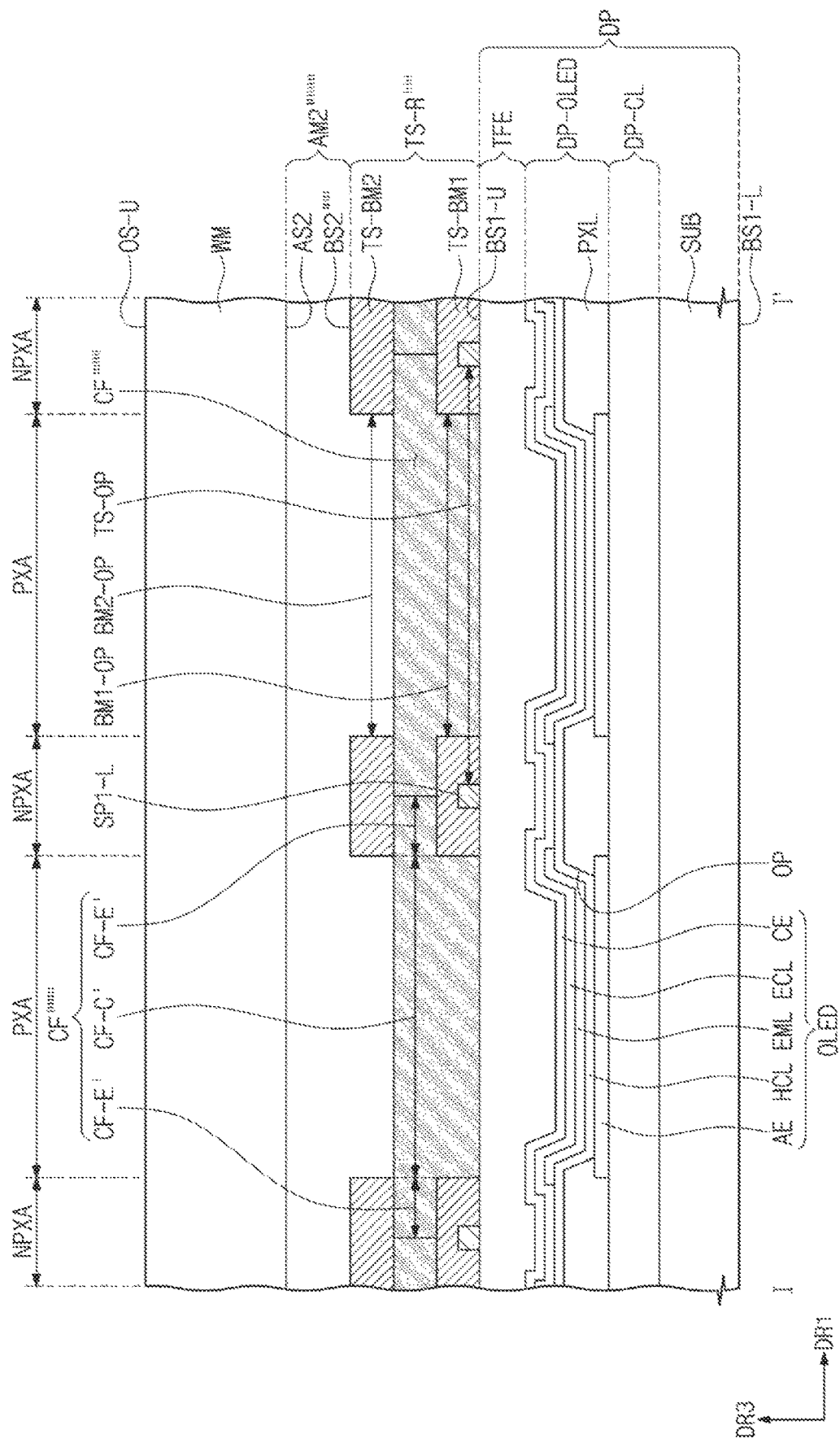

Referring to FIG. 18F, the touch sensing layer TS-R"'" includes a first black matrix TS-BM1 and a second black matrix TS-BM2. The first black matrix TS-BM1 is disposed on the second display panel surface BS1-U to cover the first conductive pattern, e.g., the first horizontal portion SP1-L of the first sensing part SP1. A plurality of first transmission openings BM1-OP corresponding to the light emitting areas PXA are defined in the first black matrix TS-BM1. The edge portions CF-E' of the color filters CF"'"" adjacent to each other may contact and cover the first black matrix TS-BM1. The color filters CF"'"" adjacent to each other may completely cover the first black matrix TS-BM1.

The second black matrix TS-BM2 is disposed on the color filters CF"'"". A plurality of second transmission openings BM2-OP corresponding to the light emitting areas PXA are defined in the second black matrix TS-BM2. The second black matrix TS-BM2 and the color filters CF"'"" may provide a first base surface BS2"'".

Figure 19A:
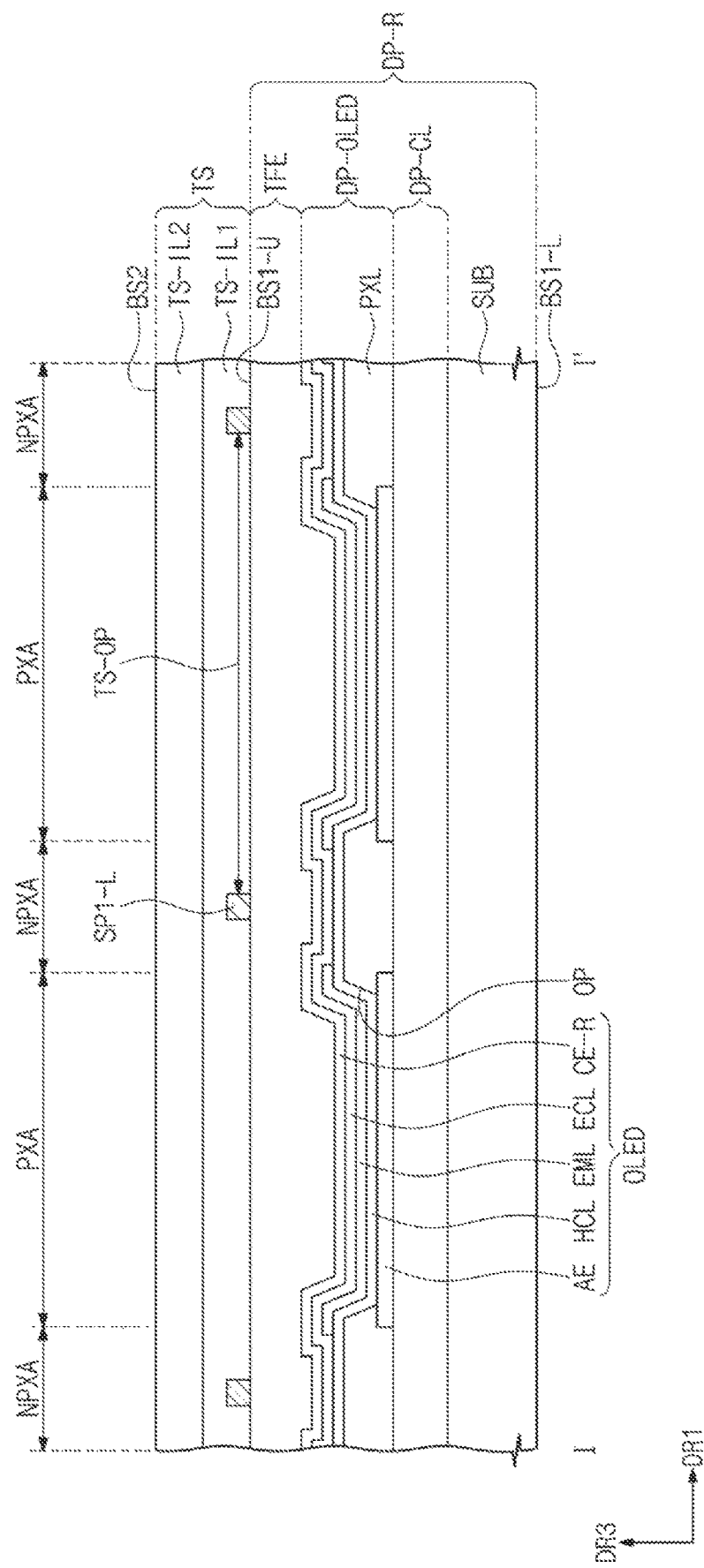
FIGS. 19A and 19B are cross-sectional views of a display device, according to one or more exemplary embodiments.
Figure 19B:
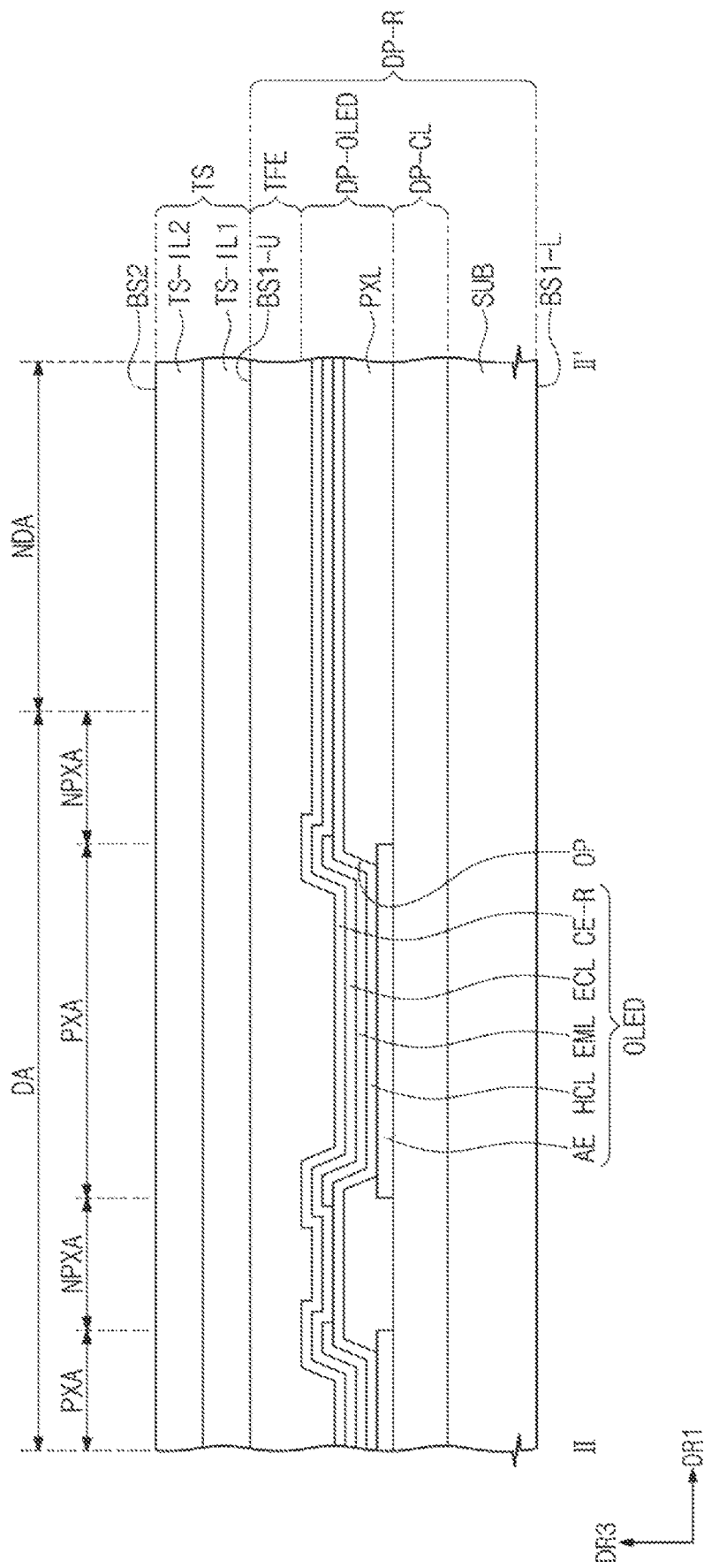
Figure 20A:
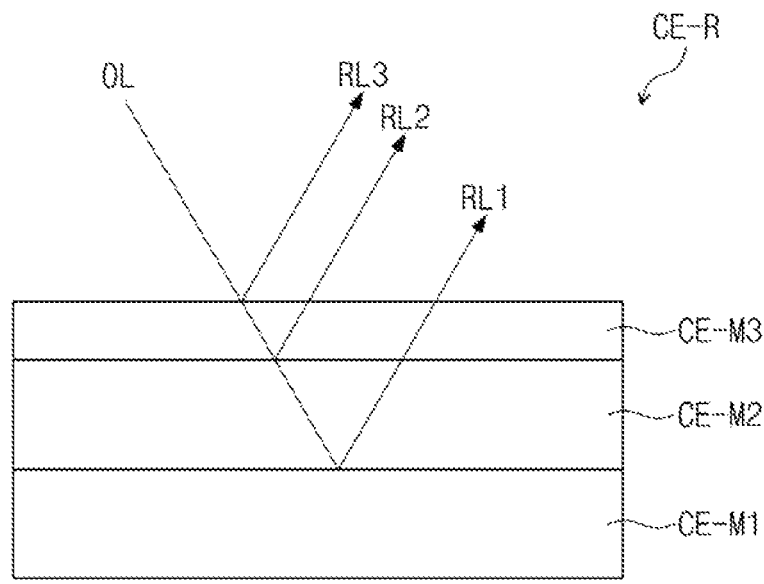
FIGS. 20A and 20B are cross-sectional views of cathodes of organic light emitting diodes of display devices, according to one or more exemplary embodiments.
Figure 20B:
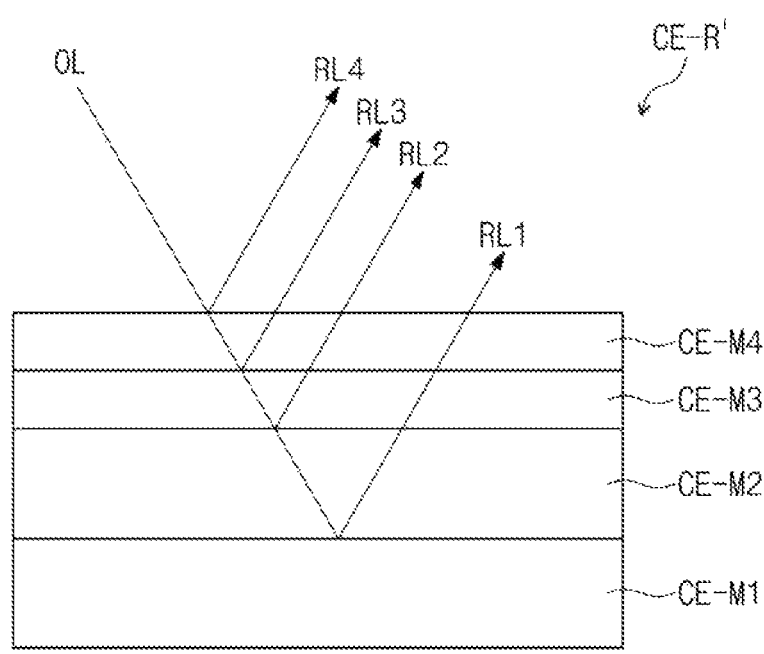

FIGS. 19A and 19B are cross-sectional views of a display device, according to one or more exemplary embodiments. FIGS. 20A and 20B are cross-sectional views of cathodes of organic light emitting diodes of display devices, according to one or more exemplary embodiments. It is noted that FIG. 19A is a cross-sectional view of FIG. 12A taken along sectional line I-I', whereas FIG. 19B is a cross-sectional view of FIG. 12A taken along sectional line II-IF, according to one or more exemplary embodiments. The display devices of FIGS. 19A, 19B, 20A, and 20B are similar to the display devices of FIGS. 1A to 18F, and, as such, duplicative descriptions will be omitted to avoid obscuring exemplary embodiments described herein. In this manner, primarily differences will be described below. It is noted that the display panel layer DP-R and the touch sensing layer TS of the various constituents of the display member DM are illustrated.

It is noted that the display panel layer DP-R and the touch sensing layer TS of the various constituents of the display device are illustrated. Further, the display devices illustrated in FIGS. 19A, 19B, 20A, and 20B may be examples of the display device of FIG. 4D. The display panel layer DP-R may generate an image and reduce reflection of external light. As described below, these features are achieved, at least in part, by a cathode CE-R of the display panel layer DP-R that has a function of a reflection prevention layer. The touch sensing layer TS of FIGS. 19A and 19B may be substantially the same as the touch sensing layer TS of FIGS. 12B and 12C. Although not shown, the first touch insulation layer TS-IL1 and the second touch insulation layer TS-IL2 may be formed as described with reference to FIGS. 18A to 18F.

As illustrated in FIG. 20A, the cathode CE-R may include a first metal layer CE-M1, a transparent conductive layer CE-M2 disposed on the first metal layer CE-M1, and a second metal layer CE-M3 disposed on the transparent conductive layer CE-M2. The cathode CE-R having the aforementioned structure may receive a power voltage and reduce reflectance of external light.

According to one or more exemplary embodiments, light OL incident from the outside is reflected by the first metal layer CE-M1, the transparent conductive layer CE-M2, and the second metal layer CE-M3. The light reflected by the first metal layer CE-M1, the transparent conductive layer CE-M2, and the second metal layer CE-M3 may be defined as a first reflected light RL1, a second reflected light RL2, and a third reflected light RL3, respectively. In one or more exemplary embodiments, the second reflected light RL2 and the third reflected light RL3 may destructively interfere with each other to reduce the reflectance of the external light OL. If the mixed light of the second reflected light RL2 and the third reflected light RL3 has the same intensity as that of the first reflected light RL1 and a phase opposite to the first reflected light RL1 (e.g., a phase difference of about 180 degrees), destructive interference may occur.

The first metal layer CE-M1 may be formed of one selected form the group consisting of aluminum (Al), silver (Ag), magnesium (Mg), chromium (Cr), titanium (Ti), nickel (Ni), gold (Au), tantalum (Ta), copper (Cu), calcium (Ca), cobalt (Co), iron (Fe), molybdenum (Mo), tungsten (W), platinum (Pt), ytterbium (Yb), barium (Ba), and an alloy thereof. Since each of the metals has relatively low resistance, the metals may be adequate for the first metal layer CE-M1 so as to efficiently transmit the power voltage. Also, since each of the metals is relatively easy to deposit and relatively low reactivity with oxygen and moisture, the metals may be adequate for the first metal layer CE-M1. The first metal layer CE-M1 may have a thickness of about 50 nm to about 500 nm.

The transparent conductive layer CE-M2 may be formed of one selected from the group consisting of indium tin oxide (ITO), aluminum zinc oxide (AZO), indium gallium oxide (IGO), gallium indium zinc oxide (GIZO), indium zinc oxide (IZO), zinc oxide (ZnO), and a mixture thereof. The transparent conductive layer CE-M2 may be formed of at least one of a metal and a dielectric material. The transparent conductive layer CE-M2 generates a phase difference between the first reflected light RL1 and the rest of the reflected light. The transparent conductive layer CE-M2 may have a thickness that is selected so that destructive interference occurs. Exemplary embodiments, however, are not limited thereto or thereby.

In one or more exemplary embodiments, destructive interference between the third reflected light RL3 and the first reflected light RL1 occurs. To generate the destructive interference, the third reflected light RL3 and the first reflected light RL1 may have phases opposite to each other and the same size (or intensity) as each other. To generate effective destructive interference, the third reflected light RL3 and the first reflected light RL1 may have sizes that are similar to each other.

The second metal layer CE-M3 may be a metal having relatively high light absorption. A metal having relatively high light absorption absorbs light that is not completely dissipated due to the destructive interference. The light absorption of the metal is proportional to a multiplication of a refractive index and an absorption coefficient. In this manner, if a metal has a large value of the multiplication of a refractive index and an absorption coefficient, the metal may be suitable for the material of the second metal layer CE-M3.

According to one or more exemplary embodiments, the second metal layer CE-M3 may be formed of chromium (Cr), titanium (Ti), magnesium (Mg), molybdenum (Mo), cobalt (Co), nickel (Ni), tungsten (W), aluminum (Al), silver (Ag), gold (Au), copper (Cu), iron (Fe), calcium (Ca), platinum (Pt), ytterbium (Yb), or an alloy thereof. The second metal layer CE-M3 may have a thickness of about 1 nm to about 25 nm.

Adverting to FIG. 20B, the cathode CE-R' may further include a third metal layer CE-M4 disposed on the second metal layer CE-M3. Also, the cathode CE-R' may be designed so that fourth reflected light RL4 that is reflected from the third metal layer CE-M4 destructively interferes with the first reflected light RL1.

According to one or more exemplary embodiments, the third metal layer CE-M4 may have a work function so that electric charges (electrons) are easily injected. When the third metal layer CE-M4 constitutes the uppermost layer of the cathode CE-R', the third metal layer CE-M4 may have a relatively low reactivity with oxygen and moisture. The third metal layer CE-M4 may be formed of a metal having a work function of about 4.6 eV or less or an alloy thereof. Alternatively, the third metal layer CE-M4 may be formed of a metal having a work function of about 3.7 eV or less or an ally thereof. The third metal layer CE-M4 may be formed of one selected from the group consisting of ytterbium (Yb), calcium (Ca), aluminum (Al), silver (Ag), chromium (Cr), titanium (Ti), magnesium (Mg), lithium (Li), cesium (Cs), barium (Ba), potassium (K), and an alloy thereof. The third metal layer CE-M4 may have a thickness of about 1 nm to about 15 nm.

Although the first metal layer CE-M1, the transparent conductive layer CE-M2, the second metal layer CE-M3, and the third metal layer CE-M4 constitute the cathode CE-R', exemplary embodiments are not limited thereto or thereby. For example, the cathode CE-R' may be provided in the display panel layer DP to perform only the reflection prevention function, unlike the cathode CE.

According to one or more exemplary embodiments, the touch detection member, the reflection prevention member, the window member, and the protection member may be integrated with the display panel as the touch sensing layer, the reflection prevention layer, the window layer, and the external protection layer. Since the touch sensing layer, the reflection prevention layer, the window layer, and the external protection layer are formed through a continuous process, one or more adhesion members, such as one or more OCA layers, or one or more adhesion layers, such as one or more OCR layers may be omitted. Since the adhesive member(s) are omitted, the display device may be reduced in thickness, which may also improve the flexibility and aesthetic appeal of the display device.

According to one or more exemplary embodiments, a touch detection member and a reflection prevention member may be integrated with a display panel as a touch sensing layer and a reflection prevention layer. In this manner, the display device may be thinner than a conventional display device with a touch detection member and a reflection prevention member that may be coupled to the display device using an adhesive. Also, the number of adhesion members may be minimized (or at least reduced). Since the display device is decreased in thickness, even though the display device is repeatedly bent (or otherwise flexed), a delamination defect of the adhesion member(s) may be reduced. Also, since the display device is decreased in thickness, the display device may be bent (or otherwise flexed) at a smaller radius of curvature.

It will be apparent to those skilled in the art that various modifications and variations can be made in the present invention. Thus, it is intended that the present disclosure covers the modifications and variations of this invention provided they come within the scope of the appended claims and their equivalents.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A flexible display device comprising:
a protection component;
a window;
a display component disposed between the protection component and the window;
a first adhesion layer coupling the display component to the protection component; and
a second adhesion layer coupling the display component to the window,
wherein:
the display component comprises:
a display panel comprising a display area comprising a plurality of light emitting areas and a non-light emitting area adjacent to the plurality of light emitting areas and a non-display area adjacent to the display area;
a touch sensing layer directly disposed on the display panel without an adhesive layer therebetween; and
a reflection prevention layer directly disposed on the touch sensing layer without an adhesive layer therebetween, the reflection prevention layer comprising a plurality of color filters,
wherein a thickness of the display component is about 30 µm to about 50 µm and is less than a sum of thicknesses of the protection component and the window.

2. The flexible display device of claim 1, wherein the reflection prevention layer further comprises a black matrix disposed directly on the touch sensing layer.

3. The flexible display device of claim 1, wherein the black matrix comprises:
a light shield portion overlapping with the non-light emitting area; and
a bezel portion overlapping with the non-display area.

4. The flexible display device of claim 3, wherein the bezel portion is thicker than the light shield portion.

5. The flexible display device of claim 3, wherein the light shield portion and the bezel portion are integrated with each other.

6. The flexible display device of claim 3, wherein:
the bezel portion comprises a plurality of layers; and
a first layer of the plurality of layers is integrated with the light shield portion.

7. The flexible display device of claim 1, wherein;
the touch sensing layer further comprises a lowermost insulating layer, an uppermost insulating layer and a conductive pattern disposed between the uppermost insulating layer and the lowermost insulating layer.

8. The flexible display device of claim 1, wherein the display panel further comprises a light emitting diode, an inorganic layer, and an organic layer, and
the inorganic layer and the organic layer seal the light emitting diode.

9. The flexible display device of claim 1, wherein the display panel further comprises a base layer, and
the protection component is thicker than the base layer.

10. The flexible display device of claim 1, wherein a ratio between the thickness of the display component and the sum of thicknesses of the protection component and the window is about 1:1.2 to about 1:4.

11. The flexible display device of claim 10, wherein a ratio between thicknesses of the protection component and the window is about 5:3 to about 3:7.

12. The flexible display device of claim 11, wherein a ratio between thicknesses of the first and second adhesion layers corresponds to the ratio between thicknesses of the protection component and the window.

13. The flexible display device of claim 1, wherein the window comprises:
- a base film disposed on the second adhesion layer; and
- a hard coating layer disposed on the base film.

14. The flexible display device of claim 13, wherein the window further comprises a functional coating layer disposed on the base film.

15. The flexible display device of claim 13, wherein:
- the window further comprises a black matrix disposed on the base film; and
- the black matrix does not overlap with the plurality of light emitting areas.

16. The flexible display device of claim 1, wherein the touch sensing layer further comprises a lowermost insulating layer, an uppermost insulating layer and a conductive pattern disposed between the uppermost insulating layer and the lowermost insulating layer, the reflection prevention layer further comprises: a black matrix disposed on the uppermost insulating layer and overlapping with the non-light emitting area, and the plurality of color filters are disposed on the uppermost insulating layer and respectively overlapping with the plurality of light emitting areas.

17. The flexible display device of claim 1, wherein the touch sensing layer further comprises a lowermost insulating layer, an uppermost insulating layer and a conductive pattern disposed between the uppermost insulating layer and the lowermost insulating layer, and the uppermost insulating layer comprises an inorganic material or an organic material.

18. The flexible display device of claim 1, wherein the second adhesion layer is disposed between the reflection prevention layer and the window.

* * * * *